(12) United States Patent
Uchimura et al.

(10) Patent No.: US 10,043,876 B2
(45) Date of Patent: Aug. 7, 2018

(54) SEMICONDUCTOR DEVICE AND METHOD FOR MANUFACTURING THE SAME

(71) Applicant: Renesas Electronics Corporation, Tokyo (JP)

(72) Inventors: Katsuhiro Uchimura, Kanagawa (JP); Michimoto Kaminaga, Kanagawa (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/338,539

(22) Filed: Oct. 31, 2016

(65) Prior Publication Data
US 2017/0047413 A1  Feb. 16, 2017

Related U.S. Application Data

(62) Division of application No. 14/802,132, filed on Jul. 17, 2015, now Pat. No. 9,515,153.

(30) Foreign Application Priority Data

Aug. 4, 2014 (JP) .................................. 2014-159085

(51) Int. Cl.
| | |
|---|---|
| *H01L 29/66* | (2006.01) |
| *H01L 29/423* | (2006.01) |
| *H01L 29/78* | (2006.01) |
| *H01L 21/265* | (2006.01) |
| *H01L 29/40* | (2006.01) |
| *H01L 29/739* | (2006.01) |

(52) U.S. Cl.
CPC .... *H01L 29/4236* (2013.01); *H01L 21/26513* (2013.01); *H01L 29/407* (2013.01);
(Continued)

(58) Field of Classification Search
CPC ............. H01L 21/26513; H01L 29/407; H01L 29/4236; H01L 29/42368; H01L 29/66348;
(Continued)

(56) References Cited

U.S. PATENT DOCUMENTS

| | | | |
|---|---|---|---|
| 7,544,568 B2* | 6/2009 | Matsuura | ............ H01L 29/8725 257/E27.091 |
| 7,727,831 B2* | 6/2010 | Ohtani | .............. H01L 29/66734 257/319 |

(Continued)

FOREIGN PATENT DOCUMENTS

| | | |
|---|---|---|
| JP | 07-263692 A | 10/1995 |
| JP | 2000-183337 A | 6/2000 |

(Continued)

OTHER PUBLICATIONS

Office Action dated Jan. 9, 2018, in Japanese Patent Application No. 2014-159085.

*Primary Examiner* — Mohammed Shamsuzzaman
(74) *Attorney, Agent, or Firm* — Shapiro, Gabor and Rosenberger, PLLC

(57) ABSTRACT

A semiconductor device with enhanced reliability in which a gate electrode for a trench-gate field effect transistor is formed through a gate insulating film in a trench made in a semiconductor substrate. The upper surface of the gate electrode is in a lower position than the upper surface of the semiconductor substrate in an area adjacent to the trench. A sidewall insulating film is formed over the gate electrode and over the sidewall of the trench. The gate electrode and the sidewall insulating film are covered by an insulating film as an interlayer insulating film.

8 Claims, 41 Drawing Sheets

(52) U.S. Cl.
CPC .. *H01L 29/42368* (2013.01); *H01L 29/66666* (2013.01); *H01L 29/7827* (2013.01); *H01L 29/66348* (2013.01); *H01L 29/7397* (2013.01)

(58) Field of Classification Search
CPC ........... H01L 29/66666; H01L 29/7397; H01L 29/7827
USPC ........ 257/330, 296, 263, 334; 438/259, 270, 438/199
See application file for complete search history.

(56) References Cited

U.S. PATENT DOCUMENTS

| | | | | |
|---|---|---|---|---|
| 8,129,780 B2* | 3/2012 | Shinbori | ............... | H01L 29/407 257/311 |
| 8,476,136 B2* | 7/2013 | Borzi | .................... | H01L 29/407 257/296 |
| 2006/0261391 A1* | 11/2006 | Nakazawa | .......... | H01L 27/0255 257/296 |
| 2012/0199901 A1* | 8/2012 | Nagata | ............. | H01L 29/41741 257/330 |
| 2013/0049105 A1* | 2/2013 | Omori | ............... | H01L 21/26586 257/330 |
| 2015/0035015 A1* | 2/2015 | Arai | .................... | H01L 29/8083 257/263 |
| 2015/0214355 A1* | 7/2015 | Nakano | ............. | H01L 29/41766 257/330 |
| 2015/0279998 A1* | 10/2015 | Song | ................ | H01L 29/66795 257/330 |

FOREIGN PATENT DOCUMENTS

| | | |
|---|---|---|
| JP | 2004-179277 A | 6/2004 |
| JP | 2006-324570 A | 11/2006 |

* cited by examiner

SEMICONDUCTOR DEVICE AND METHOD FOR MANUFACTURING THE SAME

CROSS-REFERENCE TO RELATED APPLICATIONS

The disclosure of Japanese Patent Application No. 2014-159085 filed on Aug. 4, 2014 including the specification, drawings and abstract is incorporated herein by reference in its entirety.

BACKGROUND

The present invention relates to semiconductor devices and methods for manufacturing the same, and more particularly to a semiconductor device having a trench-gate field effect transistor and a method for manufacturing the same.

A trench-gate field effect transistor has a structure in which a gate electrode is buried in a trench made in the main surface of a semiconductor substrate through a gate insulating film.

Japanese Unexamined Patent Application Publication No. Hei 7 (1995)-263692 describes a technique for trench MOS gates.

Japanese Unexamined Patent Application Publication No. 2006-324570 describes a technique for a semiconductor device having a trench-gate power MISFET.

SUMMARY

The reliability of a semiconductor device having a trench-gate MISFET is expected to be enhanced.

The above and further objects and novel features of the invention will more fully appear from the following detailed description in this specification and the accompanying drawings.

According to one aspect of the invention, there is provided a semiconductor device which includes a semiconductor substrate, a trench made in the semiconductor substrate, a gate electrode formed in the trench through a gate insulating film, and an interlayer insulating film formed over the main surface of the semiconductor substrate. The upper surface of the gate electrode is in a lower position than the upper surface of the semiconductor substrate in an area adjacent to the trench, a sidewall insulating film is formed over the gate electrode and over the sidewall of the trench, and the gate electrode and the sidewall insulating film are covered by the interlayer insulating film.

According to another aspect of the invention, there is provided a method for manufacturing a semiconductor device which includes the steps of: (a) providing the semiconductor substrate; (b) after the step (a), making a trench in the semiconductor substrate; (c) after the step (b), forming a gate electrode in the trench through a gate insulating film; and (d) after the step (c), forming an interlayer insulating film over the main surface of the semiconductor substrate. The upper surface of the gate electrode formed in the step (c) is in a lower position than the upper surface of the semiconductor substrate in an area adjacent to the trench. The method further includes the step (c1) of, after the step (c) and before the step (d), forming a sidewall insulating film over the gate electrode and over the sidewall of the trench. In the step (d), the gate electrode and the sidewall insulating film are covered by the interlayer insulating film.

According to the present invention, the reliability of the semiconductor device is enhanced.

DETAILED DESCRIPTION

Figure 1:
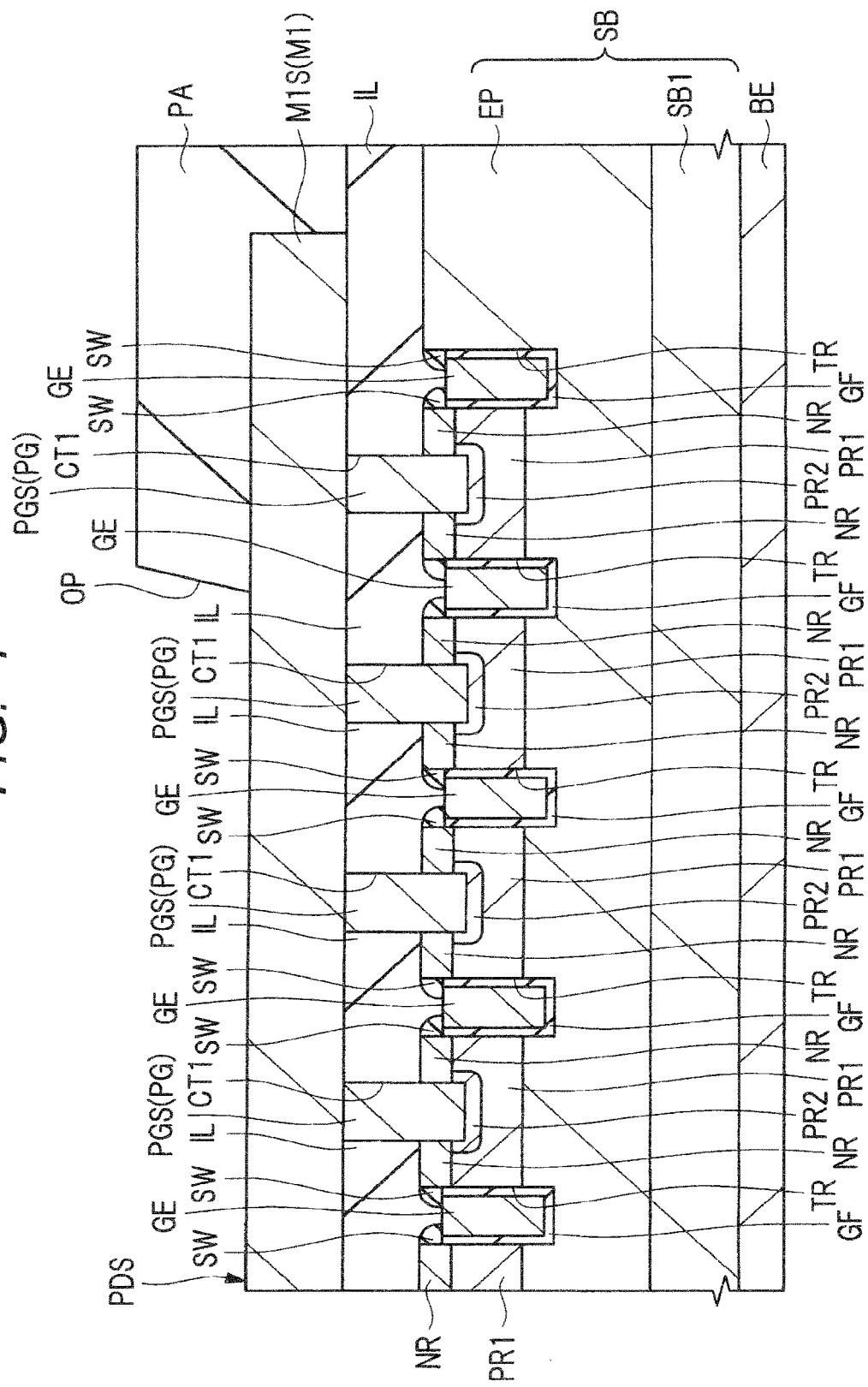
FIG. 1 is a sectional view of an essential part of a semiconductor device according to a first embodiment of the invention.

The preferred embodiments of the invention will be described below in different sections or separately as necessary, but they are not irrelevant to each other unless specified explicitly. Description of one embodiment may be, in whole or in part, a modified, detailed or supplementary form of description of another embodiment. Also, regarding the preferred embodiments described below, when a number (the number of pieces, numerical value, quantity, range, etc.) is indicated for an element, it is not limited to the specific number unless specified explicitly or theoretically limited to that number; it may be larger or smaller than the specific number. Furthermore, for the preferred embodiments described below, it is obvious that constituent elements (including constituent steps) are not necessarily essential unless specified explicitly or theoretically essential. Similarly, for the preferred embodiments described below, when a specific form or positional relation is indicated for an element, it should be interpreted to include a form or positional relation which is virtually equivalent or similar to the specific form or positional relation unless specified explicitly or theoretically limited to the specific form or positional relation. The same can be said of the above numerical data and ranges.

Next, the preferred embodiments will be described in detail referring to the accompanying drawings. In all the drawings that illustrate the preferred embodiments, elements with like functions are designated by like reference numerals and repeated descriptions thereof are omitted. Regarding the preferred embodiments below, basically descriptions of the same or similar elements are not repeated except when necessary.

In the drawings that illustrate the preferred embodiments, hatching may be omitted even in a sectional view for easy understanding and hatching may be used even in plan view for easy understanding.

First Embodiment

Structure of the Semiconductor Device

Figure 2:
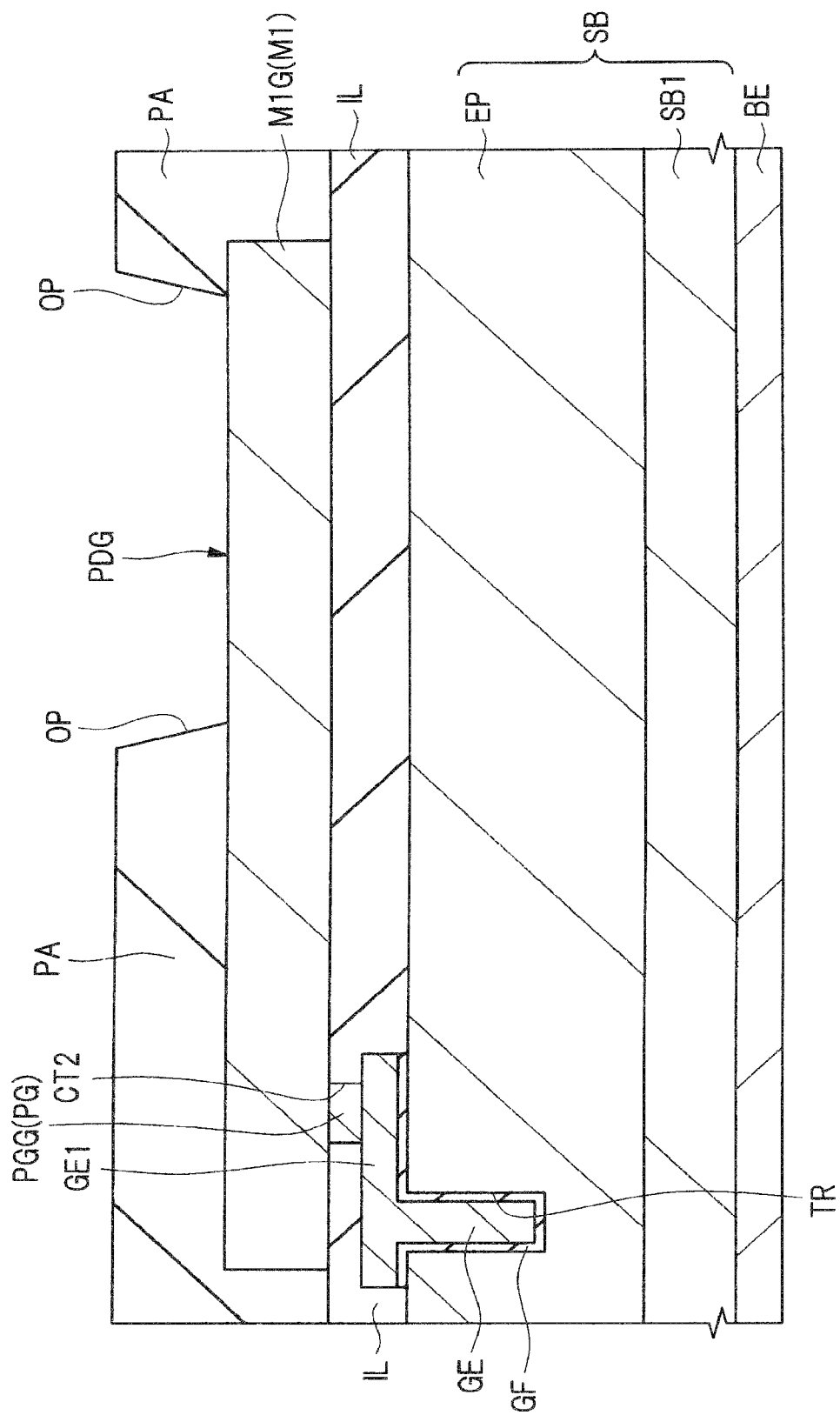
FIG. 2 is a sectional view of an essential part of the semiconductor device according to the first embodiment.
Figure 3:
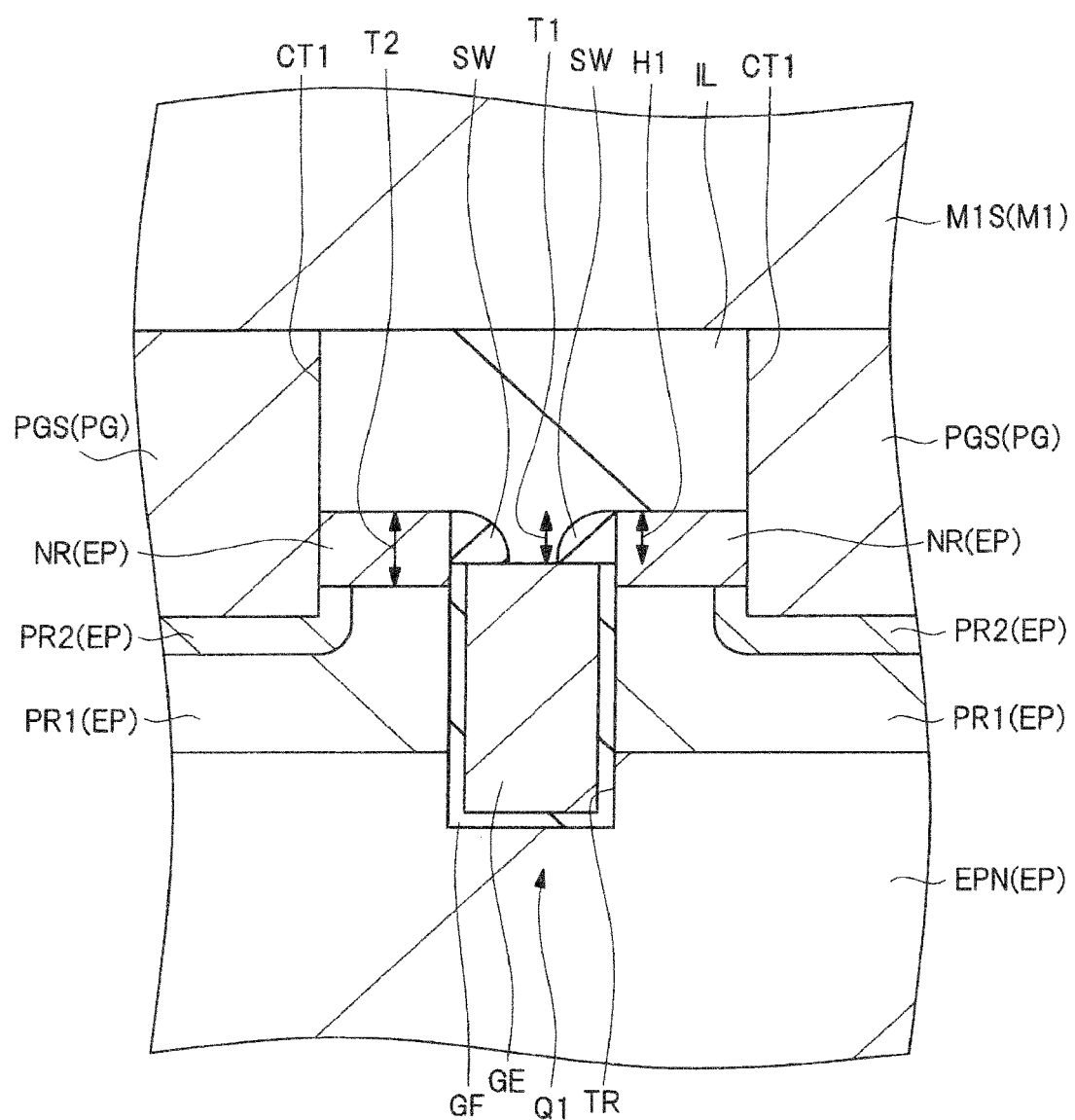
FIG. 3 is a fragmentary enlarged sectional view of the structure shown in FIG. 1.

FIGS. 1 and 2 are sectional views of an essential part of a semiconductor device according to the first embodiment. FIG. 3 is a fragmentary enlarged sectional view of the structure shown in FIG. 1. FIG. 1 corresponds to a cross section across a transistor cell formation region and FIG. 2 corresponds to a cross section across a gate bonding pad PDG.

The semiconductor device according to this embodiment is a semiconductor device which has a trench-gate field effect transistor, for example, a trench-gate MISFET (Metal Insulator Semiconductor Field Effect Transistor). This means that a trench-gate MISFET is formed in the semiconductor substrate SB of the semiconductor device according to this embodiment. A trench-gate MISFET is a MISFET which has a trench-type gate structure (structure in which a gate electrode is buried in a trench made in a substrate).

The trench-gate MISFET formed in the semiconductor substrate SB may be considered a power transistor (power semiconductor device). Therefore, the semiconductor device according to this embodiment may be considered a semiconductor device having a trench-gate MISFET as a power transistor (power semiconductor device).

As shown in FIGS. 1 and 2, the semiconductor substrate SB of the semiconductor device according to this embodiment includes a substrate body (semiconductor substrate, semiconductor wafer) SB1 of $n^+$-type monocrystalline silicon doped with, for example, arsenic (As) and a semiconductor layer (epitaxial layer, epitaxial semiconductor layer) EP of, for example, $n^-$-type monocrystalline silicon. The semiconductor layer EP is an epitaxial layer (epitaxial semiconductor layer) which is formed by epitaxial growth over the main surface of the substrate body SB1. Thus, the semiconductor substrate SB is a so-called epitaxial wafer. Whereas the substrate body SB1 and semiconductor layer EP are of the same conductivity type (n type in this case), the doping concentration (n-type impurity concentration) of the semiconductor body SB1 is higher than the doping concentration (n-type impurity concentration) of the semiconductor layer EP. For this reason, the resistivity (specific resistance) of the substrate body SB1 is lower than the resistivity (specific resistance) of the semiconductor layer EP.

Next, the concrete structure of the trench-gate MISFET formed in the semiconductor substrate SB will be described.

The trench-gate MISFET as a power transistor (power semiconductor device) is formed in the main surface of the semiconductor substrate SB. Specifically, a plurality of unit transistor cells Q1 are formed in the main surface of the semiconductor substrate SB and the unit transistor cells Q1 arranged in parallel make up one power transistor. FIG. 3 shows a single unit transistor cell Q1 as a repetition unit and the structure shown in FIG. 3 (unit transistor cell Q1) is repeated in the horizontal direction of FIG. 1.

Each unit transistor cell Q1 is a trench-gate MISFET. A trench-gate MISFET is a MISFET which has a trench-gate structure (structure in which a gate electrode is buried in a trench made in a substrate). Here, in the main surface of the semiconductor substrate SB, a planar area in which the unit transistor cells Q1 of the power transistor are formed (located) is hereinafter referred to as a transistor cell formation region.

The substrate body SB1 and semiconductor layer EP (n-type semiconductor region EPN) have a function as the drain region for the unit transistor cell Q1.

A back electrode (back drain electrode, drain electrode) BE is formed all over the back surface of the semiconductor substrate SB (specifically, the back surface of the substrate body SB1). The back electrode BE may be formed from a laminated film including a titanium (Ti) layer, nickel (Ni) layer, and gold (Au) layer which are stacked in order from the back surface of the semiconductor substrate SB.

Regarding the semiconductor substrate SB, the main surface opposite to the side where the semiconductor layer EP is located is hereinafter called the back surface of the semiconductor substrate SB. Also, regarding the substrate body SB1, the main surface opposite to the side where the semiconductor layer EP is located is hereinafter called the back surface of the substrate body SB1. The back surface of the semiconductor substrate SB and the back surface of the substrate body SB1 are one and the same. Regarding the semiconductor substrate SB, the main surface in which trenches TR are made is hereinafter called the upper surface of the semiconductor substrate SB. Also, regarding the semiconductor layer EP, the main surface in which trenches TR are made is hereinafter called the upper surface of the semiconductor layer EP. Therefore, the upper surface of the semiconductor substrate SB and the upper surface of the semiconductor layer EP are one and the same.

A p-type semiconductor region PR1 is formed in the semiconductor layer EP of the transistor cell formation region and the p-type semiconductor region PR1 has a function as the channel formation region for the unit transistor cell Q1.

In the semiconductor layer EP of the transistor cell formation region, an $n^+$-type semiconductor region NR is formed over the p-type semiconductor region PR1 and the $n^+$-type semiconductor region NR has a function as the source region for the unit transistor cell Q1. Therefore, the $n^+$-type semiconductor region NR is a semiconductor region for a source. The p-type semiconductor region PR1 lies under the $n^+$-type semiconductor region NR.

In the semiconductor layer EP, the region which retains the original n-type conductivity of the n-type epitaxial semiconductor layer is hereinafter called the n-type semiconductor region (n-type semiconductor layer) EPN. In the semiconductor layer EP, the $n^+$-type semiconductor region NR, p-type semiconductor region PR1, and $p^+$-type semiconductor region PR2 are formed and the region other than these regions, in which no impurities are implanted after the formation of the n-type semiconductor layer EP, is the n-type semiconductor region EPN. The n-type semiconductor region EPN lies under the p-type semiconductor region PR1. The n-type semiconductor region EPN can function as the drain region for the unit transistor cell Q1.

In the semiconductor substrate SB (specifically, the semiconductor layer EP), a trench TR extending from its main surface in the thickness direction of the semiconductor substrate SB is made and a gate electrode GE is formed (buried) in the trench TR through a gate insulating film GF. The gate insulating film GF as a silicon oxide film or the like extends on the bottom and side faces of the trench TR made in the semiconductor substrate SB, which means that the gate insulating film GF lies between the gate electrode GE buried in the trench TR and the semiconductor substrate SB (semiconductor layer EP). More specifically, the gate insulating film GF lies between the gate electrode GE and the bottom and side faces of the trench TR.

The gate electrode GE is made of conductive film (conductor film) buried in the trench TR of the semiconductor substrate SB which is, for example, a polycrystalline silicon film doped with n-type impurities (for example, phosphor) (doped silicon film). The gate electrode GE has a function as the gate electrode for the unit transistor cell Q1.

The trench TR is made so as to penetrate (pass through) the n¹-type semiconductor region NR and p-type semiconductor region PR1 from the upper surface of the semiconductor substrate SB and terminate in the n-type semiconductor layer EP (specifically, in the n-type semiconductor region EPN). Thus, the bottom of the trench TR is deeper than the bottom of the $n^+$-type semiconductor region NR (specifically, the boundary between the $n^+$-type semiconductor region NR and p-type semiconductor region PR1) and also deeper than the bottom of the p-type semiconductor region PR1 (specifically, the boundary between the p-type semiconductor region PR1 and n-type semiconductor region EPN) but it is located midway in the n-type semiconductor layer EP (specifically, the n-type semiconductor region EPN) (midway in the depth direction) without reaching the substrate body SB1.

Thus, in the semiconductor substrate SB (the semiconductor layer EP) in an area adjacent to the trench TR, there exist the n+-type source semiconductor region NR, the p-type semiconductor region PR1 for channel formation, located under the $n^+$-type semiconductor region NR, and the n-type semiconductor region EPN for a drain, located under the p-type semiconductor region PR1.

In the present invention, the term "depth" or "depth position" refers to a distance from the upper surface of the semiconductor substrate SB as the reference level (depth in the direction perpendicular to the upper surface of the semiconductor substrate SB). The farther side from the upper surface of the semiconductor substrate SB (specifically, the side nearer to the back surface of the semiconductor substrate SB) is taken as the deeper side and the nearer side is taken as the shallower side.

Also in the present invention, the term "height" or "height position" refers to a distance from the back surface of the semiconductor substrate SB as the reference level (height in the direction perpendicular to the back surface of the semiconductor substrate SB). The farther side from the back surface of the semiconductor substrate SB is taken as the higher side and the nearer side is taken as the lower side.

The trenches TR and gate electrodes GE buried in the respective trenches TR shown in FIGS. 1 and 3 extend in the direction perpendicular to the paper surface of FIGS. 1 and 3 and the gate electrodes GE are integrally joined in an area not shown in the sectional views of FIGS. 1 and 3. Thus, the gate electrodes GE of the unit transistor cells Q1 in the transistor cell formation region are electrically coupled to each other and also electrically coupled to gate wiring M1G which will be described later.

The upper surface of the gate electrode GE buried in each trench TR through the gate insulating film GF is in a lower position than the upper surface of the semiconductor substrate SB (upper surface of the semiconductor layer EP) in the area adjacent to the trench TR. In the area adjacent to the trench TR, since the $n^+$-type source semiconductor region NR lies in the upper layer of the semiconductor substrate SB (semiconductor layer EP), the upper surface of the semiconductor substrate SB in the area adjacent to the trench TR (upper surface of the semiconductor layer EP) is at the same level as the upper surface of the n¹-type source semiconductor region NR in the area adjacent to the trench TR. Therefore, the upper surface of the gate electrode GE buried in the trench TR through the gate insulating film GF is in a lower position than the upper surface of the $n^+$-type semiconductor region NR in the area adjacent to the trench TR.

However, it is desirable that the upper surface of the gate electrode GE buried in the trench TR through the gate insulating film GF be in a higher position than the bottom of the $n^+$-type semiconductor region NR (specifically, the boundary between the $n^+$-type semiconductor region NR and the p-type semiconductor region PR1). In other words, it is desirable that the gate electrode GE in the trench TR partially overlap the $n^+$-type source semiconductor region NR when seen in the thickness direction of the semiconductor substrate SB. If so, when a given voltage is applied to the gate electrode GE to invert the channel, current flows appropriately along the side face of the gate electrode GE (specifically, the side face of the trench TR) between the $n^+$-type semiconductor region NR for a source and the n-type semiconductor region EPN for a drain (n-type semiconductor layer EP).

As mentioned above, the semiconductor device according to this embodiment includes the gate electrode GE formed in the trench TR through the gate insulating film GF, the $n^+$-type source semiconductor region NR, formed in the area adjacent to the trench TR in the semiconductor substrate SB, the p-type semiconductor region PR1 for channel formation, located under the $n^+$-type semiconductor region NR, and the n-type drain semiconductor region EPN, located under the p-type semiconductor region PR1.

A sidewall insulating film (sidewall spacer) SW is formed over the gate electrode GE buried in the trench TR through the gate insulating film GF and over the sidewall of the trench TR. More specifically, the sidewall insulating film SW is formed over the upper surface of the gate electrode GE adjacently to the sidewall of the trench TR (trench TR's sidewall portion higher than the upper surface of the gate electrode GE). The sidewall insulating film SW is formed over the trench TR's sidewall portion higher than the upper surface of the gate electrode GE in the form of sidewall spacer. Here, the side face of the trench TR is the same as the sidewall of the trench TR in meaning.

Next, the structure of the layers over the semiconductor substrate SB will be described.

An insulating film (interlayer insulating film) IL is formed over the upper surface of the semiconductor substrate SB (specifically, the upper surface of the semiconductor layer EP) so as to cover the gate electrode GE and the sidewall insulating film SW. The insulating film IL is an interlayer insulating film which is, for example, a silicon oxide film. The gate electrode GE and sidewall insulating film SW are covered by the insulating film IL.

Contact holes (openings, through holes) CT1 and CT2 are made in the insulating film IL. Each contact hole CT1 is a contact hole for the source, which is made (located) between neighboring trenches TR in plan view in the transistor cell formation region. The contact hole CT1 penetrates the insulating film IL and reaches the semiconductor layer EP.

As shown in FIGS. 1 and 3, the contact hole CT1 penetrates the insulating film IL and digs into a portion of the semiconductor substrate SB (semiconductor layer EP), penetrating the $n^+$-type semiconductor region NR. The bottom of the contact hole CT1 is deeper than the bottom of the $n^+$-type semiconductor region NR (specifically, the boundary between the $n^+$-type semiconductor region NR and the p-type semiconductor region PR1) and shallower than the bottom of the p-type semiconductor region PR1 (specifically, the boundary between the p-type semiconductor region PR1 and the n-type semiconductor layer EP). In the p-type semiconductor region PR1, a $p^+$-type semiconductor region PR2 with a higher doping concentration than the p-type semiconductor region PR1 is formed adjacently to the bottom of the contact hole CT1. Thus, the $n^+$-type semiconductor region NR and $p^+$-type semiconductor region PR2 are exposed from the contact hole CT1.

A contact hole CT2 is a contact hole for a gate which is shown in FIG. 2. In the case of FIG. 2, agate lead wiring (gate extension) GE1 formed integrally with the gate electrode GE extends over the semiconductor substrate SB outside the trench TR and the contact hole CT2 lies over the gate lead wiring GE1 with the gate lead wiring GE1 partially exposed at the bottom of the contact hole CT2. The gate lead wiring GE1 is an extension of the gate electrode GE from inside the trench TR to the upper surface of the semiconductor substrate SB outside the trench TR, stretching over the surface of the semiconductor substrate SB. It may be considered as a gate extension. In other words, the gate lead wiring GE1 is a gate extension which is formed integrally with the gate electrode GE buried in the trench TR and stretches over the semiconductor substrate SB outside the trench TR.

In the case of FIG. 1, the gate lead wiring GE1 is formed over the semiconductor layer EP through an insulating film in the same layer as the gate insulating film GF. Alternatively, the gate lead wiring GE1 may be formed (extend) over a field insulating film (not shown) formed over the semiconductor layer EP.

A conductive plug PG as a conductor (conductor for coupling) is buried in each of the contact holes CT1 and CT2.

The plug PG includes a thin barrier conductive film formed over the bottom and sidewall (side face) of the contact hole CT1, CT2 and a main conductive film formed over the barrier conductive film so as to fill the contact hole CT1, CT2. For illustrative simplicity, FIGS. 1 to 3 show the barrier conductive film and main conductive film of the plug PG as integrated with each other. The barrier conductive film of the plug PG may be a titanium film, titanium nitride film, or laminated film of titanium and titanium nitride films. The main conductive film of the plug PG may be a tungsten film. The plug PG buried in the contact hole CT1 for the source is designated by sign PGS and hereinafter called source plug PGS and the plug PG buried in the contact hole CT2 for a gate is designated by sign PGG and hereinafter called gate plug PGG.

The gate plug PGG buried in the gate contact hole CT2 abuts on the gate lead wiring GE1 at its bottom. Therefore, the gate plug PGG is electrically coupled to the gate lead wiring GE1.

The source contact hole CT1 is made between trenches TR in plan view in the transistor cell formation region over the semiconductor substrate SB to penetrate the insulating film IL and the $n^+$-type semiconductor region NR with the bottom of the source contact hole CT1 abutting on the $p^+$-type semiconductor region PR2. Thus, the source plug PGS buried in the source contact hole CT1 penetrates the insulating film IL and the $n^+$-type semiconductor region NR and the bottom of the source plug PGS abuts on the $p^+$-type semiconductor region PR2 and a portion of the side face of the source plug PGS partially (specifically, a side face portion near the bottom) abuts on the $n^+$-type semiconductor region NR. Therefore, the source plug PGS is electrically coupled to both the $n^+$-type semiconductor region NR and the $p^+$-type semiconductor region PR2.

The source plug PGS is electrically coupled to not only the $n^+$-type source semiconductor region NR but also the $p^+$-type semiconductor region PR2, and the $p^+$-type semiconductor region PR2 abuts on the p-type semiconductor region PR1 and is electrically coupled to the p-type semiconductor region PR1. This means that the source plug PGS is electrically coupled to the p-type semiconductor region PR1 for channel formation through the $p^+$-type semiconductor region PR2. Since the source plug PGS is electrically coupled to source wiring M1S which will be described later, the source wiring M1S is electrically coupled to not only the $n^+$-type source semiconductor region NR but also the p-type semiconductor region PR1 to become a channel, so that the base potential can be constant.

Wiring M1 made of conductive film (conductor) lies over the insulating film IL in which plugs PG are buried. The wirings M1 include a source wiring M1S and a gate wiring M1G. The source wiring M1S and gate wiring M1G are formed in the same layer in the same step.

The gate wiring M1G of the wiring M1 extends over the gate plug PGG and abuts on (the upper surface of) the gate plug PGG so that it is electrically coupled to the gate plug PGG. Thus, the gate wiring M1G is electrically coupled to the gate lead wiring GE1 through the gate plug PGG. Thus, the gate wiring M1G is electrically coupled to the gate electrode GE in the transistor cell formation region through the gate plug PGG and gate lead wiring GE1.

The source wiring M1S lies almost all over the planar region (transistor cell formation region) in which a plurality of unit transistor cells Q1 are formed and the upper surface of each source plug PGS abuts on the lower surface of the source wiring M1S. Therefore, each source plug PGS is electrically coupled to the source wiring M1S. In other words, the source plugs PGS formed in the transistor cell formation region are electrically coupled to the same source wiring M1S. The gate wiring M1G is located so as not to overlap the source wiring M1S in plan view; for example it lies around the source wiring M1S (transistor cell formation region) in plan view.

Each source contact hole CT1 lies between trenches TR in plan view in the transistor cell formation region over the semiconductor substrate SB. A plurality of contact holes CT1 are made in the transistor cell formation region and through the source plugs PGS buried in the contact holes CT1, the source regions ($n^+$-type semiconductor regions NR) and channel formation regions (p-type semiconductor regions PR1) of the unit transistor cells Q1 in the transistor cell formation region are electrically coupled to the same source wiring M1S. Thus, the source wiring M1S is electrically coupled to the source regions ($n^1$-type semiconductor regions NR) and channel formation regions (p-type semiconductor regions PR1) of the unit transistor cells Q1 formed in the transistor cell formation region through the source plugs PGS.

In the case of FIG. 2, the gate lead wiring GE1 integral with the gate electrode GE extends over the semiconductor substrate SB outside the trench TR and the gate contact hole CT2 and the gate plug PGG to fill it are located over the gate lead wiring GE1 so that the gate lead wiring GE1 is coupled to the gate plug PGG. In this case, the gate electrode GE is electrically coupled to the gate wiring M1G through the gate lead wiring GE1 and gate plug PGG. Alternatively, around the transistor cell formation region, the gate contact hole CT2 and the gate plug PGG to fill it may lie over the gate electrode GE buried in the trench TR so that the gate electrode GE buried in the trench TR is coupled to the gate plug PGG. If that is the case, around the transistor cell formation region, the gate plug PGG lies over the gate electrode GE and abuts on the gate electrode GE and is electrically coupled to the gate electrode GE so that the gate electrode GE is electrically coupled to the gate wiring M1G through the gate plug PGG. In either case, the gate wiring M1G is electrically coupled to the gate electrodes GE of the unit transistor cells Q1 in the transistor cell formation region through the gate plugs PGG.

The gate wiring M1G and source wiring M1S are formed by forming a conductive film (conductor film) over the insulating film IL with plugs PG buried therein and pattering the conductive film. Thus, the gate wiring M1G and source wiring M1S are a patterned conductive film. This means that the gate wiring M1G and source wiring M1S are formed from a conductive film in the same layer. However, the gate wiring M1G and source wiring M1S are separated from each other. The conductive film of the wiring M1 (gate wiring M1G and source wiring M1S) is a metal film and preferably an aluminum film or aluminum alloy film. If it is an aluminum alloy film, it may contain Al (aluminum) as a main component and either Si (silicon) or Cu or both.

In the case of FIGS. 1 and 3, the $p^+$-type semiconductor region PR2 with a higher doping concentration than the p-type semiconductor region PR1 is located so as to abut on the bottom of the source plug PGS and be contained in the p-type semiconductor region PR1 and the source plug PGS is electrically coupled to the p-type semiconductor region PR1 through the $p^+$-type semiconductor region PR2. Alternatively, the $p^+$-type semiconductor region PR2 may be omitted so that the source plug PGS directly contacts the p-type semiconductor region PR1 to couple the source plug PGS to the p-type semiconductor region PR1 electrically. When the $p^+$-type semiconductor region PR2 lies between the source plug PGS and the p-type semiconductor region PR1, the contact resistance of the source plug PGS is reduced and the source plug PGS and the p-type semiconductor region PR1 are coupled with low resistance between them.

FIGS. 1 to 3 show a case that the plugs PG and wiring M1 are formed separately. Alternatively, the plugs PG and wiring M1 may be integrally formed. In that case, the gate plug PGG and gate wiring M1G are integrally formed and the source plug PGS and source wiring M1S are integrally formed.

The wiring M1 (gate wiring M1G and source wiring M1S) is covered by an insulating film (protective film, surface protective film) PA to protect the surface. In other words, the insulating film PA is formed over the insulating film IL so as to cover the wirings M1 (gate wiring M1G and source wiring M1S). The insulating film PA is the uppermost film (insulating film) of the semiconductor device. The insulating film PA may be considered a passivation film. The insulating film PA is, for example, made of polyimide resin.

The insulating film PA has a plurality of openings OP and part of the wiring M1 is exposed from each opening OP. The wiring M1 part exposed from the opening OP functions as a bonding pad (pad electrode).

As shown in FIG. 2, the gate wiring M1G exposed from the opening OP made in the insulating film PA (opening to form a gate bonding pad, among the openings OP) is used to form a gate bonding pad PDG. As shown in FIG. 1, the gate wiring M1S exposed from the opening OP (opening to form a source bonding pad, among the openings OP) made in the insulating film PA is used to form a source bonding pad PDS.

In the semiconductor device thus configured, the operating current of a trench-gate MISFET formed in the transistor cell formation region of the semiconductor substrate SB flows between the n-type drain semiconductor layer EP (n-type semiconductor region EPN) and the $n^+$-type source semiconductor region NR along the side face of the gate electrode GE (specifically, the side face of the trench TR) in the thickness direction of the semiconductor substrate SB. In short, a channel is formed along the thickness direction of the semiconductor substrate SB. In the p-type semiconductor region PR1, an area adjacent to the gate electrode GE through the gate insulating film GF, namely an area along the trench TR between the $n^+$-type semiconductor region NR and the n-type semiconductor layer EP (n-type semiconductor region EPN), is the channel formation region (channel layer).

Thus, the trench-gate MISFET formed in the transistor cell formation region of the semiconductor substrate SB is a vertical MISFET. Here, the vertical MISFET refers to a MISFET in which the current between the source and drain flows in the thickness direction (direction almost perpendicular to the main surface of the semiconductor substrate) of the semiconductor substrate (semiconductor substrate SB in this case).

In order to apply a current to the trench-gate MISFET, a gate voltage higher than a threshold voltage is applied to the gate electrode GE through the gate wiring M1G, etc. with a higher voltage applied to the back electrode BE than the source bonding pad PDS (source wiring M1S). Consequently the trench-gate MISFET is turned on and a current flows between the source bonding pad PDS and the back electrode BE through the source wiring M1S, source plug PGS, source region ($n^1$-type semiconductor region NR), channel layer, semiconductor layer EP (drain region), and substrate body SB1.

In the explanation given so far, it is assumed that an n-channel type trench-gate MISFET is formed. Alternatively, the conductivity (n-type or p-type) may be inverted in the MISFET.

Figure 4:
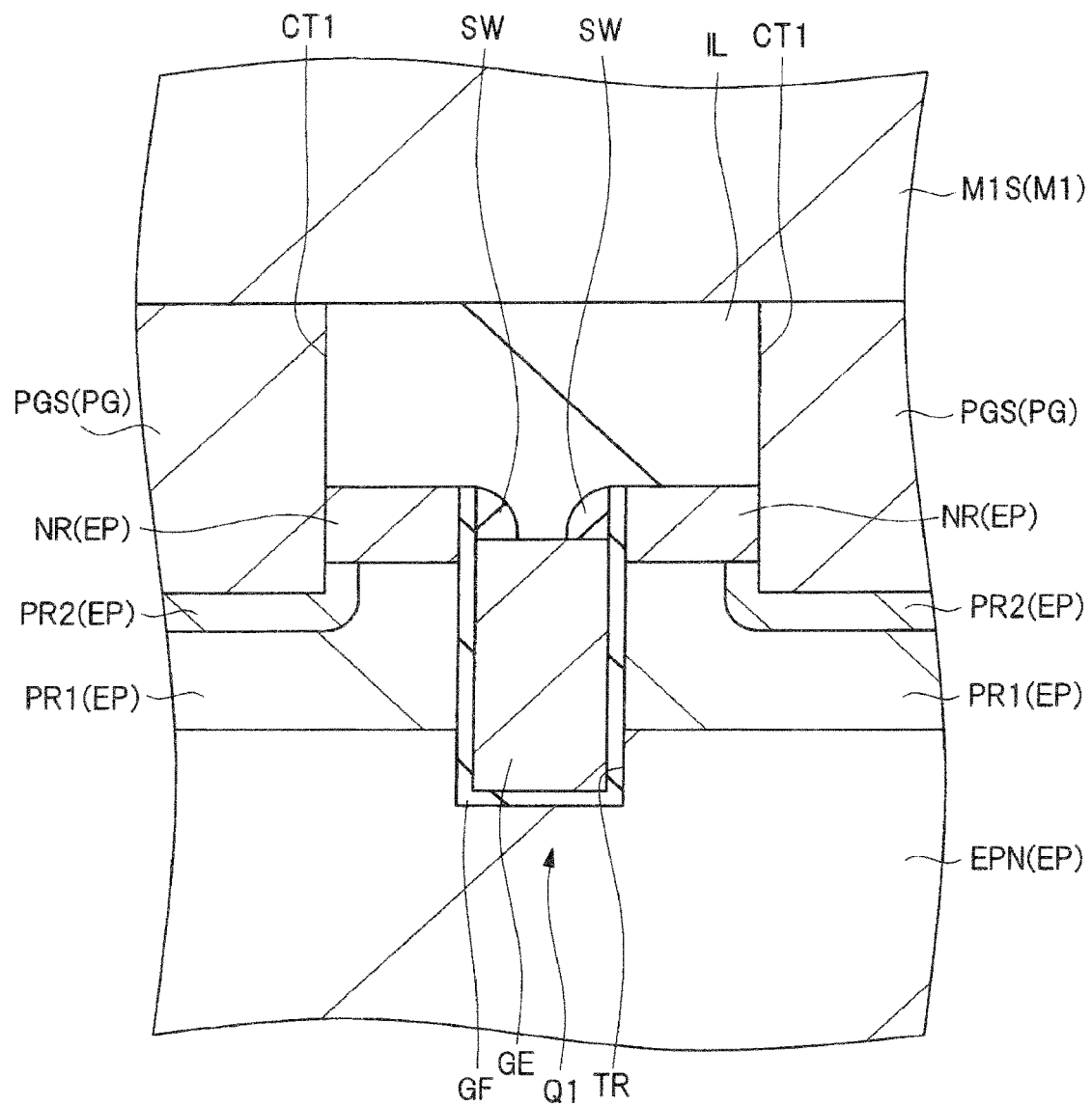
FIG. 4 is a fragmentary enlarged view showing a variation of the semiconductor device.

FIG. 4 is a fragmentary enlarged sectional view showing a variation of the semiconductor device according to this embodiment (a sectional view of an essential part thereof), which is compared with FIG. 3. In the case of FIG. 3, the gate insulating film GF does not exist between the sidewall insulating film SW and the side face (sidewall) of the trench TR and the sidewall insulating film SW abuts on the side face (sidewall) of the trench TR. On the other hand, in the case of FIG. 4, the gate insulating film GF also extends between the sidewall insulating film SW and the side face (sidewall) of the trench TR. In other words, in the case of FIG. 4, the gate insulating film GF lies not only between the gate electrode GE and the bottom and side face (sidewall) of the trench TR but also between the sidewall insulating film SW and the side face (sidewall) of the trench TR. Thus, in the case of FIG. 4, the sidewall insulating film SW is adjacent to the side face (sidewall) of the trench TR through the gate insulating film GF. The other elements of the variation shown in FIG. 4 are basically the same as those of the semiconductor device shown in FIG. 3 and descriptions thereof are omitted here.

The variation described in reference to FIG. 4 may be applied to the second, third, and fourth embodiments which will be described later.

<Semiconductor Device Manufacturing Process>

Next, the process of manufacturing the semiconductor device according to this embodiment will be described referring to FIGS. 5 to 21. FIGS. 5 to 21 are sectional views of an essential part of the semiconductor device, which show cross sections of an area corresponding to FIG. 1.

Figure 5:
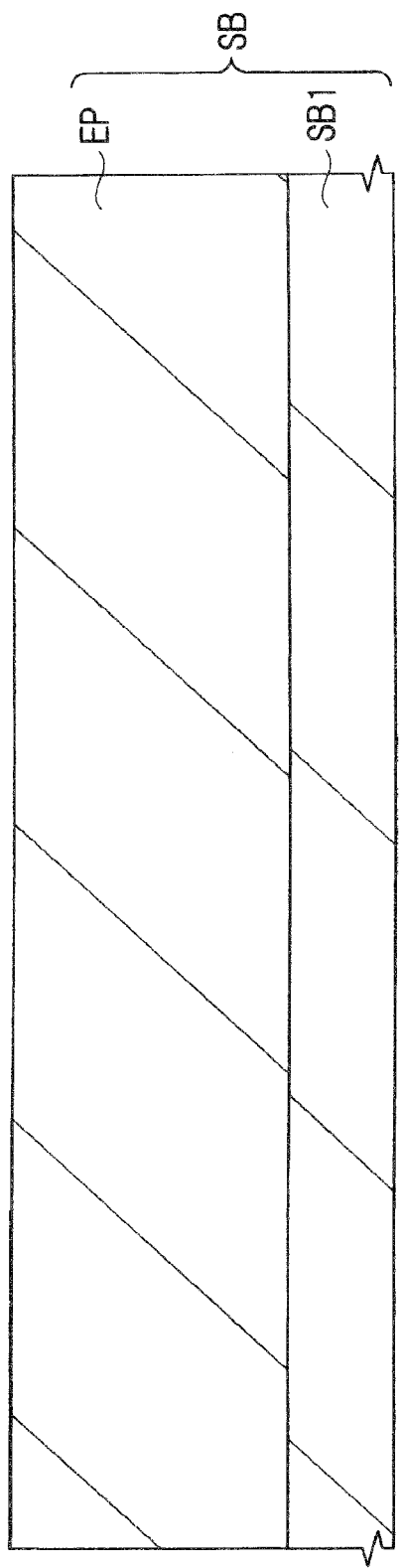
FIG. 5 is a sectional view of an essential part of the semiconductor device in a manufacturing step according to the first embodiment.

In order to manufacture the semiconductor device according to this embodiment, first a semiconductor substrate SB is provided as shown in FIG. 5.

The semiconductor substrate (semiconductor wafer) SB is provided, for example, by epitaxially growing a semiconductor layer EP of $n^-$-type monocrystalline silicon doped with n-type impurities such as phosphor (P) over the main surface of a substrate body SB1 as a semiconductor substrate (semiconductor wafer) of $n^+$-type monocrystalline silicon doped with n-type impurities such as arsenic (As). The semiconductor substrate SB is a so-called epitaxial wafer. The doping concentration (n-type impurity concentration) of the substrate body SB1 is higher than the doping concentration (n-type impurity concentration) of the semiconductor layer EP and the resistivity (specific resistance) of the substrate body SB1 is lower than the resistivity (specific resistance) of the semiconductor layer EP. The thickness of the semiconductor layer EP may be, for example, between 2.5 μm and 10 μm.

Next, trenches TR are made in the main surface of the semiconductor substrate SB (specifically the main surface of the semiconductor layer EP). The trench TR may be made by photolithography and etching.

Concretely the trenches TR may be made as follows.

Figure 6:
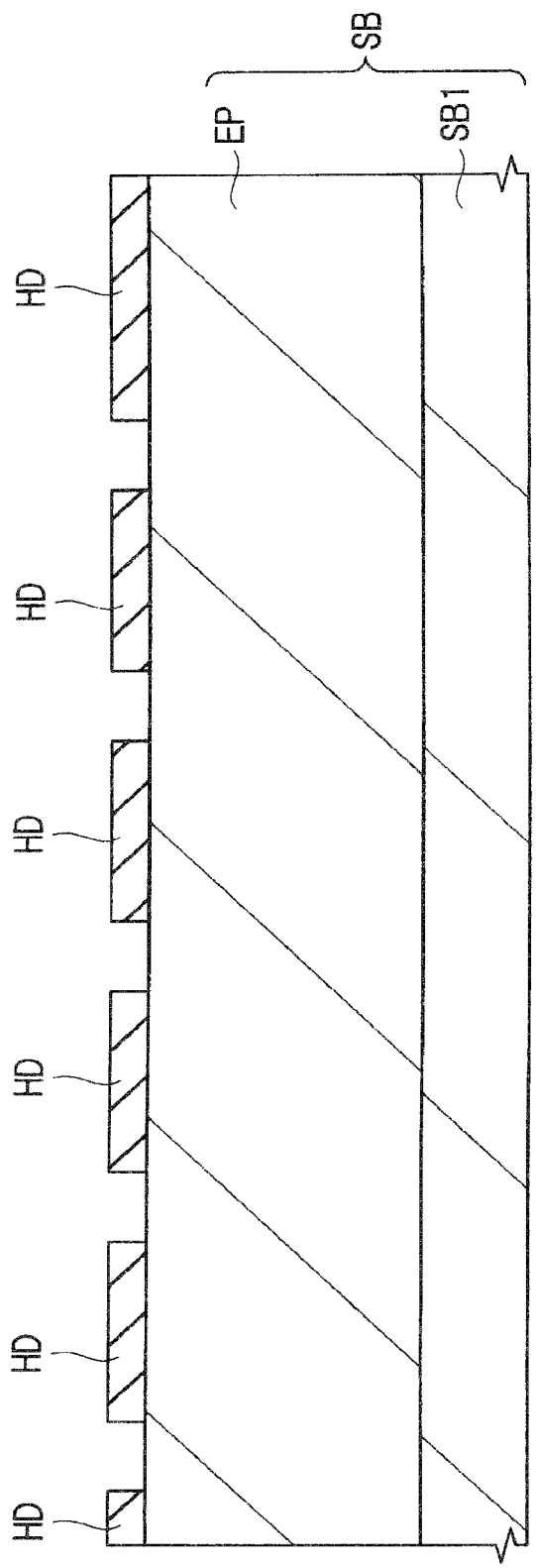
FIG. 6 is a sectional view of the essential part of the semiconductor device in a manufacturing step next to the step shown in FIG. 5.
Figure 7:
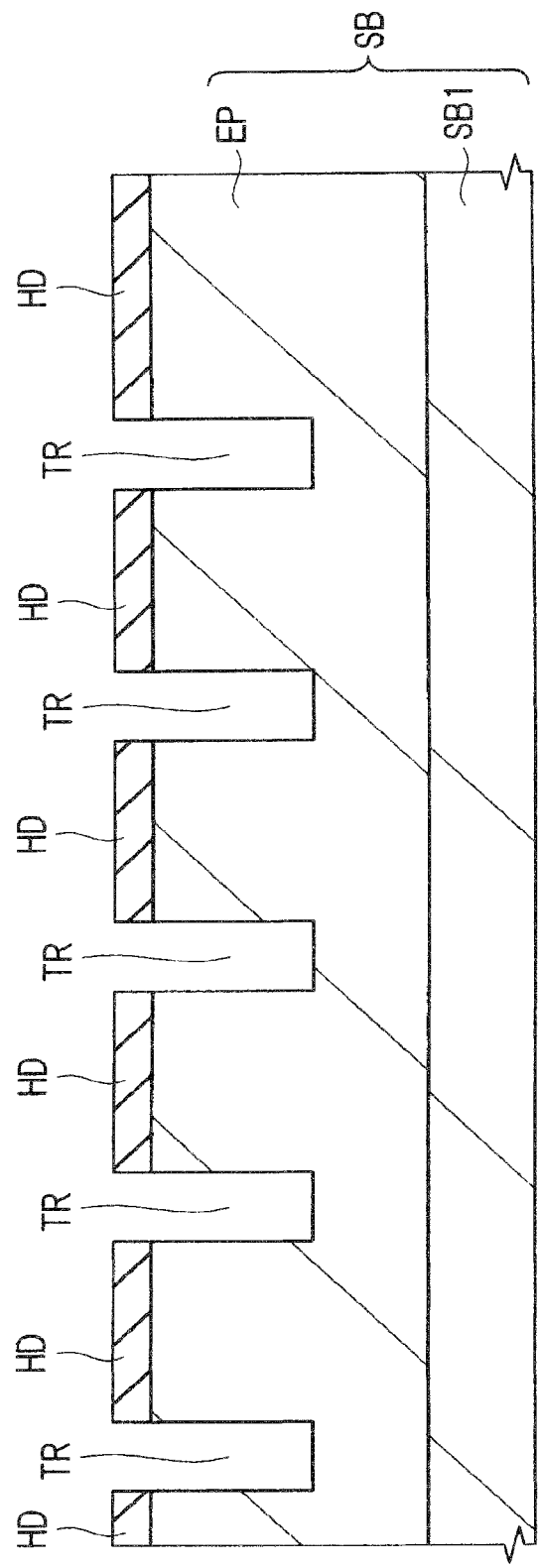
FIG. 7 is a sectional view of the essential part of the semiconductor device in a manufacturing step next to the step shown in FIG. 6.
Figure 8:
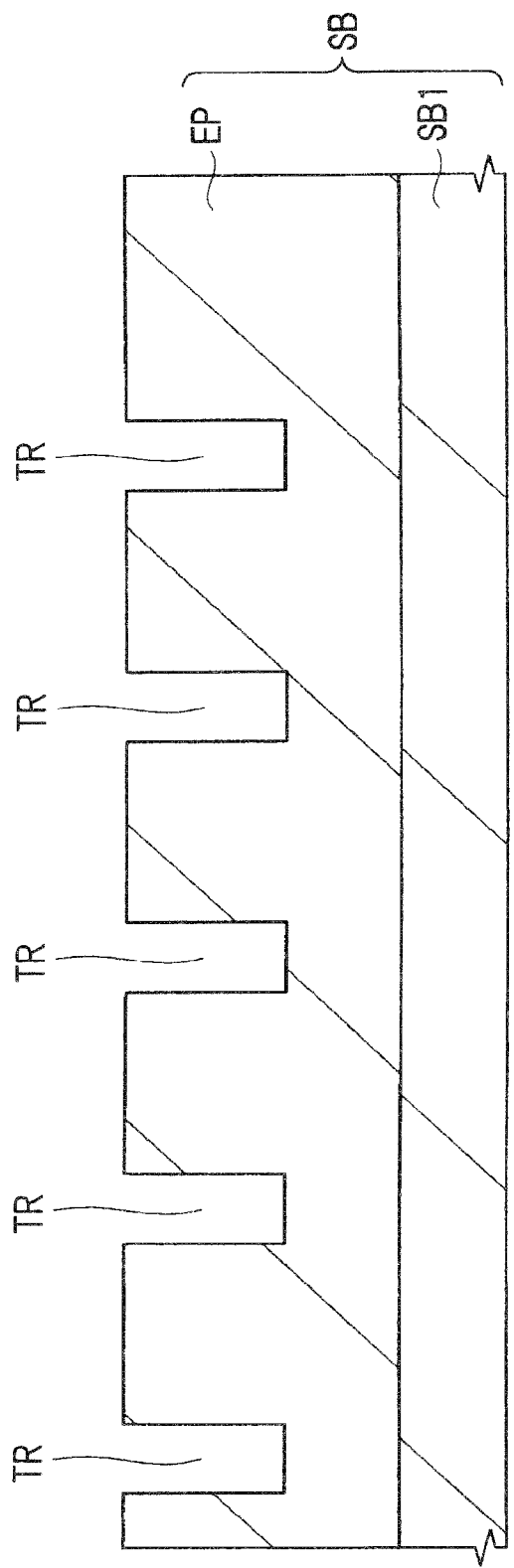
FIG. 8 is a sectional view of the essential part of the semiconductor device in a manufacturing step next to the step shown in FIG. 7.

First, as shown in FIG. 6, an insulating film HD for a hard mask is formed over the semiconductor substrate SB. The insulating film HD is a monolayer or multilayer insulating film which is, for example, a silicon nitride film formed by the CVD (Chemical Vapor Deposition) method or the like. At this stage, the insulating film HD lies all over the main surface (upper surface) of the semiconductor substrate SB. Then, a photoresist pattern (not shown) is made over the insulating film HD by photolithography. This photoresist pattern has openings in regions in which trenches TR are to be made. The insulating film HD in the regions in which trenches TR are to be made is selectively removed by etching (for example, dry etching) the insulating film HD using the photoresist pattern as an etching mask. Then the photoresist pattern is removed. FIG. 6 shows the result of removal of the pattern. The insulating film HD has openings in the regions in which trenches TR are to be made. Then, trenches TR are made in the semiconductor layer EP as shown in FIG. 7 by etching (for example, dry etching) the semiconductor layer EP using the insulating film HD as an etching mask (hard mask). Then, as shown in FIG. 8, the insulating film HD is removed by etching (for example, wet etching). The trenches TR are thus formed. The depth of each trench TR may be, for example, between 0.5 μm and 3.0 μm.

After the trenches TR are made in the semiconductor layer EP by etching the semiconductor layer EP using the insulating film HD as an etching mask, the step of forming a sacrificial oxide film on the inner face (side and bottom faces) of each trench TR by an oxidation process such as thermal oxidation and the step of removing the sacrificial oxide film by etching or the like may be carried out. The bottom corners of the trench TR can be rounded by carrying out the step of forming the sacrificial oxide film and the step of removing the sacrificial oxide film. In this case, the insulating film HD should be removed after the step of removing the sacrificial oxide film.

Alternatively, trenches TR may be made by dry-etching the semiconductor layer EP using a photoresist pattern made over the semiconductor substrate SB by photolithography, as an etching mask.

Figure 9:
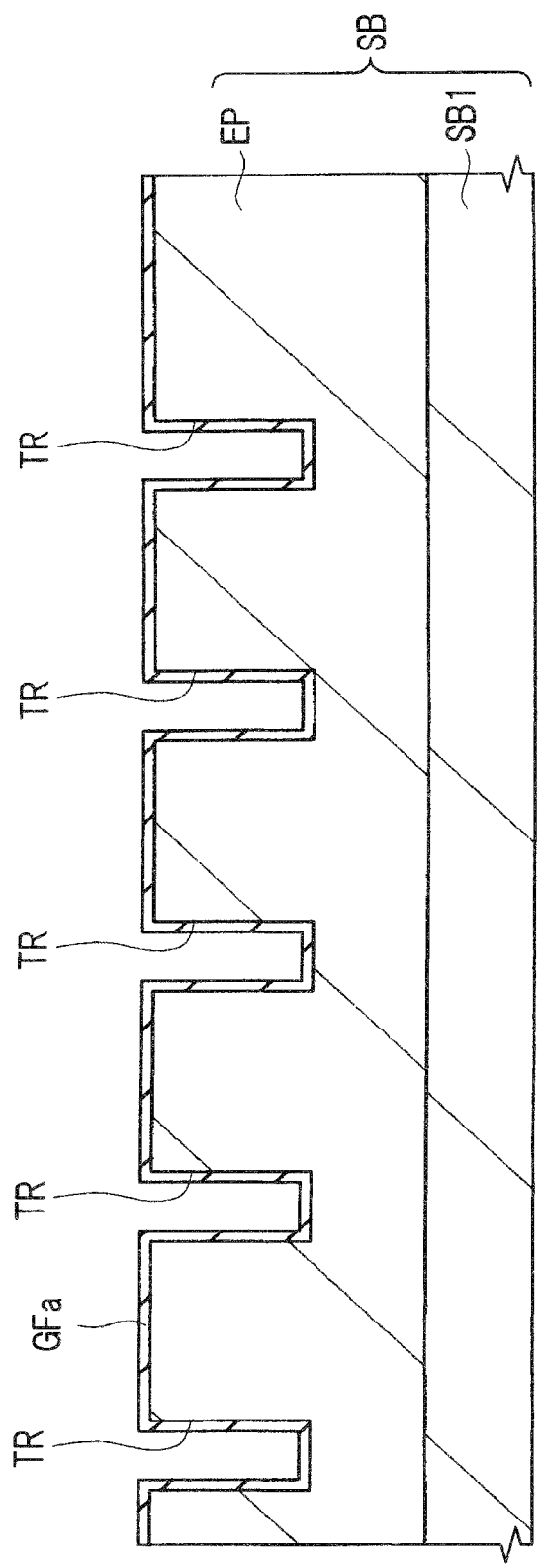
FIG. 9 is a sectional view of the essential part of the semiconductor device in a manufacturing step next to the step shown in FIG. 8.

Then, as shown in FIG. 9, an insulating film GFa, for example, a relatively thin silicon oxide film, is formed on the inner face (side and bottom faces) of each trench TR, for example, by the thermal oxidation process. The insulating film GFa, which is supposed to become a gate insulating film GF, is formed on the inner face (side and bottom faces) of the trench TR and on the exposed upper surface of the semiconductor layer EP.

Figure 10:
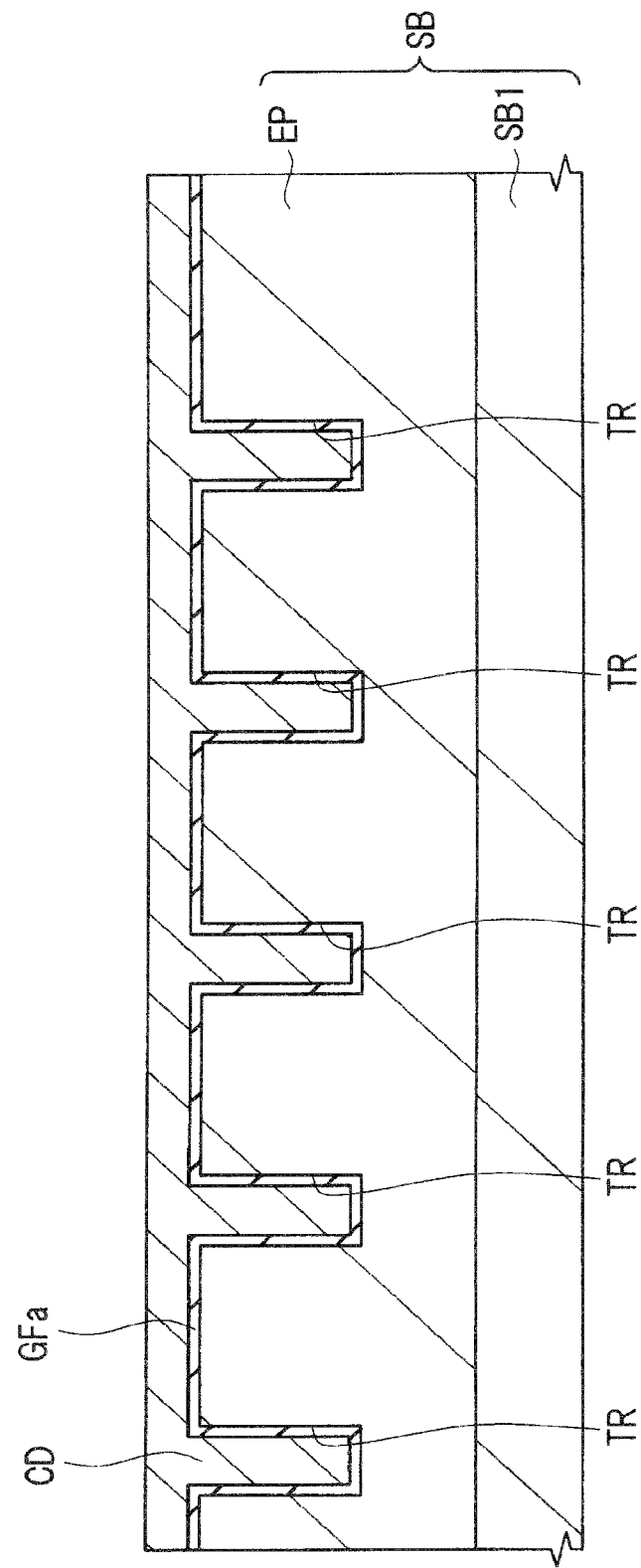
FIG. 10 is a sectional view of the essential part of the semiconductor device in a manufacturing step next to the step shown in FIG. 9.

Then, as shown in FIG. 10, a conductive film (conductor film) CD as a polycrystalline silicon film doped with impurities (for example, n-type impurities) (doped polysilicon film) is formed over the main surface of the semiconductor substrate SB, specifically over the insulating film GFa, so as to fill the trenches TR. The conductive film CD is a conductive film to form gate electrodes GE. The conductive film CD may be formed by the CVD method or the like.

Figure 11:
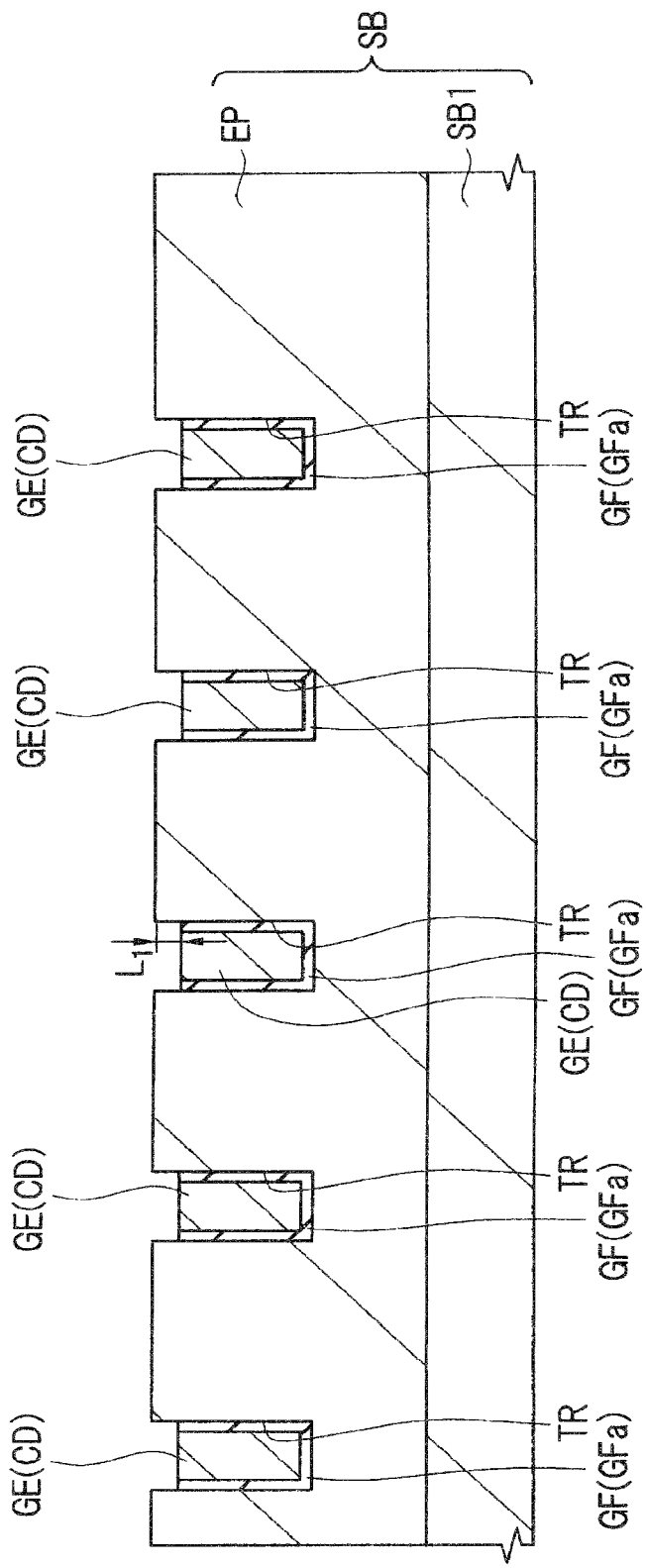
FIG. 11 is a sectional view of the essential part of the semiconductor device in a manufacturing step next to the step shown in FIG. 10.

Next, a photoresist pattern (not shown) which covers regions in which gate lead wirings GE1 are to be formed and exposes the other regions is made over the conductive film CD and the conductive film CD is etched back (etching, anisotropic etching) using the photoresist pattern as an etching mask. As a result of this etching-back step, as shown in FIG. 11, the conductive film CD inside the trenches TR and under the photoresist pattern is left and the rest of the conductive film CD is removed. Then, the photoresist pattern is removed. The insulating film GFa remaining in each trench TR becomes a gate insulating film GF, the conductive film CD remaining in the trench TR becomes a gate electrode GE, and the conductive film CD remaining under the photoresist pattern becomes a gate lead wiring GE1. The gate lead wiring GE1 is shown in FIG. 2 though it is not shown in FIG. 11.

In the step of etching back the conductive film CD, the insulating film GFa of the upper surface of the semiconductor layer EP (insulating film GFa in the regions other than inside the trenches TR) may be removed.

The gate electrode GE as the conductive film CD buried in each trench TR and the gate lead wiring GE1 integral with the gate electrode GE are thus formed. The gate electrode GE remains buried in the trench TR through the insulating film GFa (gate insulating film GF).

As shown in FIG. 11, in the step of etching back the conductive film CD, over-etching is done so that the upper surface of the gate electrode GE buried in each trench TR is recessed from (lower than) the upper surface of the semiconductor layer EP. FIG. 11 shows that the upper surface of the gate electrode GE buried in the trench TR is lower than the upper surface of the semiconductor layer EP by distance $L_1$. Here, the side nearer to the back of the semiconductor substrate SB is taken as the lower side and the side farther from the back of the semiconductor substrate SB is taken as the higher side. This distance $L_1$ should be smaller than the depth (thickness) of the $n^1$-type semiconductor region NR to be formed later. In other words, the upper surface of the gate electrode GE should be higher than the bottom (lower surface) of the $n^+$-type semiconductor region NR to be formed later. Consequently, when a given voltage is applied to the gate electrode GE to invert the channel, electric current will flow appropriately along the side face of the gate electrode GE (side face of the trench TR) between the $n^+$-type semiconductor region NR for the source and the semiconductor layer EP for the drain (n-type semiconductor region EPN).

Figure 12:
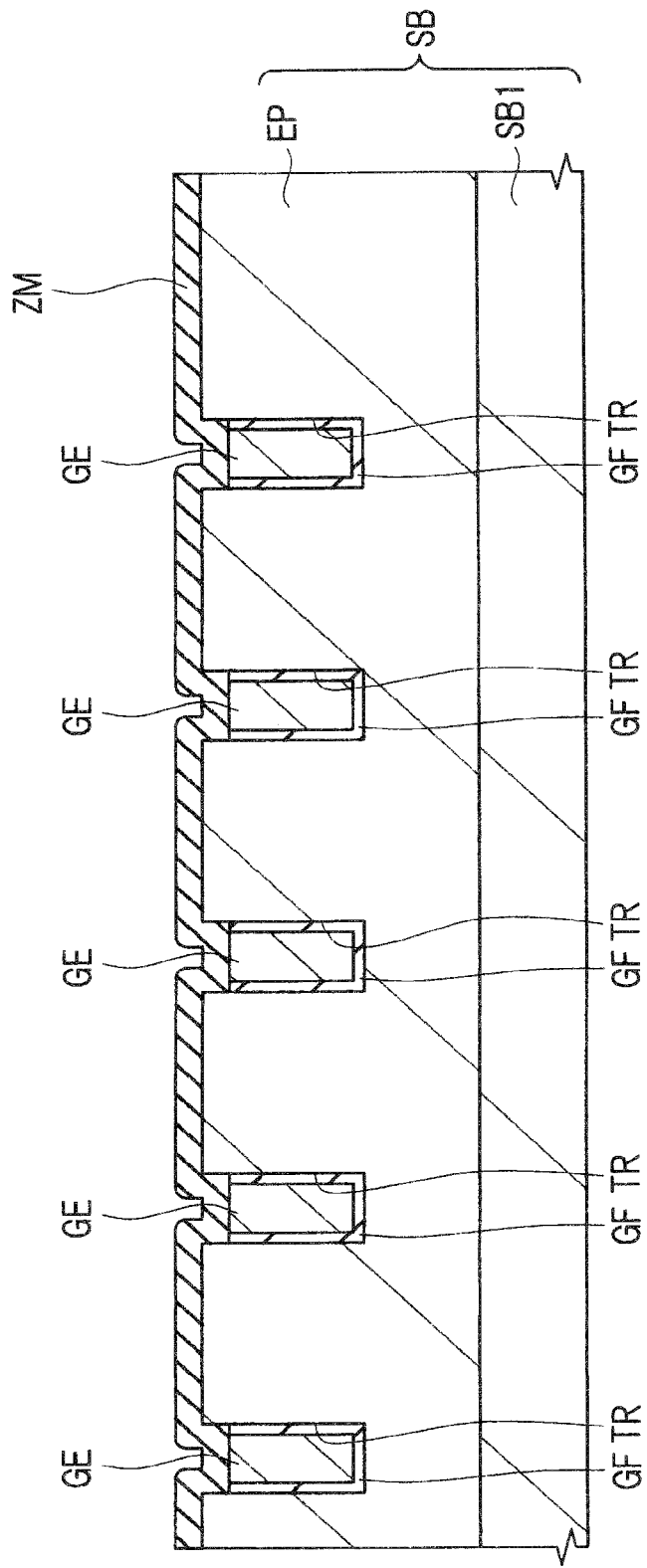
FIG. 12 is a sectional view of the essential part of the semiconductor device in a manufacturing step next to the step shown in FIG. 11.

Next, as shown in FIG. 12, an insulating film ZM is formed over the upper surface of the semiconductor substrate SB (upper surface of the semiconductor layer EP) so as to cover the gate electrodes GE. The insulating film ZM may be a silicon oxide film which is formed by the CVD method or the like.

Figure 13:
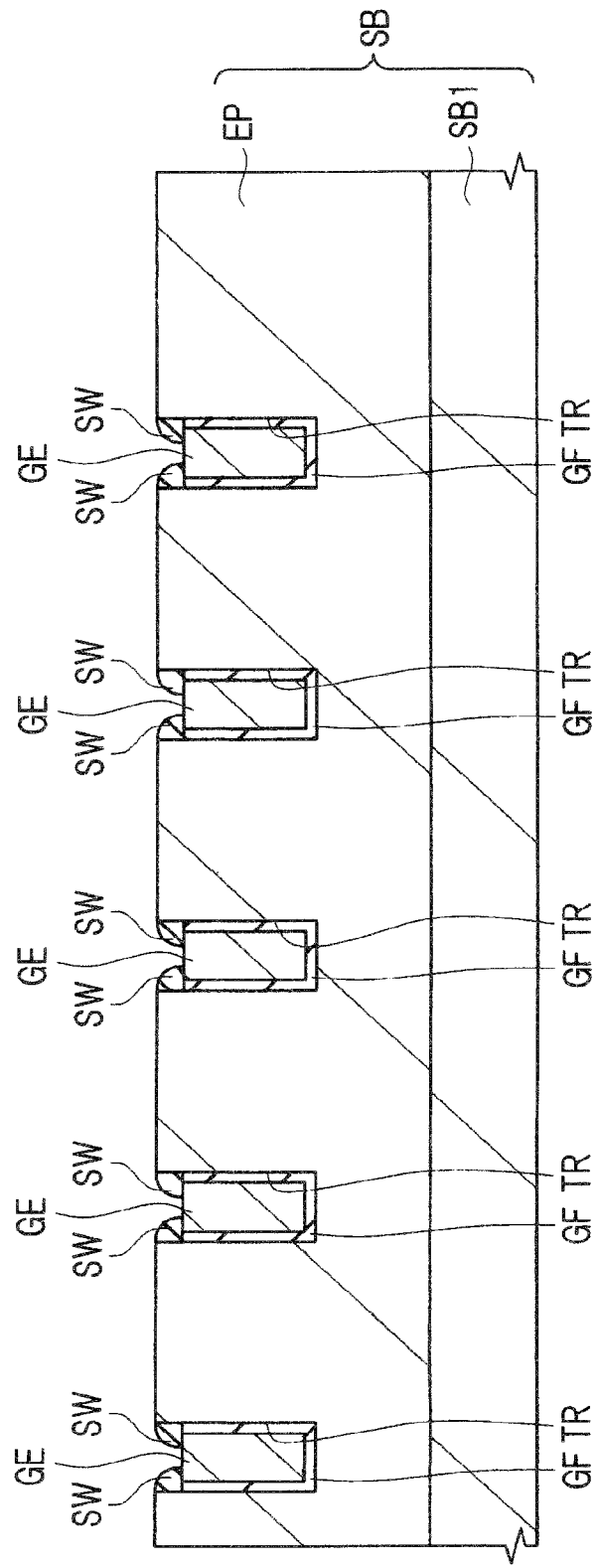
FIG. 13 is a sectional view of the essential part of the semiconductor device in a manufacturing step next to the step shown in FIG. 12.

Next, the insulating film ZM is etched back (etching, anisotropic etching). As a result of this etching-back step, the insulating film ZM locally remains on a portion of the sidewall of each trench TR which is higher than the upper surface of the gate electrode GE so that a sidewall insulating film (sidewall spacer) SW is formed as shown in FIG. 13. In other words, the sidewall insulating film SW is the insulating film ZM which remains in the form of a sidewall spacer on the higher portion of the sidewall of the trench TR than the upper surface of the gate electrode GE. In short, the sidewall insulating film SW is shaped as a sidewall spacer. The sidewall insulating film SW is formed on the higher portion of the sidewall of the trench TR than the upper surface of the gate electrode GE in a self-alignment manner.

The sidewall insulating film SW lies over the upper surface of the gate electrode GE adjacently to the sidewall of the trench TR (higher portion of the sidewall of the trench TR than the upper surface of the gate electrode GE). In the step of etching back the insulating film ZM, the portions of the insulating film ZM other than the portions to become the sidewall insulating film SM are removed by etching.

In the step of etching back the insulating film ZM, the etching condition should be such that the semiconductor layer EP and the gate electrode GE are harder to etch than the insulating film ZM. This suppresses or prevents the semiconductor layer EP or the gate electrode GE from being etched in the step of etching back the insulating film ZM.

Figure 14:
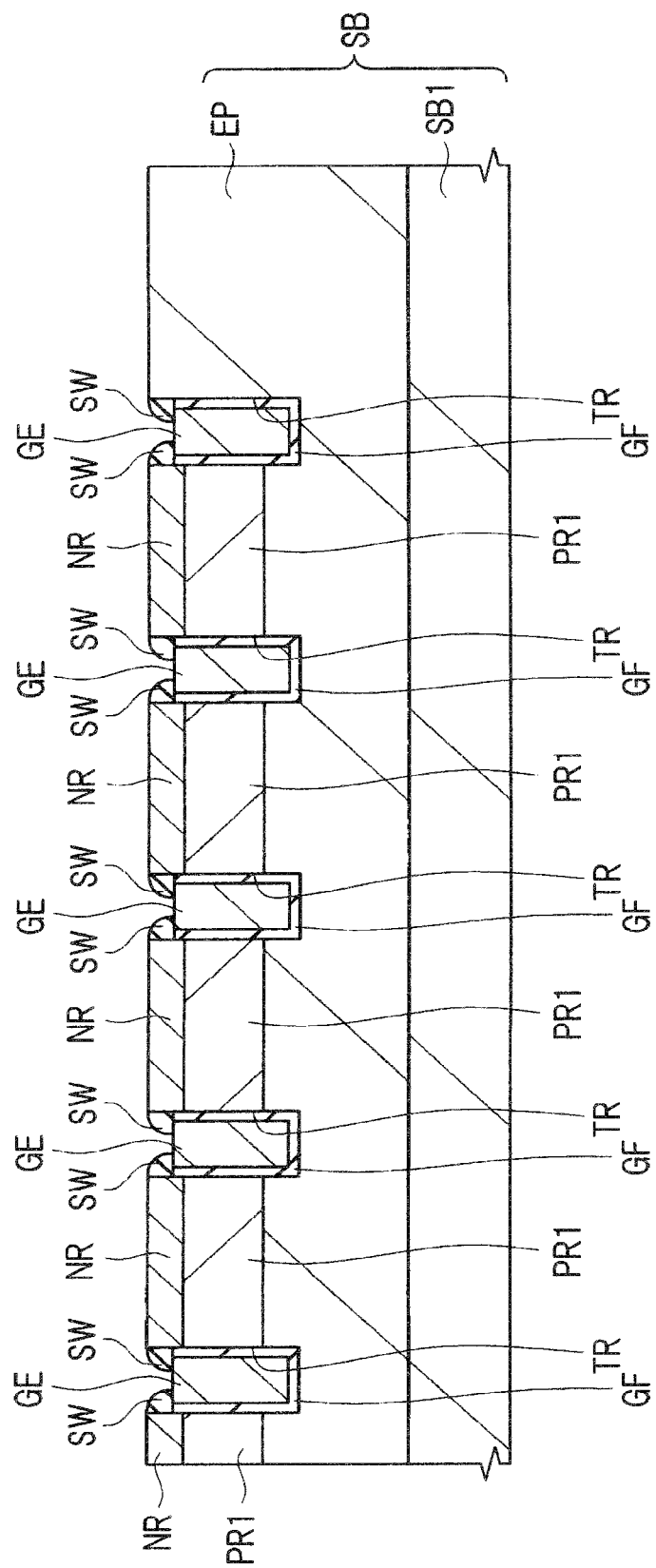
FIG. 14 is a sectional view of the essential part of the semiconductor device in a manufacturing step next to the step shown in FIG. 13.

Next, as shown in FIG. 14, a p-type semiconductor region PR1 is formed in the semiconductor layer EP by implanting p-type impurity ions (for example, boron (B)) into the main surface (upper surface) of the semiconductor substrate SB. The p-type semiconductor region PR1 is formed in the upper layer of the semiconductor substrate SB in the transistor cell formation region. Also the p-type semiconductor region PR1 is formed in the semiconductor layer EP adjacently to the trench TR.

Next, an $n^+$-type semiconductor region NR is formed in the semiconductor layer EP by implanting n-type impurity ions (for example, arsenic (As)) into the main surface (upper surface) of the semiconductor substrate SB. The $n^+$-type semiconductor region NR is formed in the semiconductor layer EP adjacently to the trench TR.

The depth of the $n^|$-type semiconductor region NR (depth position of the lower surface) is smaller than the depth of the p-type semiconductor region PR1 (depth position of the lower surface). Thus, the p-type semiconductor region PR1 and $n^+$-type semiconductor region NR lie in the upper layer (surface layer) of the semiconductor layer EP in the transistor cell formation region; and the $n^+$-type semiconductor region NR lies over the p-type semiconductor region PR1, the p-type semiconductor region PR1 lies under the $n^+$-type semiconductor region NR, and the $n^+$-type semiconductor region NR lies over the p-type semiconductor region PR1. Since the $n^+$-type semiconductor region NR and p-type semiconductor region PR1 are smaller in depth than the trench TR, the trench TR penetrates the $n^+$-type semiconductor region NR and p-type semiconductor region PR1 and terminates midway in the n-type semiconductor layer EP. The $n^+$-type semiconductor region NR has a function as the source region for the trench-gate MISFET and may be considered the semiconductor region for the source. The p-type semiconductor region PR1 has a function as the channel formation region for the trench-gate MISFET.

In the explanation given so far, it is assumed that the p-type semiconductor region PR1 is formed before the $n^|$-type semiconductor region NR is formed. Alternatively, the $n^+$-type semiconductor region NR may be formed before the p-type semiconductor region PR1 is formed. FIG. 14 shows that both the p-type semiconductor region PR1 and $n^+$-type semiconductor region NR have been formed.

Next, activation annealing is done as heat treatment to activate the implanted impurities. Activation annealing may be done, for example, in the temperature range from approximately 800° C. to 1000° C. The impurities implanted into the semiconductor regions (p-type semiconductor region PR1 and $n^+$-type semiconductor region NR) formed in the semiconductor substrate SB (semiconductor layer EP) are thus activated.

Figure 15:
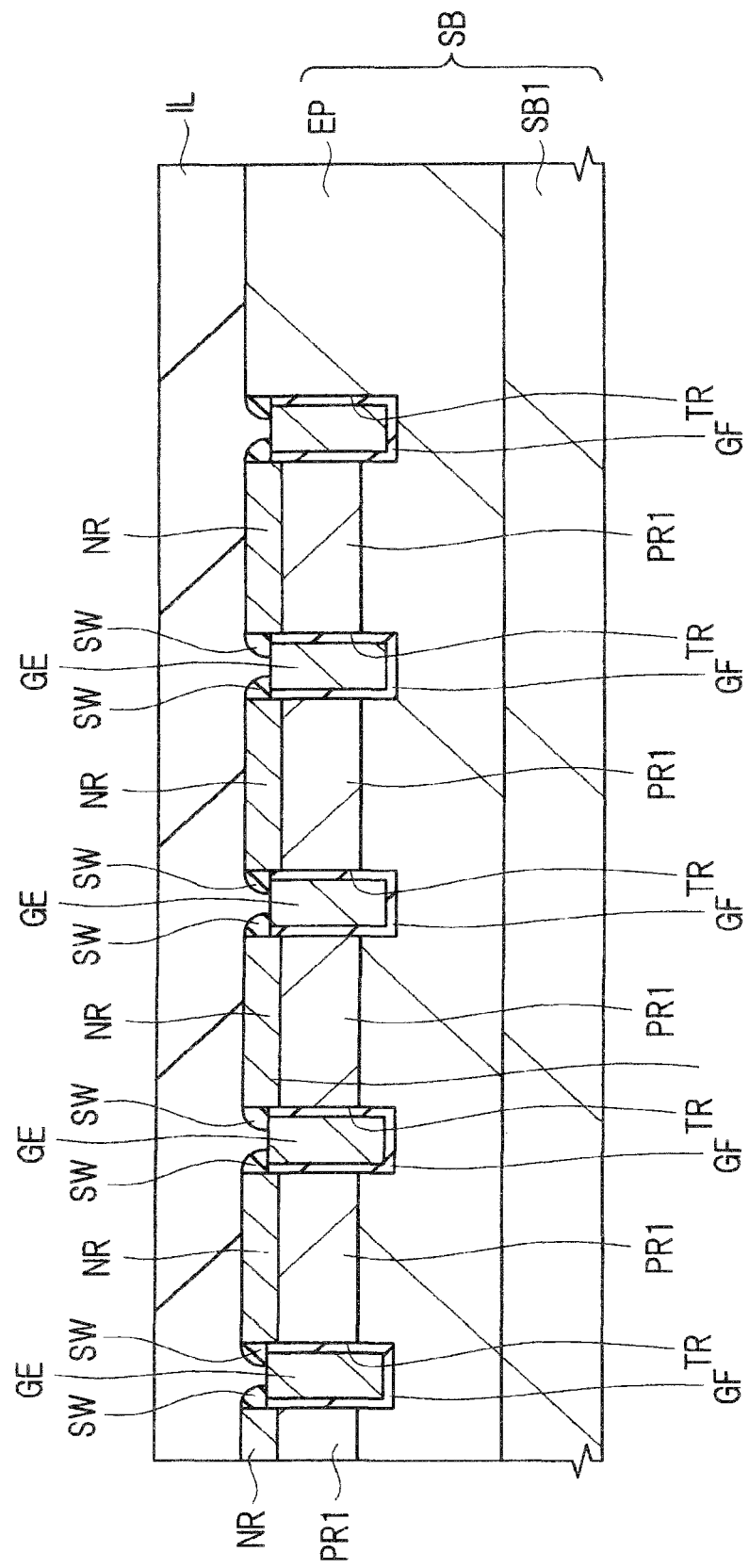
FIG. 15 is a sectional view of the essential part of the semiconductor device in a manufacturing step next to the step shown in FIG. 14.

Next, as shown in FIG. 15, an interlayer insulating film IL is formed over the main surface (upper surface) of the semiconductor substrate SB so as to cover the gate electrodes GE, gate lead wirings GE1, and sidewall insulating films SW. The insulating film IL is, for example, a silicon oxide film.

Figure 16:
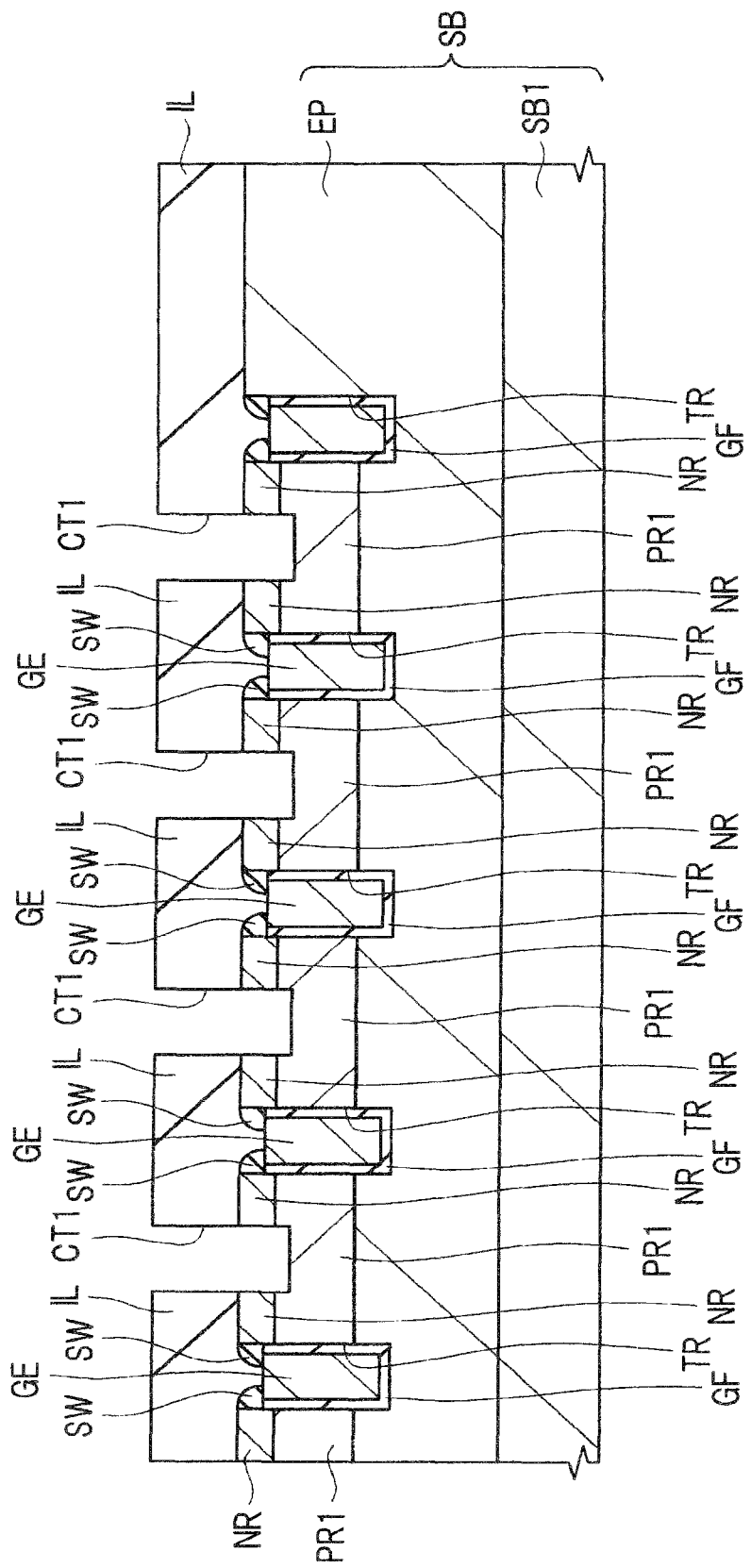
FIG. 16 is a sectional view of the essential part of the semiconductor device in a manufacturing step next to the step shown in FIG. 15.

Next, as shown in FIG. 16, contact holes CT1 are made by etching (for example, dry etching) the insulating film IL using a photoresist pattern (not shown) made over the insulating film IL by photolithography as an etching mask, and etching (for example, dry etching) the semiconductor layer EP. Each contact hole CT1 is located between neighboring trenches TR in plan view, penetrating the insulating film IL and $n^+$-type semiconductor region NR with the bottom of the contact hole CT1 reaching the p-type semiconductor region PR1. Therefore, the p-type semiconductor region PR1 is exposed at the bottom of the contact hole CT1 and the $n^|$-type semiconductor region NR is exposed at the side face lower portion of the contact hole CT1.

Figure 17:
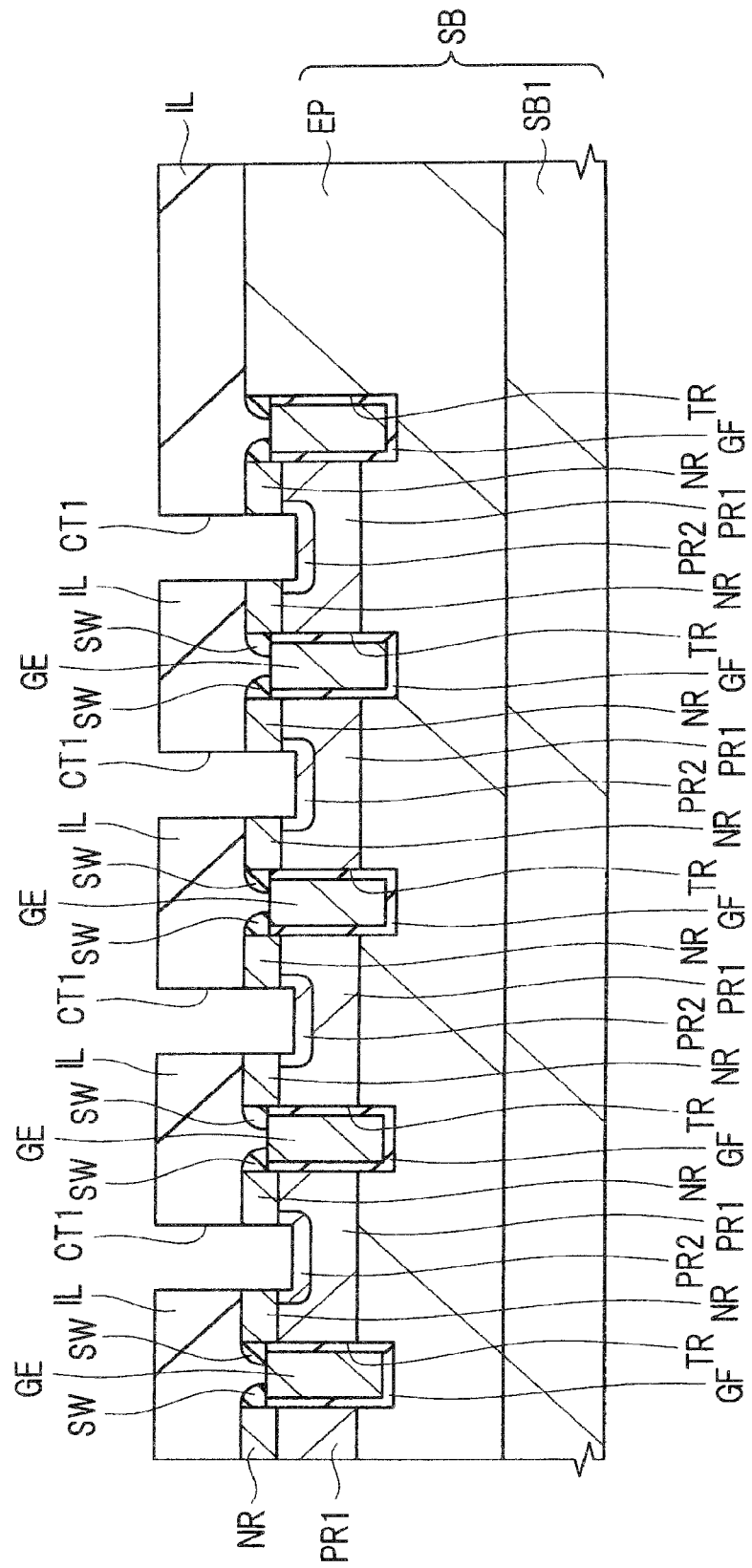
FIG. 17 is a sectional view of the essential part of the semiconductor device in a manufacturing step next to the step shown in FIG. 16.

Next, as shown in FIG. 17, a $p^+$-type semiconductor region PR2 with a higher doping concentration than the p-type semiconductor region PR1 is formed in contact with the bottom of each contact hole CT1 by implanting p-type impurity ions into the p-type semiconductor region PR1 exposed at the bottom of the contact hole CT1.

The $p^+$-type semiconductor region PR2 is omissible and if it is omitted, the source plug PGS to be formed later will directly contact the p-type semiconductor region PR1. However, it should be noted that the presence of the $p^+$-type semiconductor region PR2 between the source plug PGS and the p-type semiconductor region PR1 reduces the contact resistance of the source plug PGS.

Next, contact holes CT2 are made by etching (for example, dry etching) the insulating film IL using another photoresist pattern (not shown) made over the insulating film IL by photolithography as an etching mask. FIG. 2 shows a contact hole CT2 though FIG. 17 does not shows it. The contact hole CT2 lies over the gate lead wiring GE1 and the gate lead wiring GE1 is exposed at the bottom of the contact hole CT2. Contact holes CT2 may be made in the same step in which contact holes CT1 are made.

Figure 18:
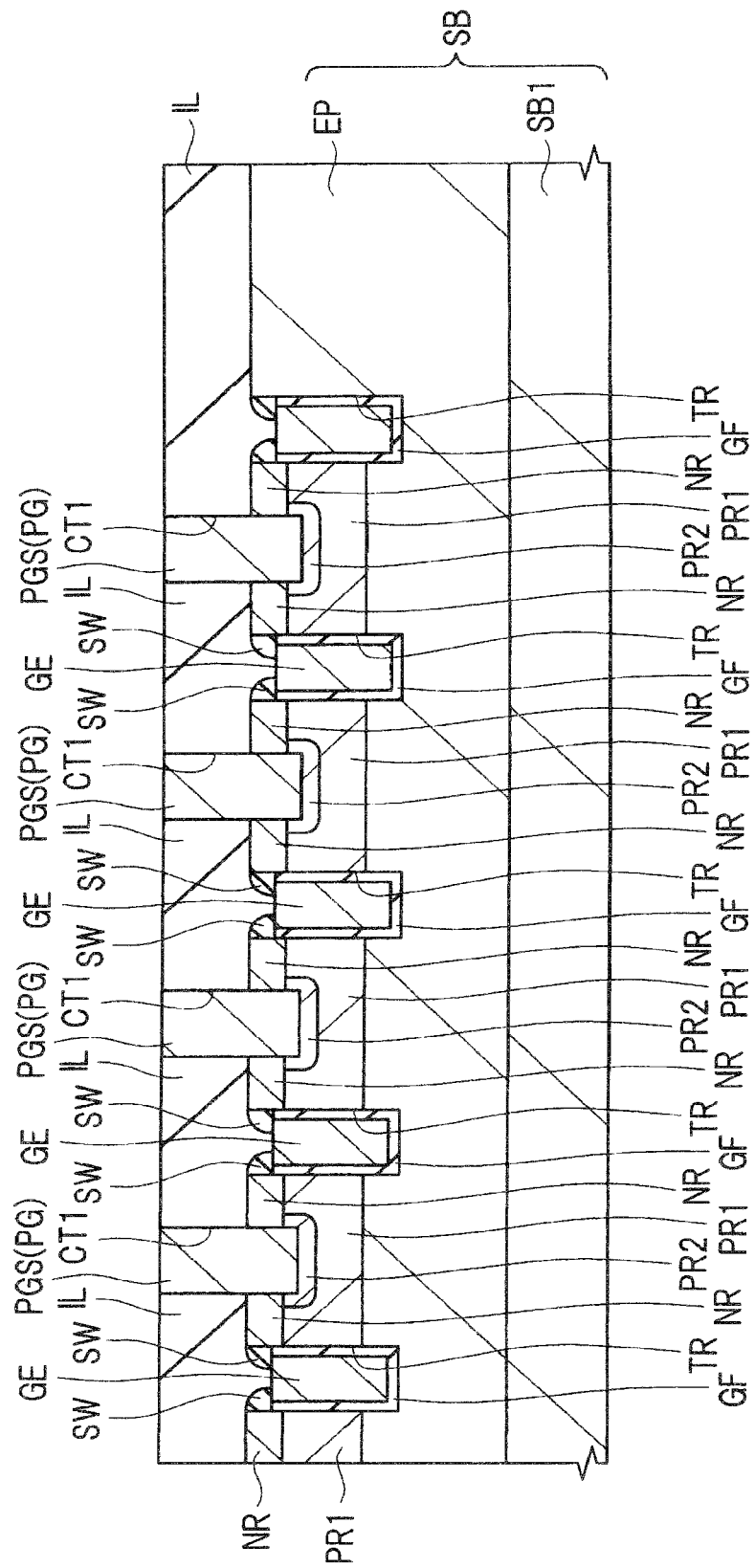
FIG. 18 is a sectional view of the essential part of the semiconductor device in a manufacturing step next to the step shown in FIG. 17.

Next, as shown in FIG. 18, conductive plugs PG of tungsten (W), etc. are formed as conductors (conductors for coupling) in the contact holes CT1 and CT2.

In order to form plugs PG, for example, a barrier conductive film (for example, titanium film, titanium nitride film or laminated film of titanium and titanium nitride films) is formed over the insulating film IL including the insides (bottoms and sidewalls) of the contact holes CT1 and CT2. Then, a main conductive film such as a tungsten film is formed over the barrier conductive film so as to fill the contact holes CT1 and CT2. Then, the plugs PG are completed by removing unwanted conductive film portions and barrier conductive film portions outside the contact holes CT1 and CT2 by CMP (Chemical Mechanical Polishing) or etching back. For illustrative simplicity, the barrier conductive film and main conductive film (tungsten film) are shown as integrated with each other. Alternatively, the barrier conductive film for plugs PG may be made to remain over the insulating film IL to use the barrier conductive film as a base film for wiring M1.

The plug PG buried in each contact hole CT1 is a source plug PGS and the plug buried in each contact hole CT2 is a gate plug PGG. The gate plug PGG, abutting on the gate lead wiring GE1 at the bottom of the contact hole CT2, is electrically coupled to the gate lead wiring GE1. The source plug PGS, abutting on the $n^1$-type semiconductor region NR and p'-type semiconductor region PR2 at the bottom of the contact hole CT1, is electrically coupled to them.

Figure 19:
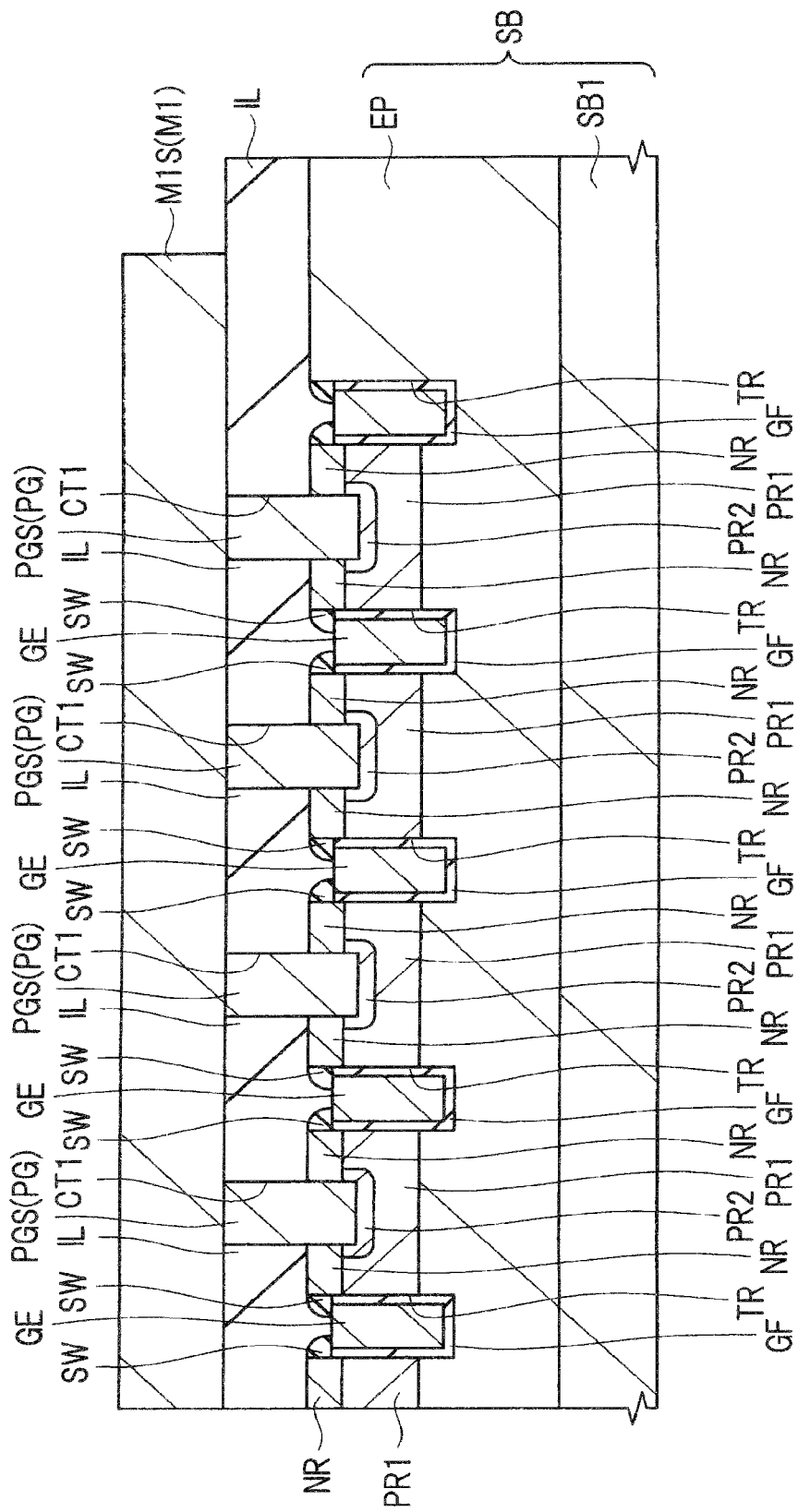
FIG. 19 is a sectional view of the essential part of the semiconductor device in a manufacturing step next to the step shown in FIG. 18.

Next, as shown in FIG. 19, wirings M1 are formed by making a conductive film (for example, an aluminum film or aluminum alloy-based metal film) over the main surface (upper surface) of the semiconductor substrate SB, specifically over the insulating film IL with the plugs PG buried therein, by sputtering or the like and then patterning the conductive film by photolithography and etching.

Among the wirings M1, a source wiring M1S is electrically coupled to the $n^+$-type semiconductor region NR and $p^+$-type semiconductor region PR2 through a source plug PGS. Among the wirings M1, a gate wiring M1G is electrically coupled to a gate lead wiring GE1 through a gate plug PGG. FIG. 2 shows a gate wiring M1G and a gate plug PGG, though FIG. 19 does not show them.

In the above explanation, it is assumed that plugs PG and wirings M1 are separately formed. Alternatively, a plug PG and a wiring M1 may be integrally formed. In this case, no special step is taken to form plugs PG; instead a conductive film (for example, an aluminum film or aluminum alloy-based metal film) is formed over the main surface of the semiconductor substrate SB (specifically, over the insulating film IL) so as to fill the contact holes CT1 and CT2 and the conductive film is patterned by photolithography and etching to form wirings M1. In this case, a plug PG is a part of a wiring M1 (namely, the plug PG is integrally formed with the wiring M1).

Figure 20:
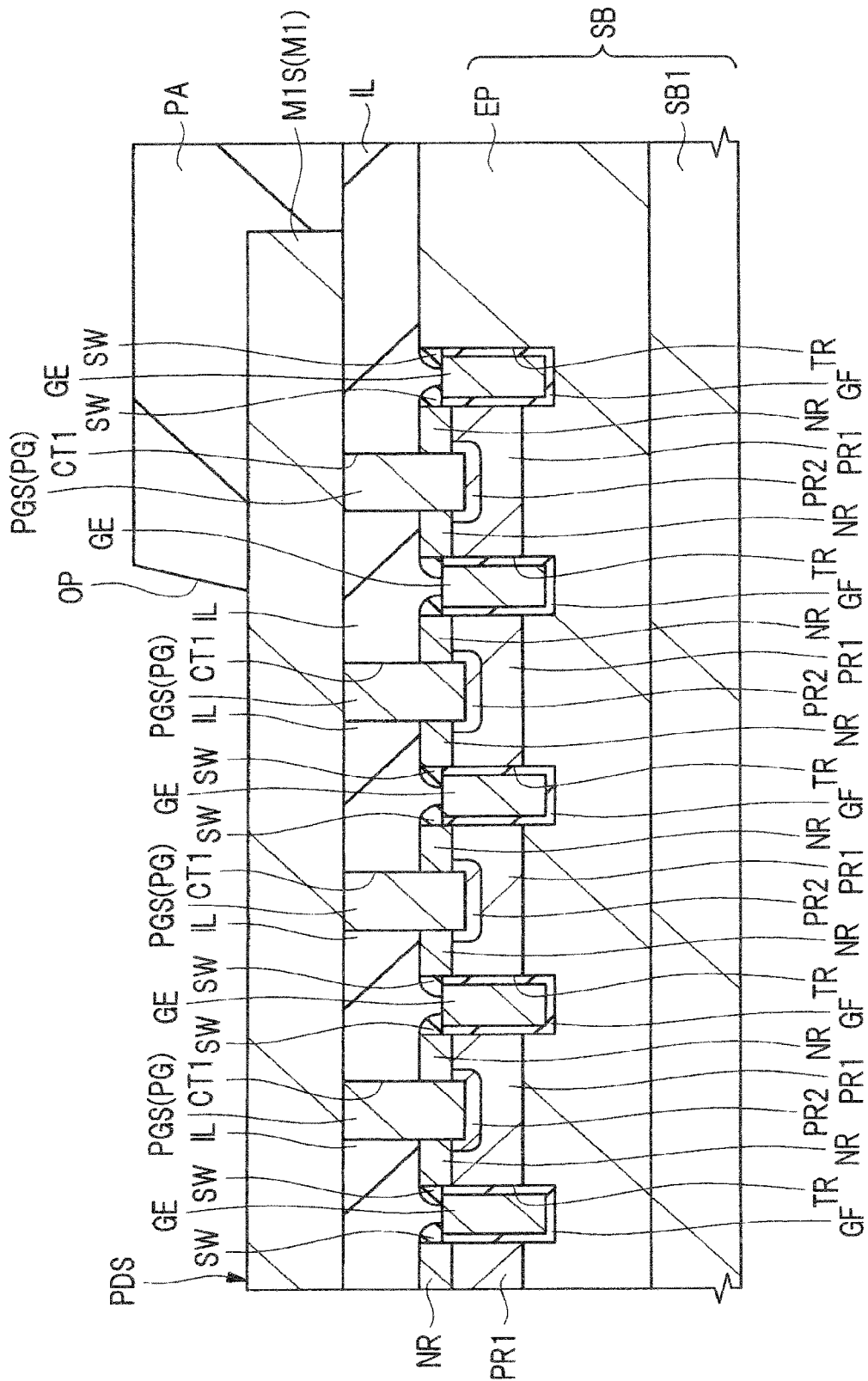
FIG. 20 is a sectional view of the essential part of the semiconductor device in a manufacturing step next to the step shown in FIG. 19.

Next, as shown in FIG. 20, an insulating film PA is formed over the main surface of the semiconductor substrate SB, specifically over the insulating film IL, so as to cover the wirings M1. The insulating film PA is made of, for example, polyimide resin and intended to protect the surface.

Next, a bonding pad (pad electrode) is formed by patterning the insulating film PA by photolithography and etching to make an opening OP in the insulating film PA which partially exposes the wiring M1.

The source wiring M1S exposed from the opening OP in the insulating film PA serves as a bonding pad PDS for the source and the gate wiring M1G exposed from the opening OP in the insulating film PA serves as a bonding pad PDG for a gate.

Furthermore, a metal layer (not shown) may be formed over the surface of the wiring M1 exposed from the opening OP (specifically, the bonding pad surface) by plating or the like. This metal layer may be a laminated film including a copper (Cu) film, nickel (Ni) film and gold (Au) film which are stacked in order from bottom up or a laminated film including a titanium (Ti) film, nickel (Ni) film, and gold (Au) film which are stacked in order from bottom up. This metal layer suppresses or prevents oxidation of the underlying aluminum (wiring M1) surface.

Figure 21:
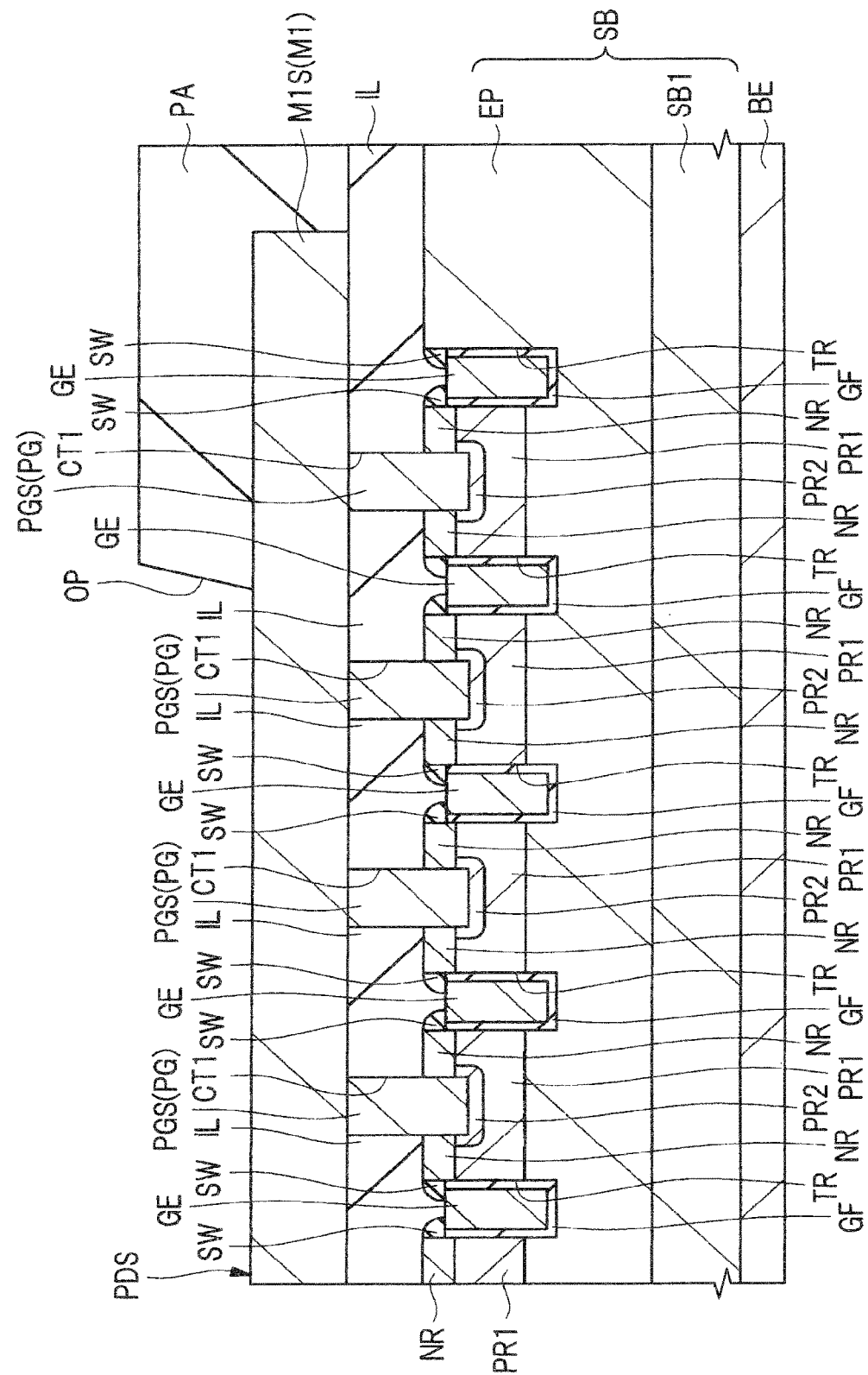
FIG. 21 is a sectional view of the essential part of the semiconductor device in a manufacturing step next to the step shown in FIG. 20.

Next, the thickness of the semiconductor substrate SB is decreased as necessary by grinding or polishing the back of the semiconductor substrate SB. Then, as shown in FIG. 21, a back electrode (drain electrode) BE is formed by depositing a metal layer all over the back of the semiconductor substrate SB (back of the substrate body SB1) by vacuum evaporation. The back electrode BE is electrically coupled to the drain of the trench-gate MISFET and functions as a drain electrode (drain back electrode). The substrate body SB1 and semiconductor layer EP function as the drain region for the vertical MISFET with a trench-gate structure. The back electrode BE may be a laminated film including a titanium (Ti) layer, nickel (Ni) layer, and gold (Au) layer which are stacked in order from the back of the semiconductor substrate SB.

The semiconductor device according to this embodiment is manufactured as mentioned above. After that, the semiconductor substrate SB is divided (separated, cut) into individual semiconductor chips (semiconductor devices) by dicing or a similar method.

Comparative Example

Figure 22:
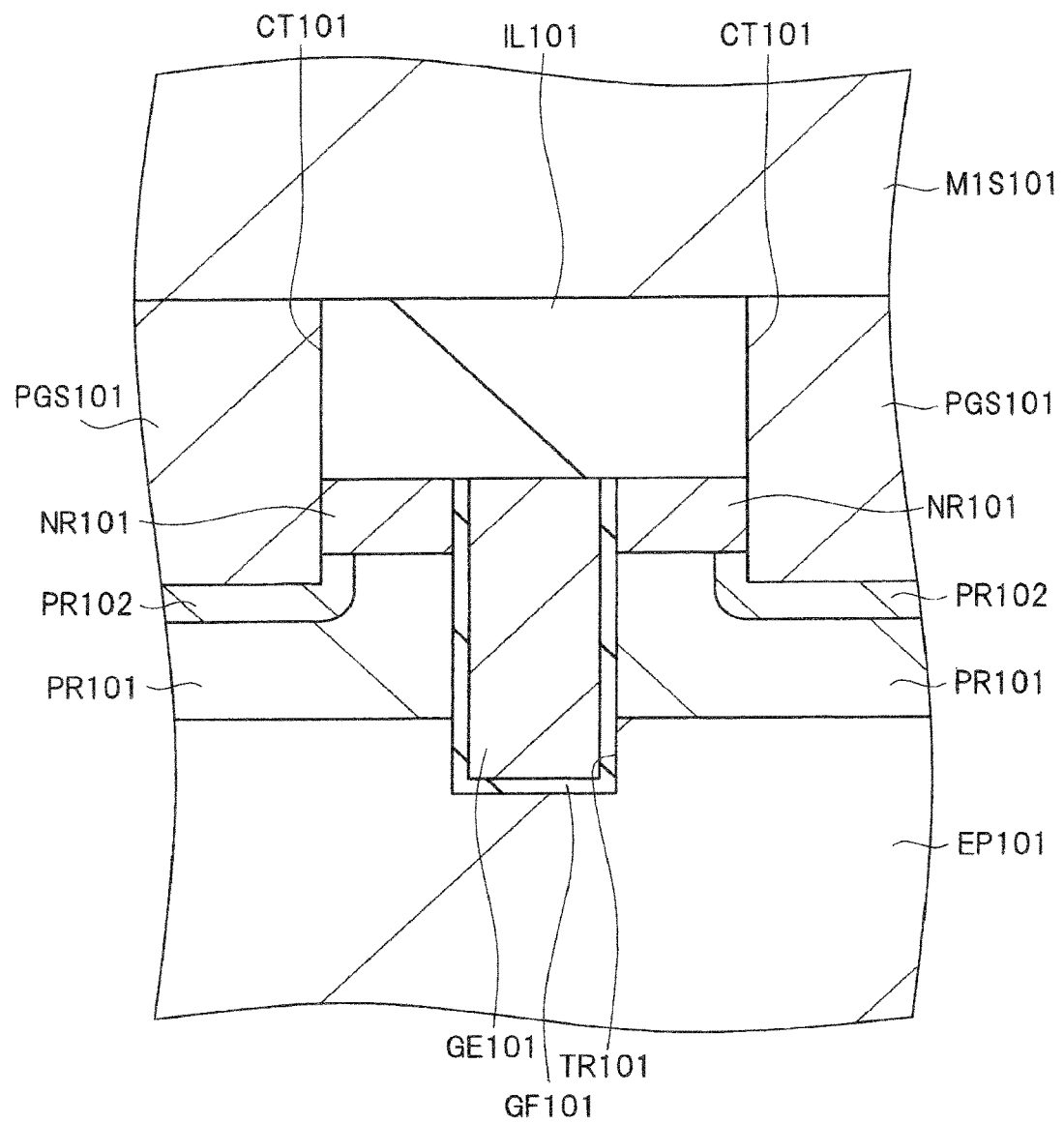
FIG. 22 is a fragmentary enlarged view of a semiconductor device as a comparative example.

FIG. 22 is a fragmentary enlarged sectional view of the semiconductor device examined by the present inventors as a comparative example, which corresponds to FIG. 3.

In the semiconductor device shown in FIG. 22 as a comparative example, a trench TR101 equivalent to the trench TR is made in an n-type semiconductor layer EP101 equivalent to the semiconductor layer EP and a gate electrode GE101 is buried in the trench TR101 through a gate insulating film GF101. In the semiconductor layer EP101 in an area adjacent to the trench TR101, an $n^+$-type semiconductor region NR101 for the source equivalent to the $n^+$-type semiconductor region NR and a p-type semiconductor region PR101 for channel formation, lying under the $n^+$-type semiconductor region NR101 and equivalent to the p-type semiconductor region PR1 are formed. An interlayer insulating film IL101 equivalent to the insulating film IL is formed so as to cover the gate electrode GE101 and a contact hole CT101 equivalent to the contact hole CT1 is made in the interlayer insulating film IL101, and a source plug PGS101 equivalent to the source plug PGS is buried in the contact hole CT101. A $p^+$-type semiconductor region PR102 equivalent to the $p^+$-type semiconductor region PR2 is formed in the p-type semiconductor region PR101 adjacently to the bottom of the source plug PGS101. A source wiring M1S101 equivalent to the source wiring M1S is formed over the interlayer insulating film IL101 in which the source plug PGS101 is buried.

Figure 23:
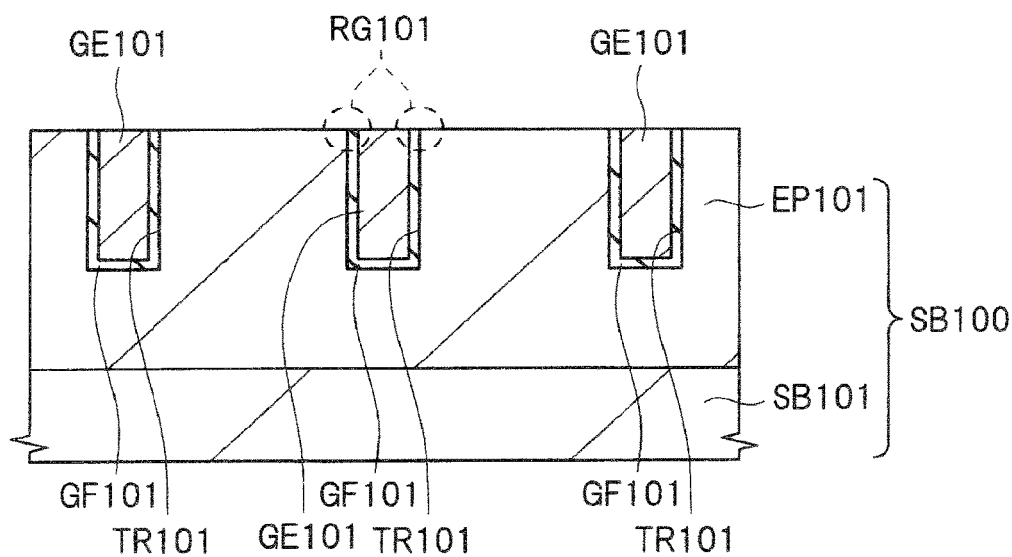
FIG. 23 is a sectional view of an essential part of the semiconductor device as the comparative example of FIG. 22 in a manufacturing step.

FIG. 23 is a sectional view of an essential part of the semiconductor device as the comparative example shown in FIG. 22 which is in a manufacturing step. FIG. 23 shows that after the trenches TR101 have been made in the semiconductor layer EP101 of the semiconductor substrate SB100, the gate electrodes GE101 have been buried in the trenches TR101 through the gate insulating films GF101. In FIG. 23, the semiconductor substrate SB100 is equivalent to the semiconductor substrate SB and the substrate body SB101 is equivalent to the substrate body SB1.

After the structure shown in FIG. 23 has been created, an ion implanting step to form an $n^+$-type semiconductor region NR101 for the source and an ion implanting step to form a p-type semiconductor region PR101 for channel formation are carried out on the semiconductor substrate SB100. In these ion implanting steps, ion implantation would damage the upper portions of the gate insulating film GF101 interposed between the gate electrode GE101 and the semiconductor layer EP101 (the gate insulating film GF101's portions inside the regions RG101 shown in FIG. 23), resulting in a decline in withstand voltage. This would decrease the withstand voltage between the gate electrode GE101 and the n⁺-type semiconductor region NR101 or p-type semiconductor region PR101 and lead to deterioration in the reliability of the semiconductor device. When the specified thickness of the gate insulating film GF101 is small, if the potential difference applied between the gate electrode GE101 and the n⁺-type semiconductor region NR101 or p-type semiconductor region PR101 is large, dielectric breakdown might occur in the gate insulating film GF101 interposed between the gate electrode GE101 and the semiconductor layer EP101.

Main Features and Effects

The semiconductor device according to this embodiment is a semiconductor device having a trench-gate field effect transistor formed in a semiconductor substrate SB, which includes a trench TR made in the semiconductor substrate SB, a gate electrode GE formed in the trench TR through a gate insulating film GF, and an insulating film (interlayer insulating film) IL formed over the main surface (upper surface) of the semiconductor substrate SB. The upper surface of the gate electrode GE is in a lower position than the upper surface of the semiconductor substrate SB in the area adjacent to the trench TR and a sidewall insulating film SW is formed over the gate electrode GE and over the sidewall (side face) of the trench TR, and the gate electrode GE and sidewall insulating film SW are covered by the insulating film (interlayer insulating film) IL.

The method for manufacturing the semiconductor device according to this embodiment includes the following steps: (a) providing a semiconductor substrate SB; (b) after the step (a), making a trench TR in the semiconductor substrate SB; (c) after the step (b), forming a gate electrode GE in the trench TR through a gate insulating film GF; and (d) after the step (c), forming an insulating film (interlayer insulating film) IL over the main surface (upper surface) of the semiconductor substrate SB. The upper surface of the gate electrode GE formed in the step (c) is in a lower position than the upper surface of the semiconductor substrate SB in the area adjacent to the trench TR. The method further includes the step (c1) of, after the step (c) and before the step (d), forming a sidewall insulating film SW over the gate electrode GE and over the sidewall (side face) of the trench TR. In the step (d), the gate electrode GE and sidewall insulating film SW are covered by the insulating film (interlayer insulating film) IL.

One of the main features of this embodiment is that the upper surface of the gate electrode GE formed (buried) in the trench TR through the gate insulating film GF is in a lower position than the upper surface of the semiconductor substrate SB (specifically, the upper surface of the semiconductor layer EP) in the area adjacent to the trench TR.

Another main feature of this embodiment is that the sidewall insulating film SW lies over the gate electrode GE and over the sidewall (side face) of the trench TR. The gate electrode GE and sidewall insulating film SW are covered by the insulating film (interlayer insulating film) IL.

After forming a conductive film CD for gate electrodes over the semiconductor substrate SB so as to fill the trenches TR, the conductive film CD outside the trenches TR is removed by etching back while the conductive film CD inside the trenches TR is made to remain, so that gate electrodes GE are created. In this process, if some part of the conductive film accidentally remains outside a trench TR, the remaining film part might cause a defect, so it is desirable to ensure that any part of the conductive film CD does not accidentally remain outside the trenches TR over the semiconductor substrate SB. In this connection, when the upper surface of the conductive film CD remaining in each trench TR (namely the gate electrode GE) is in a lower position than the upper surface of the semiconductor substrate SB (the upper surface of the semiconductor layer EP) in the area adjacent to the trench TR, the conductive film CD outside the trench TR is prevented from accidentally remaining over the semiconductor substrate SB during the etching-back step to remove the conductive film CD outside the trench TR.

However, if the gate insulating film GF interposed between the gate electrode GE and the semiconductor substrate SB (specifically, the semiconductor layer EP) is damaged by ion implantation, the withstand voltage of the gate insulating film GF would decline, whether or not the upper surface of the gate electrode GE is in a lower position than the upper surface of the semiconductor substrate SB (specifically, the upper surface of the semiconductor layer EP) in the area adjacent to the trench TR, as mentioned above referring to FIG. 23.

However, in this embodiment, the upper surface of the gate electrode GE formed (buried) in the trench TR through the gate insulating film GF is in a lower position than the upper surface of the semiconductor substrate SB (specifically, the upper surface of the semiconductor layer EP) in the area adjacent to the trench TR and the sidewall insulating film SW lies over the gate electrode GE and over the sidewall (side face) of the trench TR.

In this embodiment, the presence of the sidewall insulating film SW suppresses or prevents damage to the gate insulating film GF interposed between the gate electrode GE and the semiconductor substrate SB (specifically, the semiconductor layer EP) by ion implantation in the ion implanting step after formation of the sidewall insulating film SW. In other words, unlike this embodiment, if the sidewall insulating film SW is not formed, impurity ions would be implanted into the upper portion of the gate insulating film GF interposed between the gate electrode GE and the semiconductor substrate SB during the ion implanting step, thereby damaging the gate insulating film GF. In contrast, if the sidewall insulating film SW is formed as in this embodiment, the sidewall insulating film SW interrupts implantation of impurity ions and reduces the amount of impurity ions implanted into the gate insulating film GF during the ion implanting step, thereby preventing the gate insulating film GF from being damaged by ion implantation.

Therefore, this embodiment prevents decline in the withstand voltage of the gate insulating film GF interposed between the gate electrode GE and the semiconductor substrate SB due to damage attributable to ion implantation. In short, in the manufactured semiconductor device, the withstand voltage of the gate insulating film GF interposed between the gate electrode GE and the semiconductor substrate SB is increased. Thus, the reliability of the semiconductor device is enhanced. For example, even when the specified thickness of the gate insulating film GF is small, the withstand voltage of the gate insulating film GF interposed between the gate electrode GE and the semiconductor substrate SB is increased, which suppresses or prevents dielectric breakdown of the gate insulating film GF even if the potential difference applied between the gate electrode GE and the n⁺-type semiconductor region NR or p-type semiconductor region PR1 is large. This also reduces leak current which flows through the gate insulating film GF.

In this embodiment, the sidewall insulating film SW is formed before ion implantation to form the p-type semiconductor region PR1, which suppresses or prevents damage to the gate insulating film GF interposed between the gate electrode GE and the semiconductor substrate SB (specifically, the semiconductor layer EP) by ion implantation in the ion implanting step to form the p-type semiconductor region PR1. Furthermore, in this embodiment, the sidewall insulating film SW is formed before ion implantation to form the $n^+$-type semiconductor region NR, which suppresses or prevents damage to the gate insulating film GF interposed between the gate electrode GE and the semiconductor substrate SB (specifically, the semiconductor layer EP) by ion implantation in the ion implanting step to form the $n^+$-type semiconductor region NR. Since the dosage is particularly large in ion implantation to form the $n^+$-type semiconductor region NR for the source, if, unlike this embodiment, ion implantation to form the $n^+$-type semiconductor region NR is performed without the sidewall insulating film SW, damage to the gate insulating film GF interposed between the gate electrode GE and the semiconductor substrate SB would be very serious, probably leading to deterioration in reliability. In this embodiment, since the sidewall insulating film SW is formed before ion implantation to form the $n^+$-type semiconductor region NR for the source, the probability of deterioration in reliability is avoided.

Furthermore, in this embodiment, the presence of the sidewall insulating film SW suppresses or prevents etching of the gate insulating film GF interposed between the gate electrode GE and the semiconductor substrate SB (specifically, the semiconductor layer EP) in various steps after the formation of the sidewall insulating film SW, thereby enhancing the reliability of the semiconductor device.

If, unlike this embodiment, the sidewall insulating film SW is not formed, the upper portion of the gate insulating film GF interposed between the gate electrode GE and the semiconductor substrate SB might be damaged by etching in an etching step. If the gate insulating film GF interposed between the gate electrode GE and the semiconductor substrate SB is damaged by etching, the withstand voltage of the gate insulating film GF might decline. In contrast, when the sidewall insulating film SW is formed as in this embodiment, the gate insulating film GF interposed between the gate electrode GE and the semiconductor substrate SB is prevented from being damaged by etching in an etching step because the sidewall insulating film SW shields (protects) the film GF against etching.

Therefore, this embodiment prevents decline in the withstand voltage of the gate insulating film GF interposed between the gate electrode GE and the semiconductor substrate SB due to damage caused by etching. In other words, the withstand voltage of the gate insulating film GF interposed between the gate electrode GE and the semiconductor substrate SB is increased in the manufactured semiconductor device. Thus, the reliability of the semiconductor device is enhanced.

As mentioned above, in this embodiment, not only the upper surface of the gate electrode GE is in a lower position than the upper surface of the semiconductor substrate SB (specifically, the upper surface of the semiconductor layer EP) in the area adjacent to the trench TR but also the sidewall insulating film SW is formed over the gate electrode GE and over the sidewall (side face) of the trench TR, so that the gate insulating film GF is hardly damaged, thereby increasing the withstand voltage of the gate insulating film GF. In short, the sidewall insulating film SW has a function as a protective film for the gate insulating film GF interposed between the gate electrode GE and the semiconductor substrate SB (specifically, the semiconductor layer EP).

In addition, considering the function of the sidewall insulating film SW as a protective film, it is preferable that the thickness (height) T1 of the sidewall insulating film SW be 50 nm or more (T1≥50 nm). If so, the sidewall insulating film SW prevents damage to the gate insulating film GF interposed between the gate electrode GE and the semiconductor substrate SB (damage by ion implantation or etching) more effectively. The thickness T1 (height) of the sidewall insulating film SW, which is shown in FIG. 3, corresponds to the thickness in the height direction (thickness in the direction almost perpendicular to the main surface of the semiconductor substrate SB).

The thickness T1 of the sidewall insulating film SW is equal to, or smaller than, height difference H1 between the upper surface of the gate electrode GE formed (buried) in the trench TR through the gate insulating film GF and the upper surface of the semiconductor substrate SB (semiconductor layer EP) in the area adjacent to the trench TR (T1≤H1). Therefore, it is preferable that the height difference H1 between the upper surface of the gate electrode GE and the upper surface of the semiconductor substrate SB in the area adjacent to the trench TR be 50 nm or more (H1≥50 nm). The height difference H1 is shown in FIG. 3 and the upper surface of the gate electrode GE is in a lower position than the upper surface of the semiconductor substrate SB (semiconductor layer EP) in the area adjacent to the trench TR by the amount equivalent to the difference H1. The difference H1 is almost equal to the distance $L_1$ shown in FIG. 11. Therefore, it is preferable that the distance $L_1$ be 50 nm or more ($L_1$≥50 nm).

Also it is preferable that the upper surface of the gate electrode GE formed (buried) in the trench TR through the gate insulating film GF be lower than the upper surface of the $n^+$-type semiconductor region NR for the source and higher than the lower surface of the $n^+$-type semiconductor region NR (boundary between the $n^+$-type semiconductor region NR and the p-type semiconductor region PR1). If so, a channel (n-type inversion layer) is formed in the p-type semiconductor region PR1 along the side face of the trench TR between the $n^+$-type semiconductor region NR for the source and the n-type semiconductor region EPN for the drain, and through the channel, electric current is made to flow appropriately between the $n^+$-type semiconductor region NR for the source and the n-type semiconductor region EPN for the drain.

When the upper surface of the gate electrode GE is lower than the upper surface of the $n^+$-type semiconductor region NR for the source and higher than the lower surface of the $n^+$-type semiconductor region NR, the thickness T2 of the $n^+$-type semiconductor region NR is larger than the difference H1 (T2>H1) and larger than the thickness T1 of the sidewall insulating film SW (T2>T1). The thickness T2 of the $n^+$-type semiconductor region NR is shown in FIG. 3.

Figure 24:
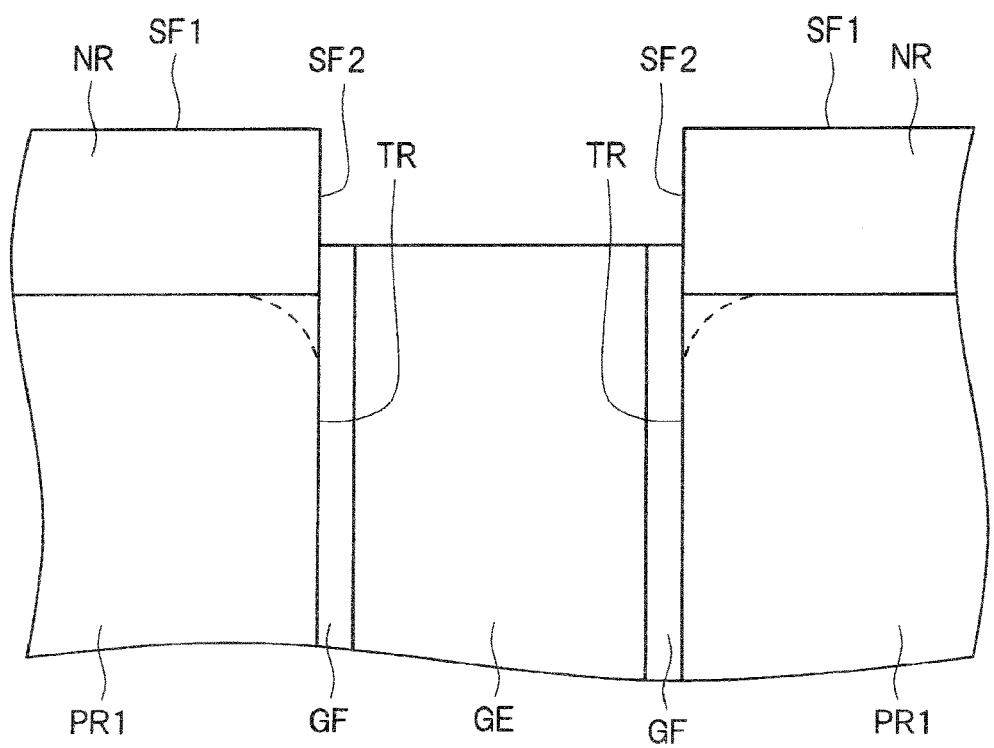
FIG. 24 is a sectional view of an essential part of the semiconductor device in a manufacturing step according to the first embodiment.

This embodiment brings about an advantageous effect that the $n^+$-type semiconductor region NR for the source is formed more appropriately due to the presence of the sidewall insulating film SW. The effect is described below referring to FIG. 24. FIG. 24 is a sectional view of the essential part of the semiconductor device under manufacture, showing the stage in which the $n^+$-type semiconductor region NR for the source has been formed by ion implantation. Although FIG. 24 is a sectional view, hatching is omitted.

When the upper surface of the gate electrode GE is in a lower position than the upper surface SF1 of the semiconductor layer EP in the area adjacent to the trench TR, if, unlike this embodiment, the sidewall insulating film SW is not formed, n-type impurity ions might be implanted through not only the upper surface SF1 of the semiconductor layer EP but also the side surface SF2 of the semiconductor layer EP as exposed from the sidewall of the trench TR in the step of implanting ions to form the n$^+$-type semiconductor region NR for the source. If n-type impurity ions to form a source are implanted through not only the upper surface SF1 of the semiconductor layer EP but also the side surface SF2 of the semiconductor layer EP as exposed from the sidewall of the trench TR, the impurity profile of the n$^|$-type semiconductor region NR for the source would be disturbed and the position of the lower surface of the n$^+$-type semiconductor region NR for the source would be as indicated by the dotted lines in FIG. 24. If so, the threshold voltage would drop or fluctuate and leak current might increase or on-resistance might increase. As a consequence, the reliability of the semiconductor device would deteriorate.

In contrast, if the sidewall insulating film SW is formed as in this embodiment when the upper surface of the gate electrode GE is in a lower position than the upper surface SF1 of the semiconductor layer EP, in the step of implanting ions to form the n$^+$-type semiconductor region NR for the source, impurity ions are implanted into the semiconductor layer EP through the upper surface SF1 of the semiconductor layer EP and implantation of impurity ions through the side surface SF2 of the semiconductor layer EP is interrupted by the sidewall insulating film SW. This prevents disturbance of the impurity profile of the n$^+$-type semiconductor region NR for the source which may be caused by impurity ions implanted through the side surface SF2 of the semiconductor layer EP. In this case, the position of the lower surface of the n$^+$-type semiconductor region NR for the source is as indicated by the solid lines in FIG. 24. Specifically, the lower surface of the n$^+$-type semiconductor region NR for the source is almost parallel to the upper surface of the semiconductor layer EP. The sidewall insulating film SW is not shown in FIG. 24. Therefore, this embodiment also brings about an advantageous effect that the n$^+$-type semiconductor region NR for the source can be formed more appropriately due to the presence of the sidewall insulating film SW. Thus, the reliability of the semiconductor device is further enhanced. For example, drop or fluctuation in threshold voltage, increase in leak current or increase in on-resistance does not occur and the reliability of the semiconductor device is enhanced.

In the above explanation of this embodiment, it is assumed that a trench-gate MISFET is formed in the semiconductor substrate SB. Alternatively, a trench-gate IGBT (Insulated Gate Bipolar Transistor) may be formed in the semiconductor substrate SB. In that case, the sectional structure is basically the same as shown in FIGS. 1 to 3 (or FIGS. 1, 2, and 4) except that a p-type semiconductor region (p-type collector region) is formed adjacently to the back electrode BE (specifically, a p-type semiconductor region (p-type collector region) is provided between the back electrode BE and the n-type semiconductor region EPN). In that case, the back electrode BE for the drain functions as aback electrode for a collector, the bonding pad PDS for the source functions as a bonding pad for an emitter, and the wiring M1S for the source functions as a wiring for an emitter.

Second Embodiment

The semiconductor device according to a second embodiment is different from the semiconductor device according to the first embodiment in that it further includes a diode device DD. The diode device DD is, for example, a gate protection diode which is coupled between the source wiring M1S and the gate electrode GE. If so, the diode device DD can function as a protection diode for prevention of electrostatic breakdown, which is located between the source and gate of a power transistor.

Next, the process of manufacturing the semiconductor device according to the second embodiment will be described referring to FIGS. 25 to 39.

FIGS. 25 to 39 are sectional views of an essential part of the semiconductor device under manufacture according to the second embodiment. Among FIGS. 25 to 39, FIGS. 26, 28, 30, and 32 are sectional views of a transistor cell formation region, which corresponds to the left half of FIG. 1. Among FIGS. 25 to 39, FIGS. 25, 27, 29, 31, and 33 to 39 are sectional views of a diode formation region. In the main surface of the semiconductor substrate SB, the planar area in which a diode device DD is formed (located) is hereinafter called the diode formation region.

Figure 25:
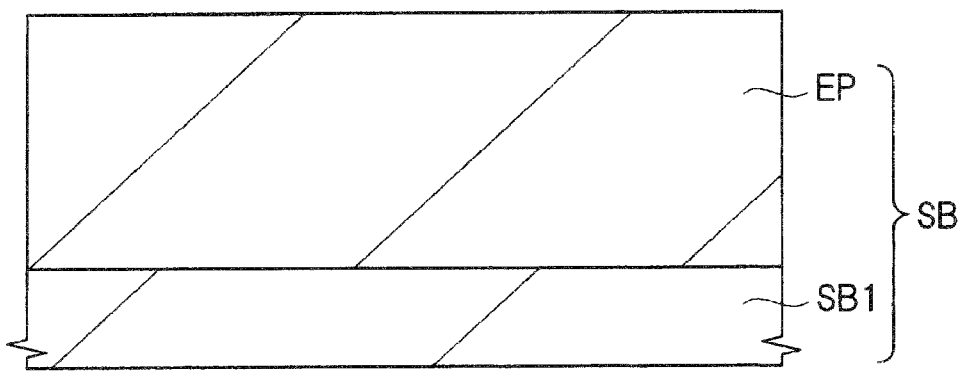
FIG. 25 is a sectional view of an essential part of a semiconductor device in a manufacturing step according to a second embodiment of the invention.

In the manufacturing process according to the second embodiment, the steps until and including the formation of the structure shown in FIG. 11 are the same as in the first embodiment and descriptions of the steps are omitted. FIG. 25 (diode formation region) shows the same step as FIG. 11. As shown in FIG. 25, trenches TR and gate electrodes GE buried in trenches TR through the gate insulating film GF are not formed in the diode formation region.

Next, in the second embodiment as well, an insulating film ZM is formed over the upper surface of the semiconductor substrate SB (upper surface of the semiconductor layer EP) so as to cover the gate electrodes GE as shown in FIG. 12 as in the first embodiment. The insulating film ZM is made of silicon oxide and may be formed by the CVD method or the like.

Figure 26:
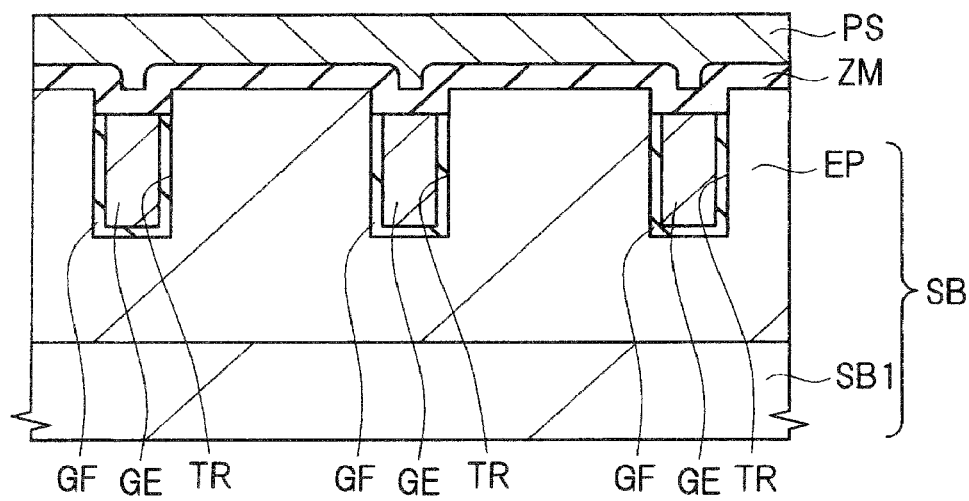
FIG. 26 is a sectional view of the essential part of the semiconductor device in a manufacturing step next to the step shown in FIGS. 11 and 25.
Figure 27:
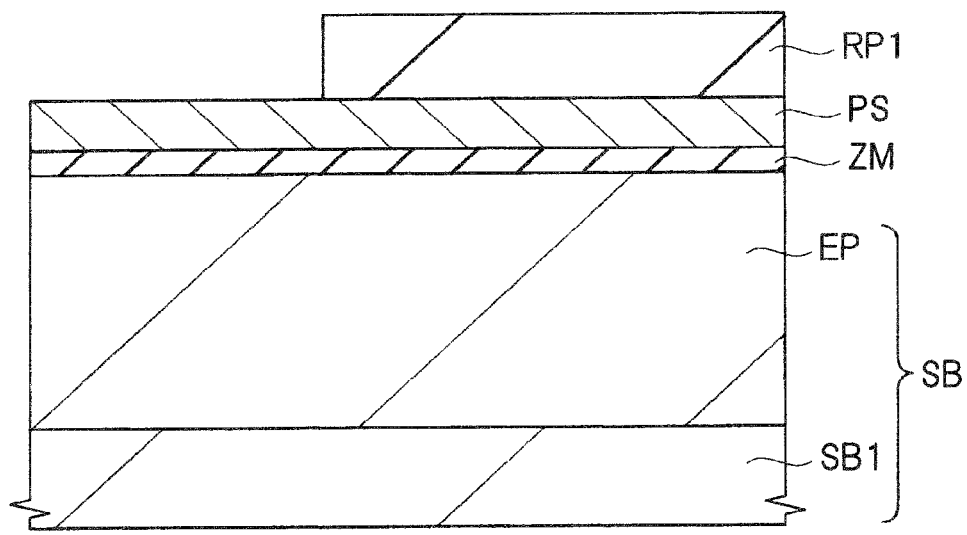
FIG. 27 is a sectional view of the essential part of the semiconductor device in the same manufacturing step as the step shown in FIG. 26.

Next, in the second embodiment, a silicon film PS is formed over the insulating film ZM as shown in FIG. 26 (transistor cell formation region) and FIG. 27 (diode formation region) unlike the first embodiment. The silicon film PS is a polycrystalline silicon film (polysilicon film).

Next, p-type impurity ions are implanted into the entire silicon film PS by the ion implantation method or the like. Consequently, the silicon film PS becomes a doped polysilicon film. Instead of this ion implanting step, the silicon film PS may be doped with p-type impurities during the formation of the silicon film PS.

Next, a photoresist pattern (resist pattern, mask layer) RP1 is formed over the silicon film PS by photolithography. The photoresist pattern RP1 is not formed in the transistor cell formation region (FIG. 26) but it is formed in the diode formation region (FIG. 27).

Figure 28:
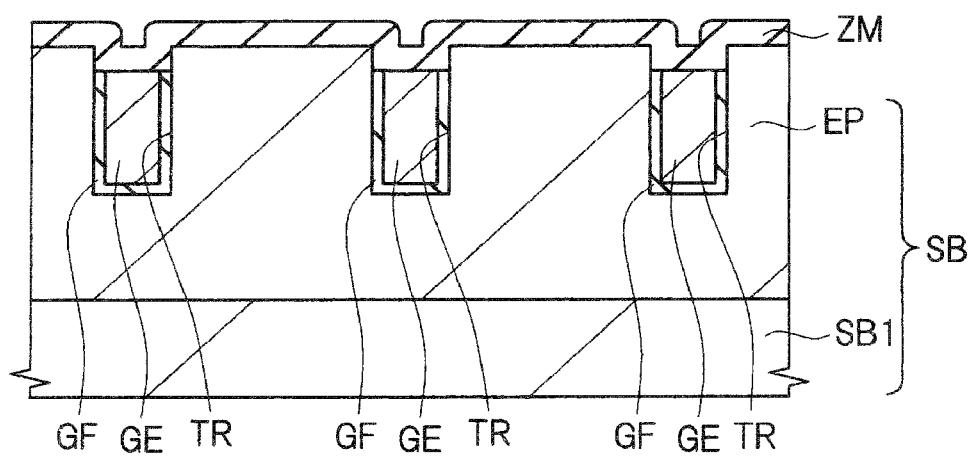
FIG. 28 is a sectional view of the essential part of the semiconductor device in a manufacturing step next to the step shown in FIGS. 26 and 27.
Figure 29:
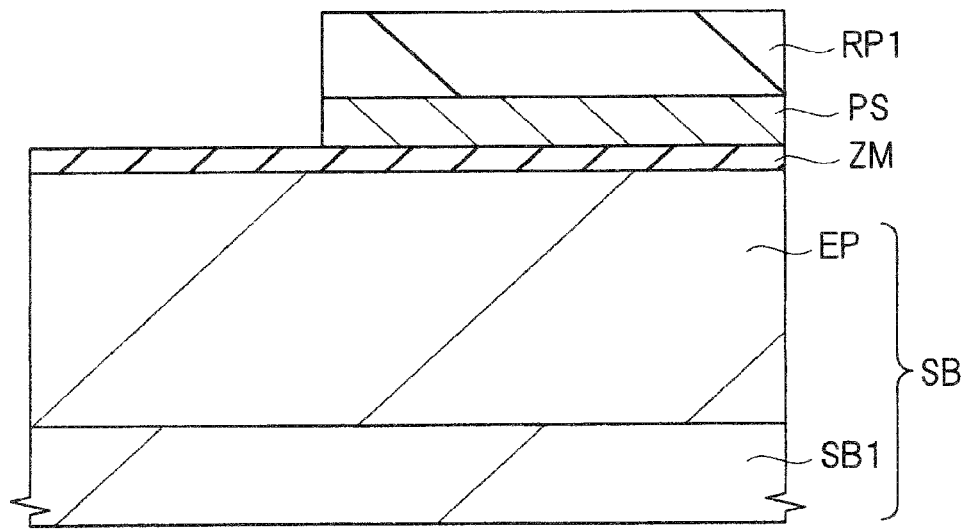
FIG. 29 is a sectional view of the essential part of the semiconductor device in the same manufacturing step as the step shown in FIG. 28.

Next, as shown in FIG. 28 (transistor cell formation region) and FIG. 29 (diode formation region), the silicon film PS is etched using the photoresist pattern RP1 as an etching mask. This etching step is carried out under a condition in which the insulating film ZM is harder to etch than the silicon film PS. In this step, the silicon film PS's portions not covered by the photoresist pattern RP1 are selectively removed by etching and the silicon film PS's portions under the photoresist pattern RP1 are made to remain intact. As a result, while the silicon film PS remains in the diode formation region (see FIG. 29), it is removed in the transistor cell formation region (see FIG. 28).

Figure 30:
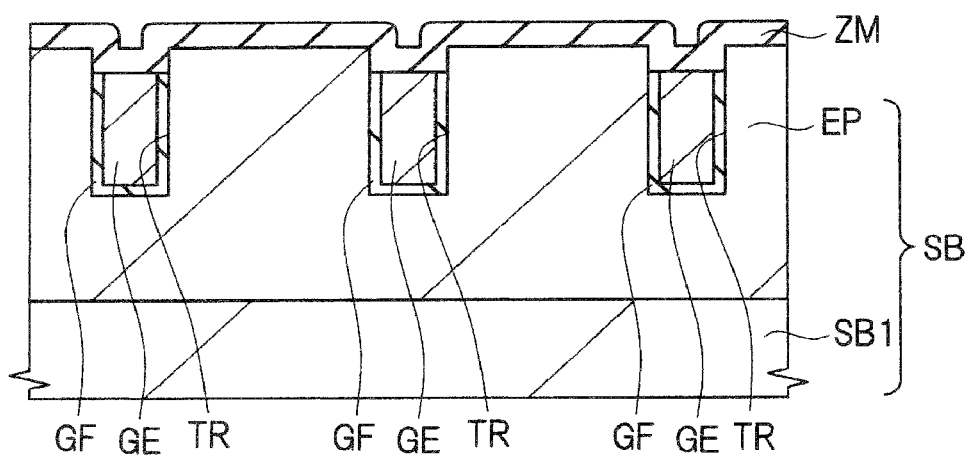
FIG. 30 is a sectional view of the essential part of the semiconductor device in a manufacturing step next to the step shown in FIGS. 28 and 29.
Figure 31:
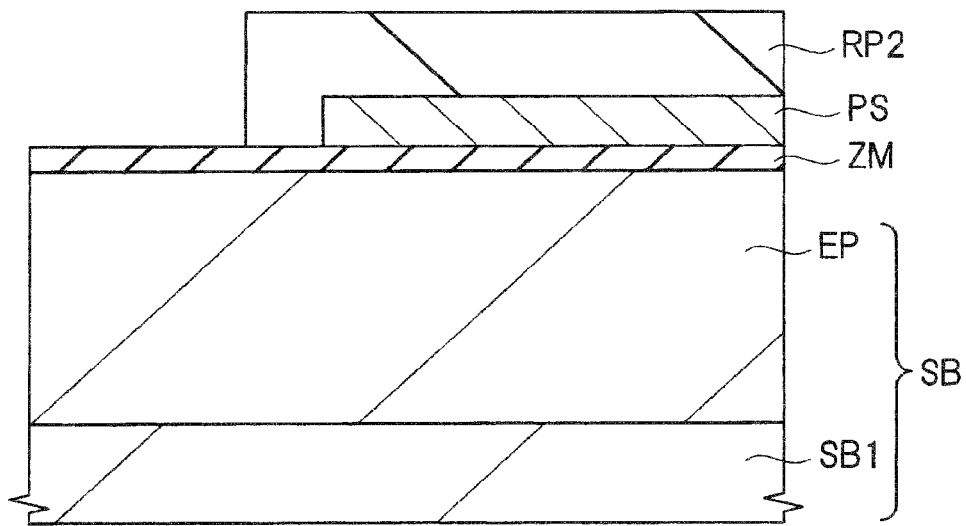
FIG. 31 is a sectional view of the essential part of the semiconductor device in the same manufacturing step as the step shown in FIG. 30.

Next, after the photoresist pattern RP1 is removed, as shown in FIG. 30 (transistor cell formation region) and FIG. 31 (diode formation region), a photoresist pattern (resist pattern, mask layer) RP2 is formed over the insulating film ZM by photolithography. The photoresist pattern RP2 is not formed in the transistor cell formation region (FIG. 30) but it is formed in the diode formation region (FIG. 31) and it contains the silicon film PS remaining in the diode formation region in plan view. Thus, the photoresist pattern RP2 is formed over the insulating film ZM so as to cover the silicon film PS remaining in the diode formation region. The insulating film ZM in the transistor cell formation region is not covered by the photoresist pattern RP2 but it is exposed.

Figure 32:
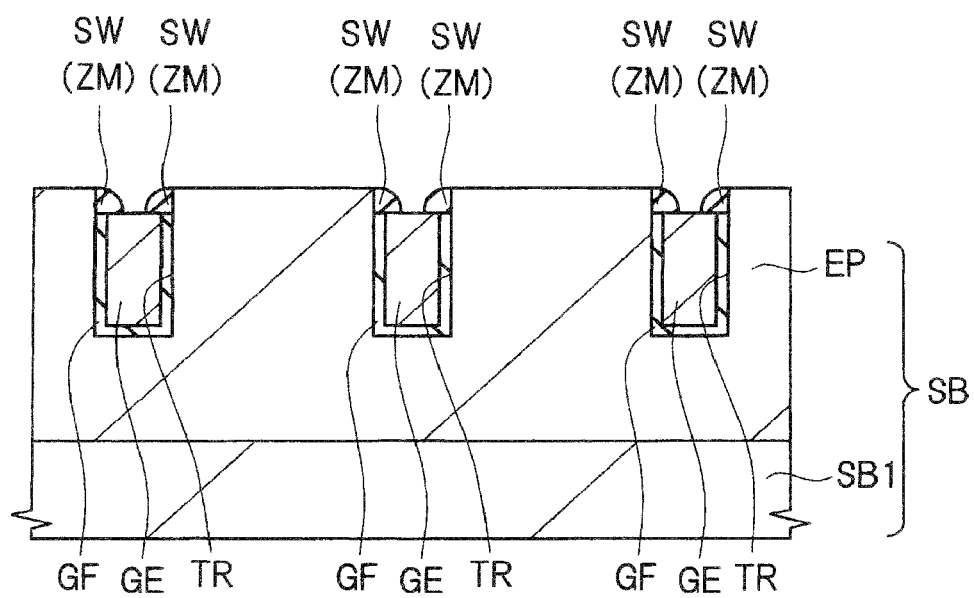
FIG. 32 is a sectional view of the essential part of the semiconductor device in a manufacturing step next to the step shown in FIGS. 30 and 31.
Figure 33:
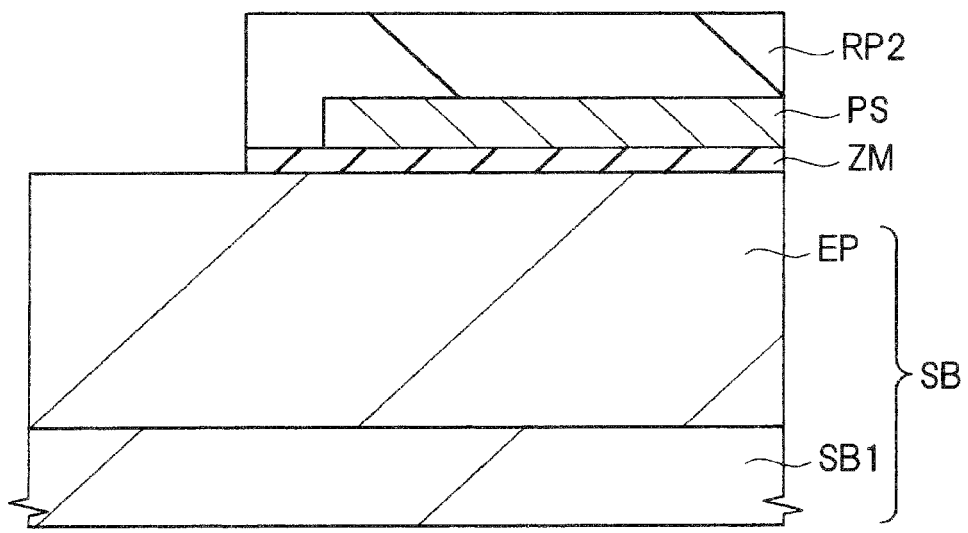
FIG. 33 is a sectional view of the essential part of the semiconductor device in the same manufacturing step as the step shown in FIG. 32.

Next, as shown in FIG. 32 (transistor cell formation region) and FIG. 33 (diode formation region), the insulating film ZM is etched back (etching, anisotropic etching) using the photoresist pattern RP2 as an etching mask.

In the step of etching back the insulating film ZM, which corresponds to the step of etching back the insulating film ZM in the first embodiment, the insulating film ZM is etched back without the photoresist pattern RP2 in the transistor cell formation region (FIG. 32). Therefore, there is no difference in the step of etching back the insulating film ZM in the transistor cell formation region between the first and second embodiments (FIGS. 13 and 32). Thus, in the second embodiment as well, a sidewall insulating film SW is formed over a higher portion of the sidewall of the trench TR than the upper surface of the gate electrode GE in the transistor cell formation region (FIG. 32) by the step of etching back the insulating film ZM, as in the first embodiment. The sidewall insulating film SW formed in the second embodiment is basically the same as in the first embodiment and description thereof is omitted here.

On the other hand, in the diode formation region (FIG. 33) in the second embodiment, the insulating film ZM is etched back with the photoresist pattern RP2 formed therein, so that the insulating film ZM's portion under the photoresist pattern RP2 remains intact and the insulating film ZM's portion not covered by the photoresist pattern RP2 is removed by etching back. After the step of etching back the insulating film ZM, the photoresist pattern RP2 is removed as shown in FIG. 34 (diode formation region).

Figure 34:
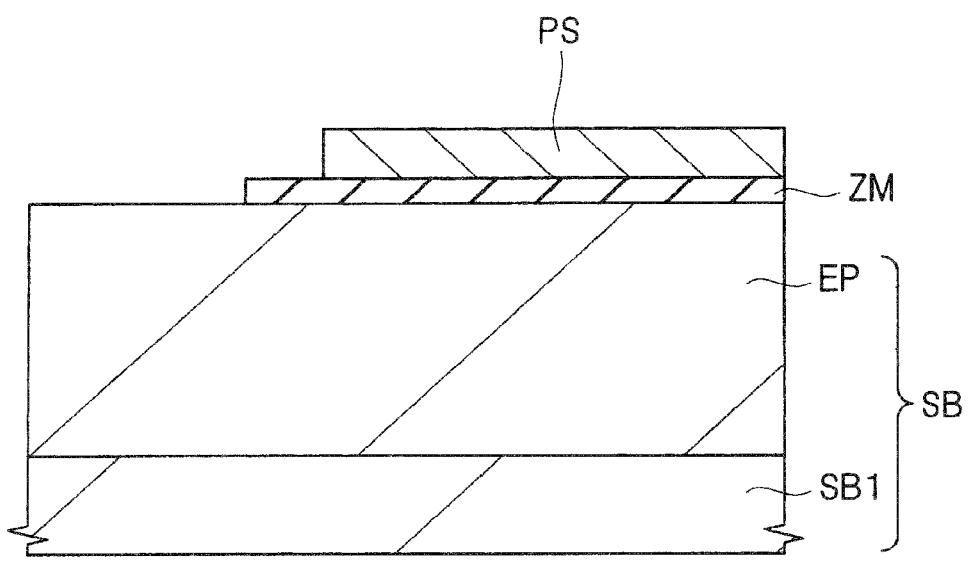
FIG. 34 is a sectional view of the essential part of the semiconductor device in a manufacturing step next to the step shown in FIG. 33.

Thus, a structure is created in which the sidewall insulating film SW is formed over the gate electrode GE and over the sidewall of the trench TR in the transistor cell formation region as shown in FIG. 13 and the silicon film PS is formed over the semiconductor substrate SB (semiconductor layer EP) through the insulating film ZM in the diode formation region as shown in FIG. 34. The silicon film PS is a silicon film for the diode device DD.

Figure 35:
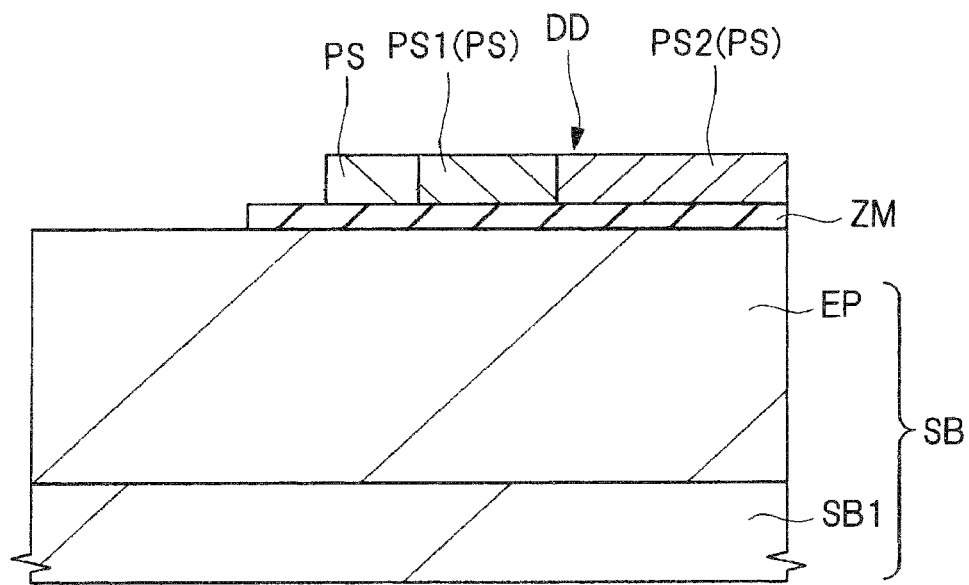
FIG. 35 is a sectional view of the essential part of the semiconductor device in a manufacturing step next to the step shown in FIG. 34.

Next, in the second embodiment as well, a p-type semiconductor region PR1 for channel formation and an $n^+$-type semiconductor region NR for the source are formed in the semiconductor layer EP by ion implantation in the transistor cell formation region as shown in FIG. 14 as in the first embodiment. The method for forming the p-type semiconductor region PR1 and $n^+$-type semiconductor region NR for the source in the second embodiment is basically the same as in the first embodiment. However, in the second embodiment, as shown in FIG. 35 (diode formation region), a p-type semiconductor region PS1 is formed in the silicon film PS in the diode formation region by the ion implanting step to form the p-type semiconductor region PR1 and an $n^+$-type semiconductor region PS2 is formed in the silicon film PS in the diode formation region by the ion implanting step to form the $n^+$-type semiconductor region NR. FIG. 35 shows the diode formation region in the same step as shown in FIG. 14.

In short, in the second embodiment, the p-type semiconductor region PR1 in the transistor cell formation region and the p-type semiconductor region PS1 in the diode formation region are formed by the same (common) ion implanting step. Furthermore, in the second embodiment, the $n^+$-type semiconductor region NR in the transistor cell formation region and the $n^+$-type semiconductor region PS2 in the diode formation region are formed by the same (common) ion implanting step.

The diode device DD is thus created by forming the p-type semiconductor region PS1 and $n^|$-type semiconductor region PS2 in the silicon film PS in the diode formation region. In other words, the PN junction diode is created by the PN junction of the p-type semiconductor region PS1 and $n^+$-type semiconductor region PS2. The p-type semiconductor region PS1 and $n^+$-type semiconductor region PS2 are constituent elements of the diode device DD.

Next, in the second embodiment as well, activation annealing is done as in the first embodiment.

Figure 36:
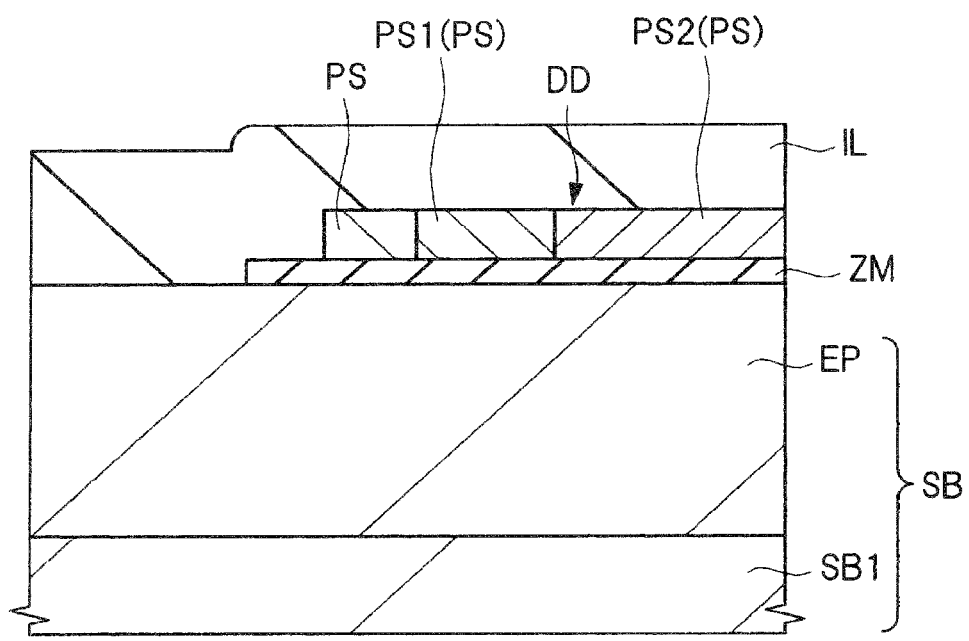
FIG. 36 is a sectional view of the essential part of the semiconductor device in a manufacturing step next to the step shown in FIG. 35.

Next, in the second embodiment as well, as shown in FIG. 15 and FIG. 36 (diode formation region), an insulating film IL as an interlayer insulating film is formed over the main surface (upper surface) of the semiconductor substrate SB so as to cover the gate electrodes GE, gate lead wirings GE1, and sidewall insulating films SW as in the first embodiment. In the diode formation region (FIG. 35), the insulating film IL is formed over the main surface (upper surface) of the semiconductor substrate SB so as to cover the insulating film ZM and silicon film PS.

Figure 37:
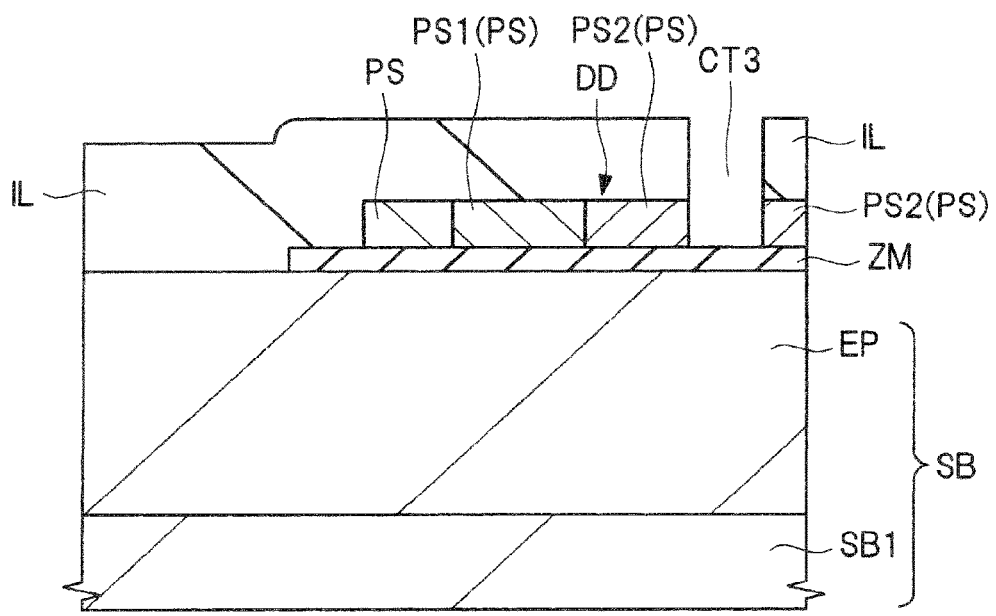
FIG. 37 is a sectional view of the essential part of the semiconductor device in a manufacturing step next to the step shown in FIG. 36.

Next, in the second embodiment as well, contact holes CT1 are made in the transistor cell formation region as shown in FIG. 16 as in the first embodiment and at the same time, contact holes CT3 are made in the diode formation region as shown in FIG. 37. A contact hole CT3 penetrates the insulating film IL and partially exposes the silicon film PS.

The contact hole CT3, which penetrates the insulating film IL, can further penetrate the silicon film PS, but even in that case, the contact hole CT3 does not penetrate the insulating film ZM and the insulating film ZM remains intact at the bottom of the contact hole CT3. In short, the contact hole CT3 does not reach the semiconductor layer EP. This means that the insulating film ZM functions as an etching stopper when the contact hole CT3 is made by etching.

In the second embodiment as well, a $p^+$-type semiconductor region PR2 is formed in the transistor cell formation region by ion implantation as shown in FIG. 17 as in the first embodiment.

Next, in the second embodiment as well, contact holes CT2 are made as in the first embodiment. Alternatively, contact holes CT2 may be made in the same step in which contact holes CT1 and CT3 are made.

Figure 38:
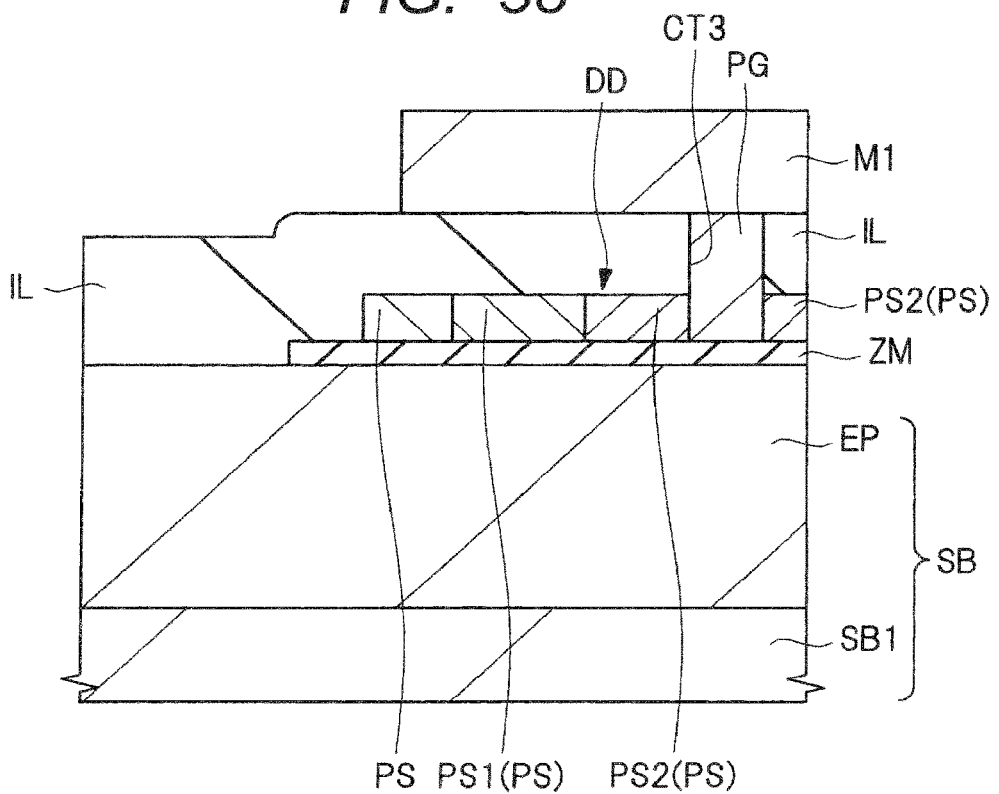
FIG. 38 is a sectional view of the essential part of the semiconductor device in a manufacturing step next to the step shown in FIG. 37.

Next, in the second embodiment as well, conductive plugs PG of tungsten (W), etc. are formed as conductors (conductors for coupling) in the contact holes CT1, CT2, and CT3 as shown in FIG. 19 and FIG. 38 (diode formation region) as in the first embodiment. The method for forming plugs PG in the second embodiment is basically the same as in the first embodiment.

Next, in the second embodiment as well, wirings M1 are formed as shown in FIG. 19 and FIG. 38 (diode formation region) as in the first embodiment. The wirings M1 are formed by making a conductive film (for example, an aluminum film or aluminum alloy-based metal film) over the main surface of the semiconductor substrate SB, specifically over the insulating film IL with the plugs PG buried therein, by sputtering or the like, and then patterning the conductive film by photolithography and etching.

In the second embodiment as well, the wirings M1 include the source wiring M1S and gate wiring M1G as in the first embodiment. In the second embodiment, the wirings M1 may further include a wiring electrically coupled to the n⁺-type semiconductor region PS2 of the silicon film PS through a plug PG or a wiring electrically coupled to the p-type semiconductor region PS1 of the silicon film PS through a plug PG.

Figure 39:
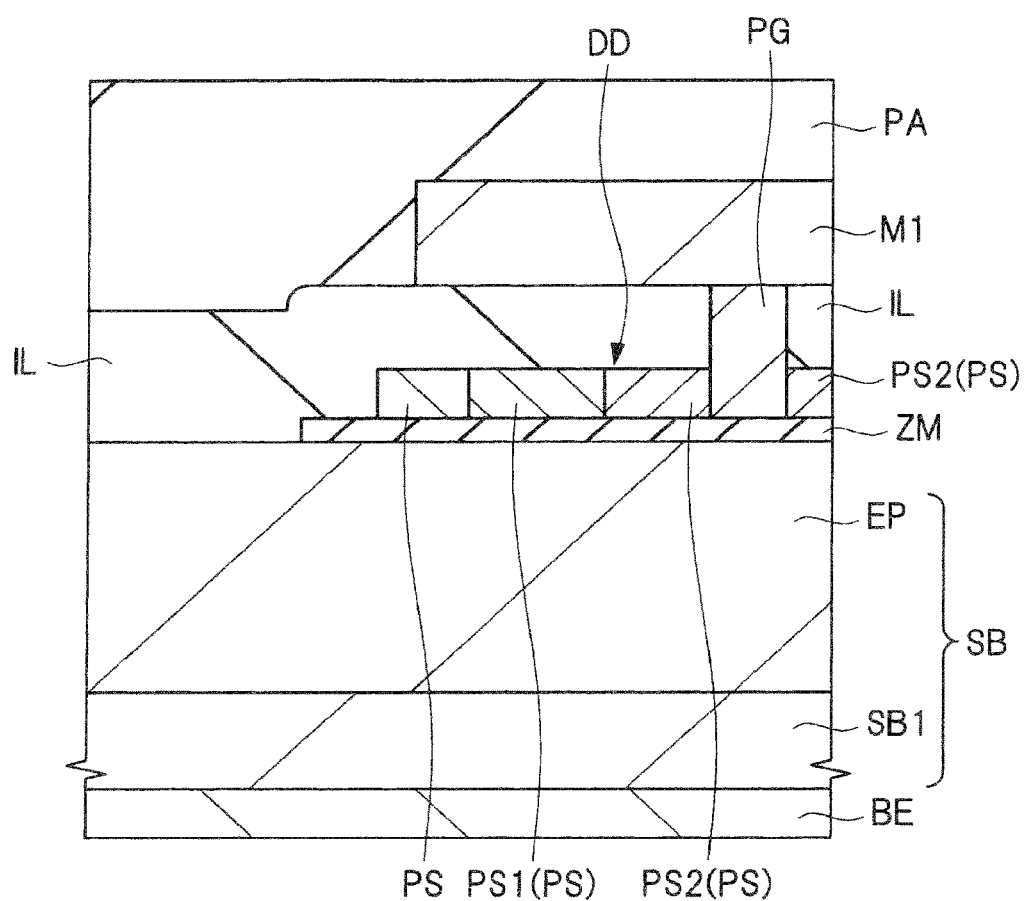
FIG. 39 is a sectional view of the essential part of the semiconductor device in a manufacturing step next to the step shown in FIG. 38.

Next, in the second embodiment as well, as shown in FIG. 21 and FIG. 39 (diode formation region), an insulating film PA is formed over the main surface of the semiconductor substrate SB, specifically over the insulating film IL, so as to cover the wirings M1 and then openings OP are made in the insulating film PA as in the first embodiment.

Next, in the second embodiment as well, as shown in FIG. 21 and FIG. 39 (diode formation region), the thickness of the semiconductor substrate SB is decreased as necessary by grinding or polishing the back of the semiconductor substrate SB and then a back electrode (drain electrode) BE is formed all over the back of the semiconductor substrate SB (back of the substrate body SB1), as in the first embodiment.

The semiconductor device according to the second embodiment is manufactured as mentioned above. After that, the semiconductor substrate SB is divided (separated, cut) into individual semiconductor chips (semiconductor devices) by dicing or a similar method.

In the semiconductor device according to the second embodiment, the structure of the transistor cell formation region is basically the same as in the first embodiment, but the diode device DD is created over the semiconductor substrate SB through the insulating film ZM as shown in FIG. 39. The insulating film ZM, interposed between the semiconductor substrate SB and the diode device DD, has a function to isolate the semiconductor substrate SB and the diode device DD from each other electrically. In the second embodiment, the sidewall insulating film SW is formed from the insulating film in the same layer as the insulating film ZM (insulating film ZM interposed between the semiconductor substrate SB and the diode device DD).

The second embodiment also brings about almost the same advantageous effect due to the presence of the sidewall insulating film SW as the first embodiment.

Furthermore, in the second embodiment, the insulating film ZM used to isolate the semiconductor substrate SB and the diode device DD is used to form the sidewall insulating film SW. For this reason, there is no need to form a new insulating film for the sidewall insulating film SW, so an increase in the number of manufacturing steps for the semiconductor device can be avoided. In other words, the sidewall insulating film SW can be formed without an increase in the number of manufacturing steps for the semiconductor device. Therefore, this embodiment is advantageous in reducing the cost of manufacturing the semiconductor device.

If, unlike the second embodiment, the sidewall insulating film SW is not formed in the step of etching back the insulating film ZM, the upper portion of the gate insulating film GF interposed between the gate electrode GE and the semiconductor substrate SB might be damaged by etching in the step of etching back the insulating film ZM. In contrast, in the second embodiment, the sidewall insulating film SW is formed in the step of etching back the insulating film ZM, which prevents the gate insulating film GF interposed between the gate electrode GE and the semiconductor substrate SB from being damaged by etching in the step of etching back the insulating film ZM. Thus, the reliability of the semiconductor device is enhanced.

The second embodiment may be applied to the third and fourth embodiments which will be described below.

Third Embodiment

Figure 40:
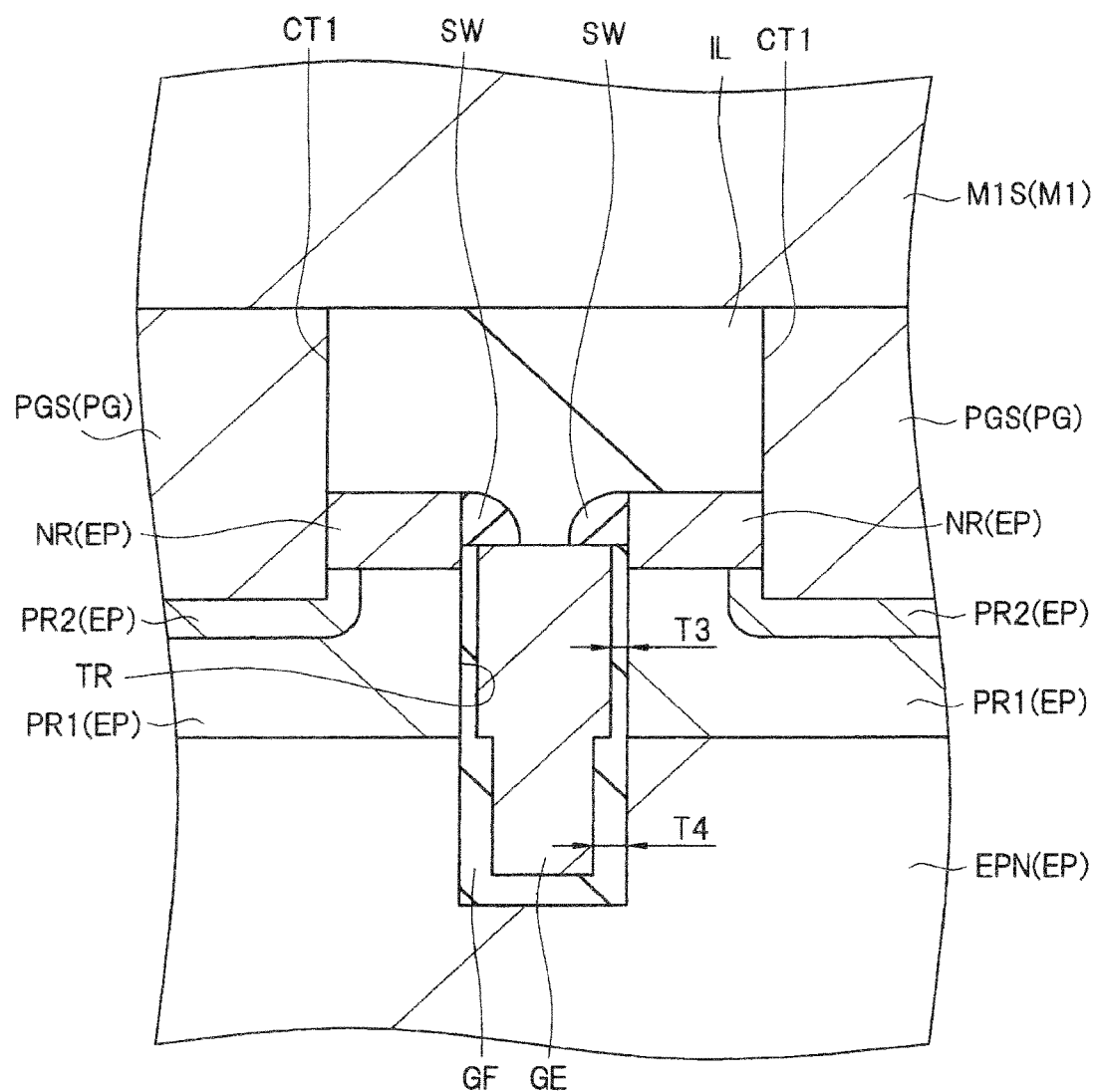
FIG. 40 is a sectional view of an essential part of a semiconductor device according to a third embodiment of the invention.

FIG. 40 is a sectional view of an essential part of the semiconductor device according to a third embodiment, which corresponds to FIG. 3 for the first embodiment.

The semiconductor device according to the third embodiment is different from the semiconductor device according to the first embodiment in that the thickness of the gate insulating film GF interposed between the gate electrode GE and the inner faces (sidewall and bottom) of the trench TR is not uniform but thickness T3 of the gate insulating film GF in the upper portion of the trench TR is smaller than thickness T4 of the gate insulating film GF in the lower portion of the trench TR (T3<T4).

More specifically, in the third embodiment, as shown in FIG. 40, the thickness (thickness T3) of the gate insulating film GF interposed between the n⁺-type semiconductor region NR and p-type semiconductor region PR1 and the gate electrode GE is smaller than the thickness (thickness T4) of the gate insulating film GF interposed between the n-type semiconductor region EPN and the gate electrode GE.

The other elements of the semiconductor device according to the third embodiment are basically the same as those of the semiconductor device according to the first embodiment and descriptions thereof are omitted here.

The third embodiment brings about the following advantageous effects in addition to the effects brought about by the first embodiment.

In the third embodiment, the thickness (thickness T4) of the gate insulating film GF interposed between the n-type semiconductor region EPN and the gate electrode GE is increased so that the withstand voltage between the gate (gate electrode GE) and drain (n-type semiconductor region EPN) is increased.

However, if the thickness (thickness T3) of the gate insulating film GF interposed between the p-type semiconductor region PR1 and the gate electrode GE is increased similarly to the thickness (thickness T4) of the gate insulating film GF interposed between the n-type semiconductor region EPN and the gate electrode GE, it would be difficult to form a channel (inversion layer) in the p-type semiconductor layer PR1.

On the other hand, in the third embodiment, the thickness is smaller than the thickness T4 (T3<T4), so that the thickness T4 can be increased while the thickness T3 is kept small. This means that the thickness of the gate insulating film GF interposed between the p-type semiconductor region PR1 and the gate electrode GE (thickness T3) can be small enough to make a channel in the p-type semiconductor region PR1 appropriately and at the same time, the thickness of the gate insulating film GF interposed between the n-type semiconductor region EPN and the gate electrode GE (thickness T4) can be increased to increase the withstand voltage between the gate and drain. Thus, the reliability of the semiconductor device is further enhanced.

If the thickness T3 of the gate insulating film GF in the upper portion of the trench TR is decreased, the withstand voltage is reduced and if the thin portion of the gate insulating film GF is damaged by ion implantation or etching, the withstand voltage of the thin portion of the gate insulating film GF would be further reduced.

However, in the third embodiment, since the sidewall insulating film SW is formed as in the first embodiment, even when the thickness T3 of the gate insulating film GF in the upper portion of the trench TR is decreased, the sidewall insulating film SW protects the thin portion of the gate insulating film GF and prevents the gate insulating film GF from being damaged by ion implantation or etching. Therefore, even though the thickness T3 of the gate insulating film GF in the upper portion of the trench TR is decreased, the withstand voltage of the thin portion of the gate insulating film GF is not reduced. Thus, the reliability of the semiconductor device is further enhanced.

FIGS. 41 to 49 are sectional views of an essential part of the semiconductor device under manufacture according to the third embodiment. FIGS. 41 to 49 show cross sections of a transistor cell formation region which corresponds to the left half of FIG. 1.

In the third embodiment as well, the structure shown in FIG. 6 is created in the same way as in the first embodiment.

Figure 41:
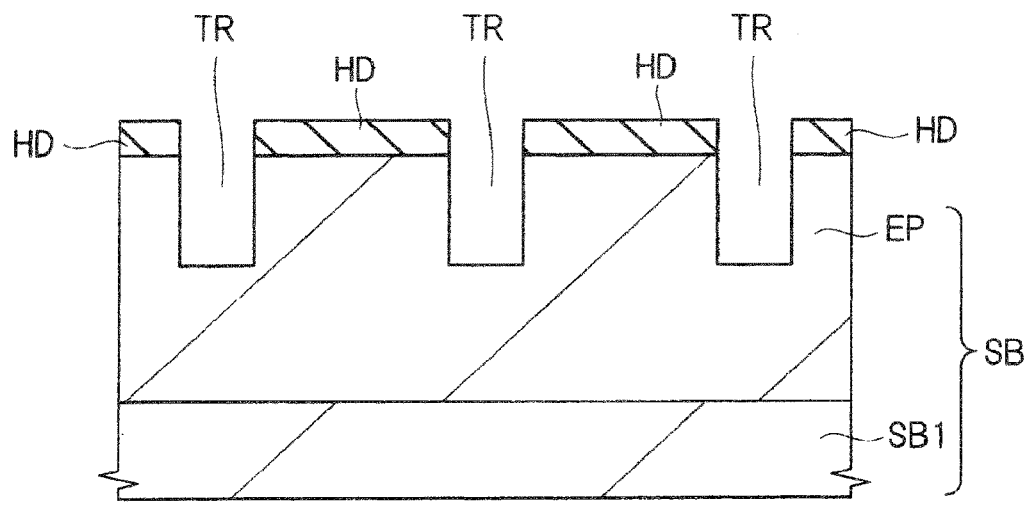
FIG. 41 is a sectional view of an essential part of the semiconductor device in a manufacturing step according to the third embodiment.

Next, in the third embodiment as well, trenches TR are made in the semiconductor layer EP as shown in FIG. 41 by etching (for example, dry etching) the semiconductor layer EP using the insulating film HD of silicon nitride, etc. as an etching mask (hard mask) as in the first embodiment. However, the depth of the trenches TR shown in FIG. 41 is smaller than the depth of the trenches TR shown in FIG. 7 and the position of the bottom of each trench TR shown in FIG. 41 almost coincides with the position of the lower surface (bottom) of a p-type semiconductor region PR1 which will be formed later.

Figure 42:
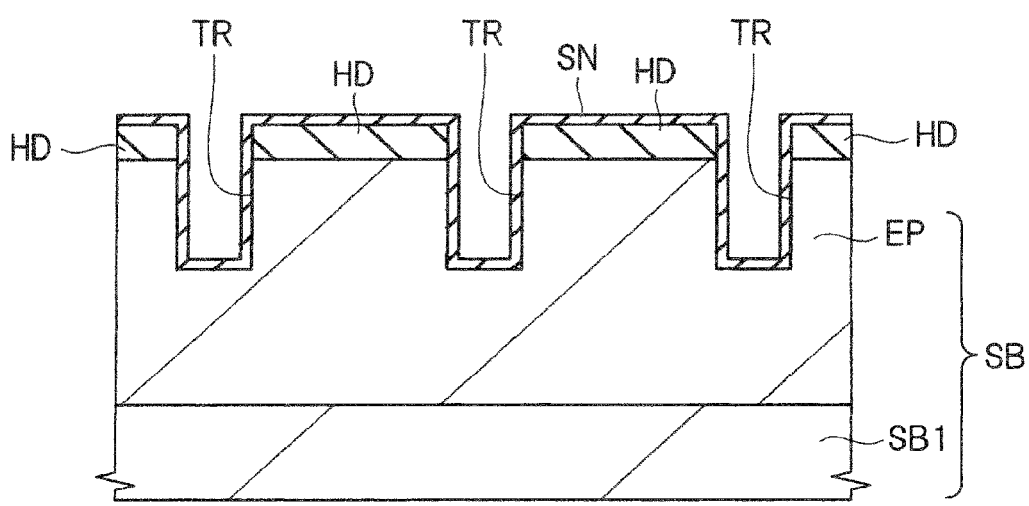
FIG. 42 is a sectional view of the essential part of the semiconductor device in a manufacturing step next to the step shown in FIG. 41.

Next, as shown in FIG. 42, an insulating film SN of silicon nitride, etc. is formed over the insulating film HD including the bottoms and sidewalls of the trenches TR by the CVD method or the like. The insulating film SN should be relatively thin so that it does not fill the trenches TR.

Figure 43:
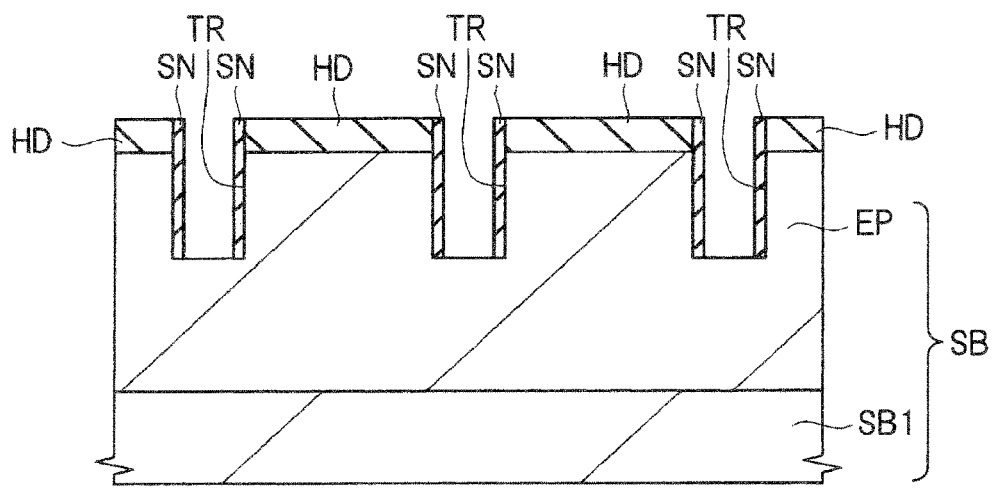
FIG. 43 is a sectional view of the essential part of the semiconductor device in a manufacturing step next to the step shown in FIG. 42.

Next, as shown in FIG. 43, the insulating film SN at the bottoms of the trenches TR and the insulating film SN over the insulating film HD are removed by anisotropic etching. Because of anisotropic etching, the insulating film SN remains unremoved over the sidewalls of the trenches TR as shown in FIG. 43. The semiconductor layer EP is exposed at the bottom of each trench TR. The upper surface of the semiconductor layer EP other than in the trenches TR is not exposed because it is covered by the insulating film HD.

Figure 44:
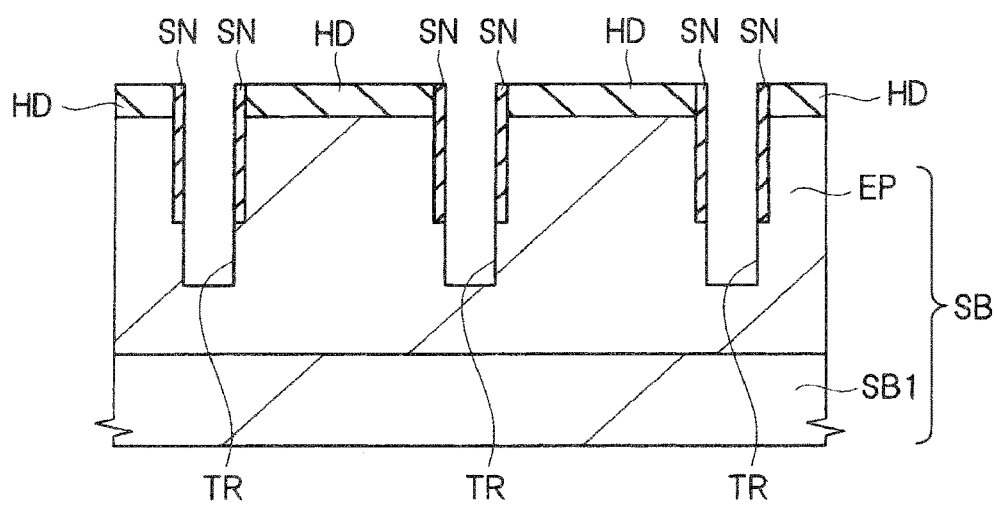
FIG. 44 is a sectional view of the essential part of the semiconductor device in a manufacturing step next to the step shown in FIG. 43.

Next, as shown in FIG. 44, the depth of the trenches TR is increased by etching (for example, dry etching) the semiconductor layer EP exposed at the bottoms of the trenches TR using the insulating film HD as an etching mask (hard mask). In each of the trenches TR thus deepened by etching, the semiconductor layer EP is exposed on the sidewall in the lower portion of the trench TR and at the bottom of the trench TR and the sidewall of the upper portion of the trench TR is covered by the insulating film SN.

Figure 45:
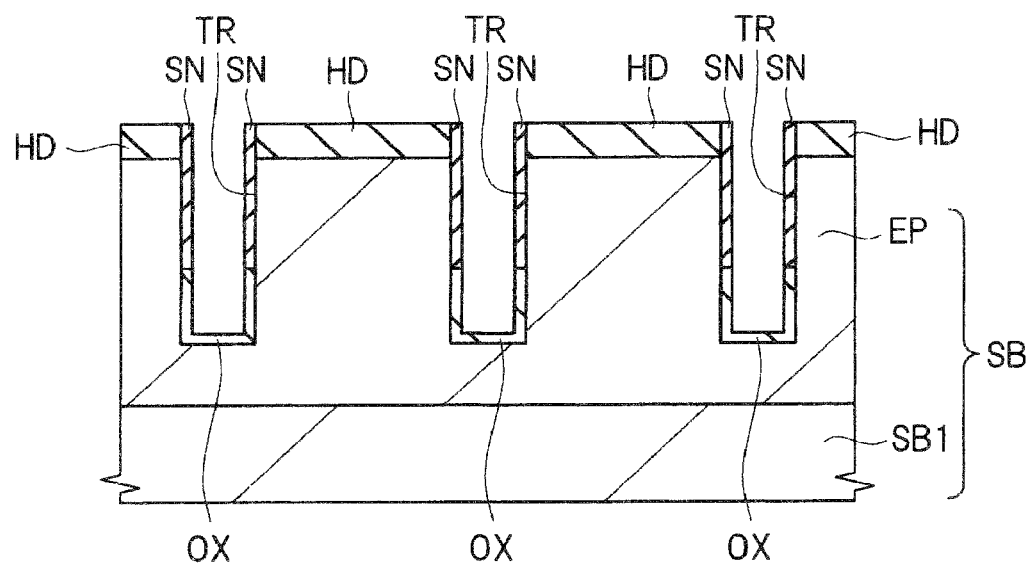
FIG. 45 is a sectional view of the essential part of the semiconductor device in a manufacturing step next to the step shown in FIG. 44.

Next, as shown in FIG. 45, an oxide film (silicon oxide film) OX is formed by oxidizing (for example, thermally oxidizing) the exposed surfaces of the semiconductor layer EP on the sidewall in the lower portion of the trench TR and the bottom of the trench TR. The oxide film OX is formed over the inner faces (sidewall and bottom) of the trench TR which are not covered by the insulating film SN. Thus, the oxide film OX lies over the bottom of the trench TR and the sidewall in the lower portion of the trench TR.

Figure 46:
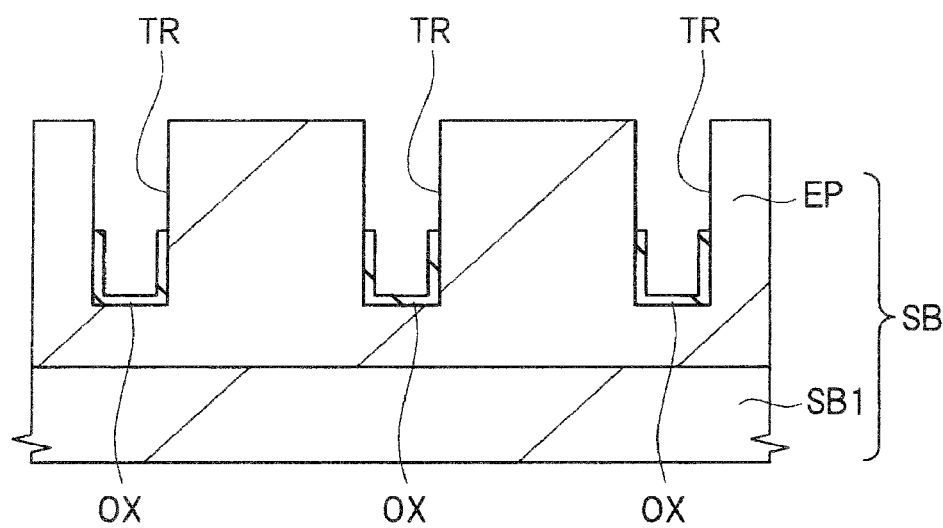
FIG. 46 is a sectional view of the essential part of the semiconductor device in a manufacturing step next to the step shown in FIG. 45.

Next, as shown in FIG. 46, the insulating film HD and insulating film SN are removed by etching. Consequently, the upper surface of the semiconductor layer EP is exposed and the semiconductor layer EP on the upper portion of the sidewall of the trench TR is exposed. The semiconductor layer EP on the sidewall in the lower portion of the trench TR and on the bottom of the trench TR is not exposed because the oxide film OX exists there. It is preferable that the etching step to remove the insulating film HD and insulating film SN be carried out under an etching condition in which the semiconductor layer EP and oxide film OX are harder to etch than the insulating film HD and insulating film SN. The insulating film HD and insulating film SN are thus selectively removed. When the same insulating material (for example, silicon nitride) is used for the insulating film HD and insulating film SN, it is easier to carry out the step of removing the insulating film HD and insulating film SN.

Figure 47:
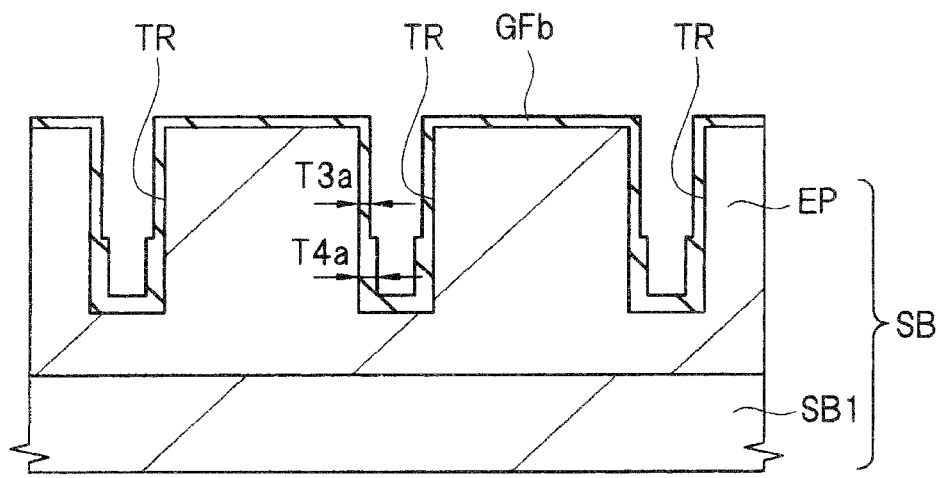
FIG. 47 is a sectional view of the essential part of the semiconductor device in a manufacturing step next to the step shown in FIG. 46.

Next, as shown in FIG. 47, an insulating film GFb as an oxide film (silicon oxide film) is formed over the inner faces (sidewall and bottom) of each trench TR and the upper surface of the semiconductor layer EP by oxidation (for example, thermal oxidation).

As a result of this oxidation process, the upper surface of the semiconductor layer EP and the exposed surface of the semiconductor layer EP on the upper portion of the sidewall of the trench TR (portion not covered by the oxide film OX) are oxidized to form the insulating film GFb, and the thickness of the oxide film OX on the bottom of the trench TR and the lower portion of the sidewall of the trench TR is increased so that the thickened oxide film OX becomes part of the insulating film GFb. Thus, the insulating film GFb lies over the upper surface of the semiconductor layer EP and over the sidewall and bottom of the trench TR. Here, thickness T4a of the insulating film GFb on the bottom and lower sidewall portion of the trench TR is larger than thickness T3a of the insulating film GFb on the upper sidewall portion of the trench TR (T4a>T3a). In other words, the thickness T4a of the insulating film GFb in the lower portion of the trench TR is larger than the thickness T3a of the insulating film GFb in the upper portion of the trench TR (T4a>T3a). The thickness T4a of the insulating film. GFb in the lower portion of the trench TR corresponds to the thickness T4 of the gate insulating film GF in the lower portion of the trench TR and the thickness T3a of the insulating film GFb in the upper portion of the trench TR corresponds to the thickness T3 of the gate insulating film GF in the upper portion of the trench TR.

Figure 48:
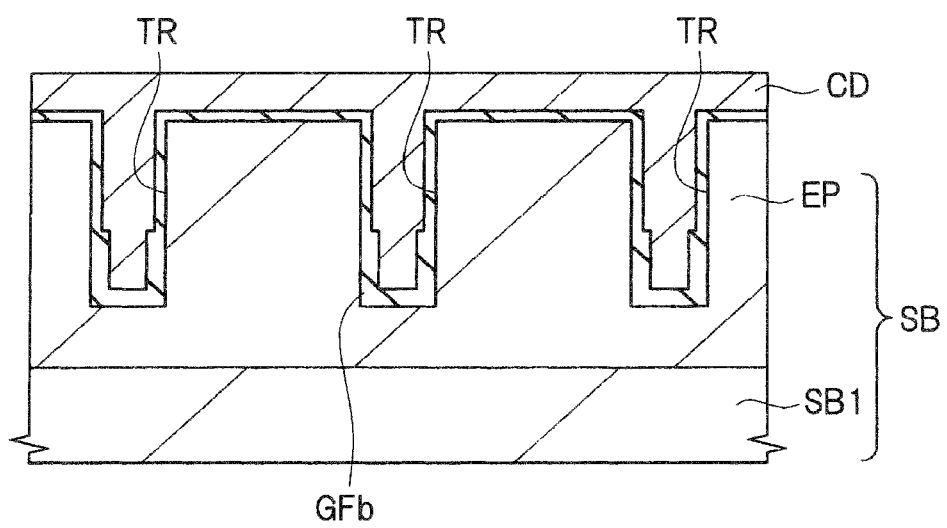
FIG. 48 is a sectional view of the essential part of the semiconductor device in a manufacturing step next to the step shown in FIG. 47.

Next, as shown in FIG. 48, a conductive film CD is formed over the main surface of the semiconductor substrate SB, specifically over the insulating film GFb, so as to fill the trenches TR.

Figure 49:
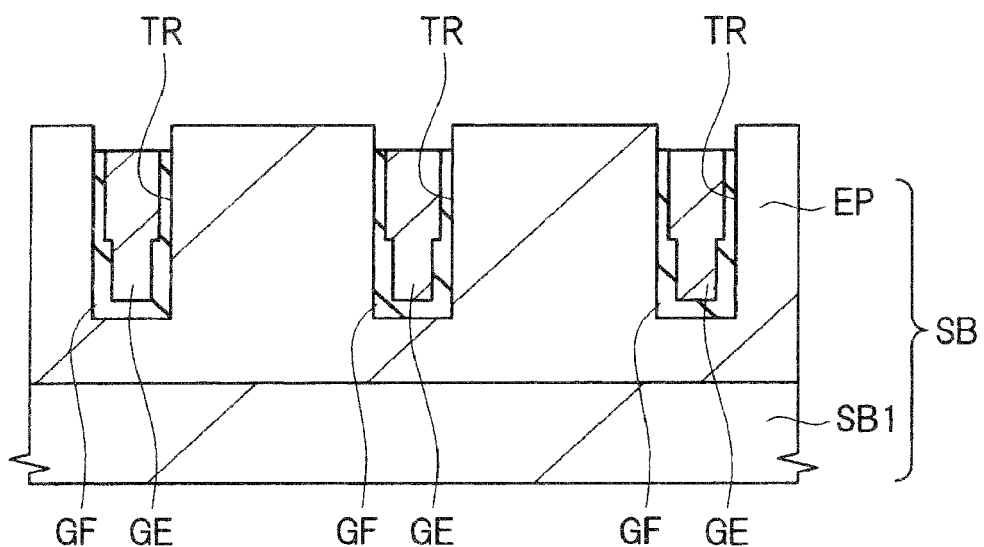
FIG. 49 is a sectional view of the essential part of the semiconductor device in a manufacturing step next to the step shown in FIG. 48.

Next, as shown in FIG. 49, gate electrodes GE are formed by etching back the conductive film CD as in the first embodiment. Each gate electrode GE is the conductive film CD buried in a trench TR through the insulating film GFb (gate insulating film GF). The insulating film GFb remaining in the trench TR is the gate insulating film GF.

The third embodiment is basically the same as the first embodiment except that, regarding the gate electrode GE and gate insulating film GF, the thickness (T3) of the gate insulating film GF in the upper portion of the trench TR is smaller than the thickness (T4) of the gate insulating film GF in the lower portion of the trench TR.

The subsequent steps are the same as in the first embodiment. Specifically the steps shown in FIGS. 12 to 21 should be carried out.

Fourth Embodiment

Figure 50:
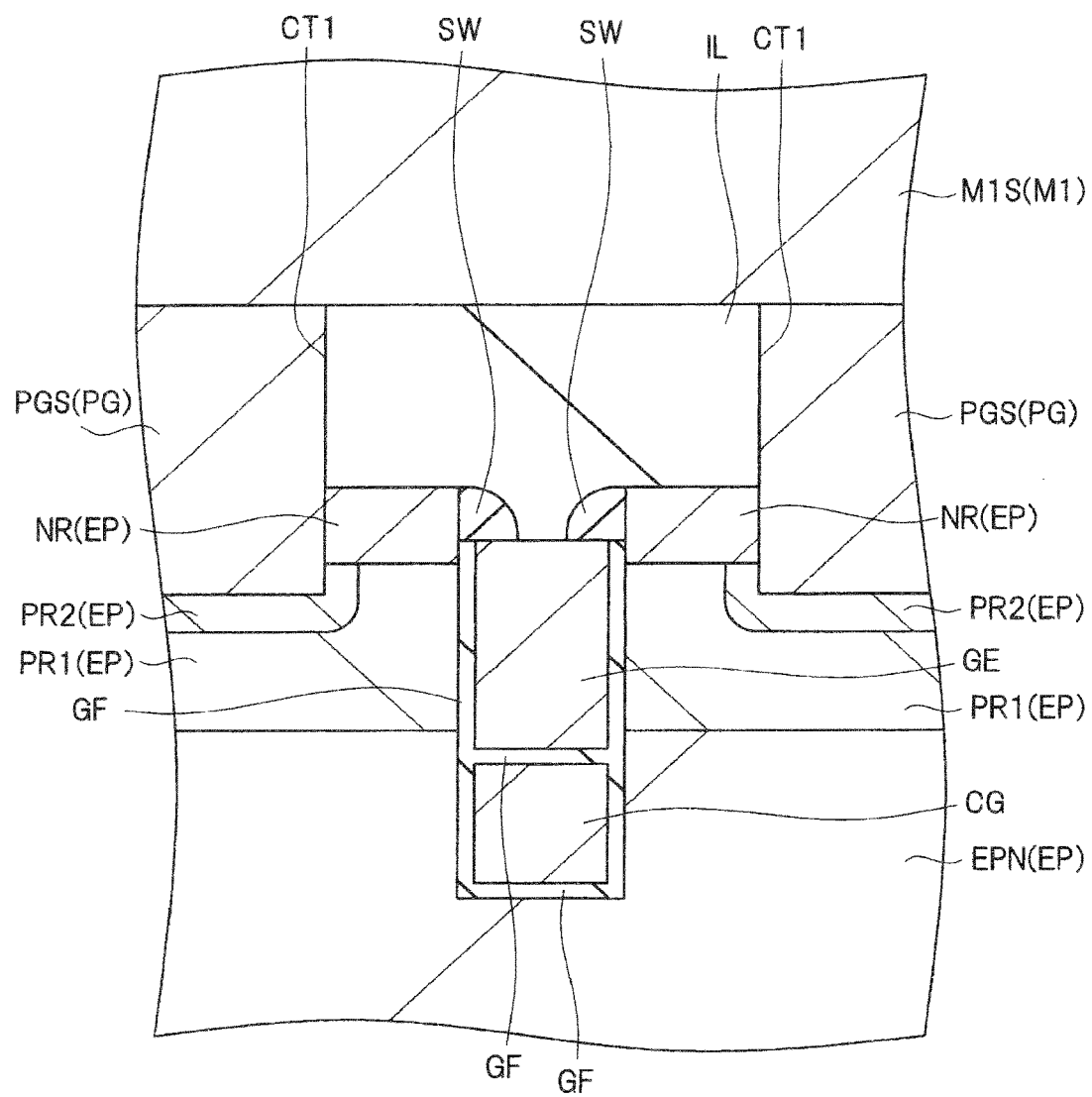
FIG. 50 is a sectional view of an essential part of a semiconductor device according to a fourth embodiment of the invention.
Figure 51:
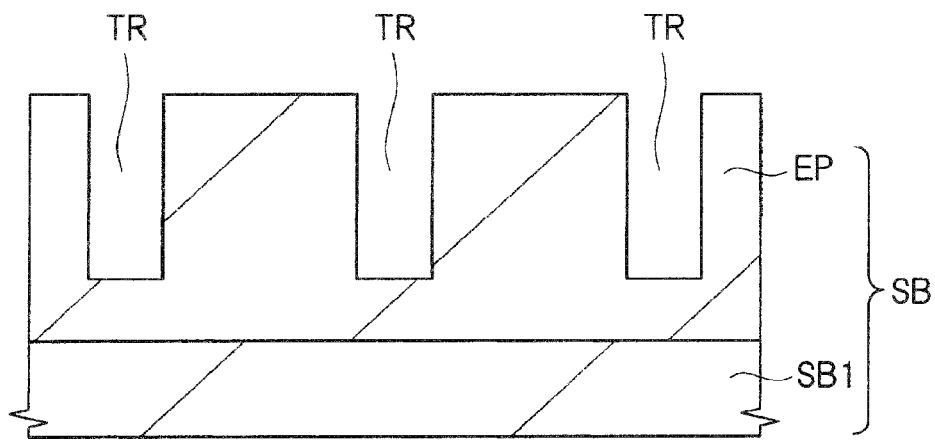
FIG. 51 is a sectional view of an essential part of the semiconductor device in a manufacturing step according to the fourth embodiment.

FIG. 50 is a sectional view of an essential part of a semiconductor device according to a fourth embodiment, which corresponds to FIG. 3 for the first embodiment.

The semiconductor device according to the fourth embodiment is different from the semiconductor device according to the first embodiment in that in the fourth embodiment, not only a gate electrode GE but also a control electrode (electrode, gate electrode) CG are formed (buried) in a trench TR. The gate electrode GE is formed in the upper portion of the trench TR and the control electrode CG is formed in the lower portion of the trench TR. The control electrode CG and gate electrode GE are both made of conductor, such as low-resistance polycrystalline silicon (doped polysilicon).

The gate electrode GE and control electrode CG are formed (buried) in the trench TR through a gate insulating film GF. In the trench TR, the gate electrode GE lies over the control electrode CG and the control electrode CG lies under the gate electrode GE, but they are not in contact with each other and the gate insulating film GF also lies between the control electrode CG and gate electrode GE. Therefore, the gate insulating film GF lies between the sidewall (side face) and bottom of the trench TR and the control electrode CG, between the sidewall (side face) of the trench TR and the gate electrode GE, and between the control electrode CG and the gate electrode GE. The gate insulating film GF's portion between the sidewall (side face) and bottom of the trench TR and the control electrode CG, its portion between the sidewall (side face) of the trench TR and the gate electrode GE, and its portion between the control electrode CG and the gate electrode GE may be separate films or configure a single film.

As mentioned above, the semiconductor device according to the fourth embodiment has a gate electrode GE in the upper portion of a trench TR and a control electrode CG in the lower portion of the trench TR. A gate insulating film GF is formed between the sidewall (side face) and bottom of the trench TR and the control electrode CG, between the sidewall (side face) of the trench TR and the gate electrode GE, and between the control electrode CG and the gate electrode GE.

Due to the presence of the gate insulating film GF between the control electrode CG and the gate electrode GE, the control electrode CG and the gate electrode GE are not short-circuited and are isolated from each other. Therefore, the control electrode CG and the gate electrode GE can be controlled independently of each other and it is possible to apply the same voltage or different voltages to the control electrode CG and the gate electrode GE.

In the fourth embodiment, the height position of the upper surface of the gate electrode GE formed in the trench TR is the same as in the first embodiment. Furthermore, in the fourth embodiment, the sidewall insulating film SW is formed as in the first embodiment and description thereof is omitted here.

The position of the bottom (lower surface) of the gate electrode GE formed in the trench TR is the same as, or lower than, the bottom of the p-type semiconductor region PR1. The fourth embodiment is the same as the first embodiment in this respect as well.

Therefore, the side face of the gate electrode GE in the trench TR faces the n$^+$-type semiconductor region NR and the p-type semiconductor region PR1 through the gate insulating film GF. Concretely, the upper portion of the side face of the gate electrode GE in the trench TR faces the n$^+$-type semiconductor region NR through the gate insulating film GF, the middle portion of the side face of the gate electrode GE faces the p-type semiconductor region PR1 through the gate insulating film GF, and the lower portion of the side face of the gate electrode GE faces the drain semiconductor region (n-type semiconductor region EPN) through the gate insulating film GF. The fourth embodiment is the same as the first embodiment in this respect as well.

On the other hand, the upper surface and bottom of the control electrode CG formed in the trench TR are both in a lower position than the bottom of the p-type semiconductor region PR1 and are located midway in the thickness of the drain semiconductor region (n-type semiconductor region EPN). Therefore, when seen in the thickness direction of the semiconductor substrate SB, the control electrode CG in the trench TR overlaps the drain semiconductor region (n-type semiconductor region EPN) but it does not overlap the n$^+$-type semiconductor region NR (p-type semiconductor region PR1) for the source and the p-type semiconductor region PR1 for a channel. Therefore, the side face and bottom of the control electrode CG in the trench TR do not face the n$^+$-type semiconductor region NR and the p-type semiconductor region PR1 but they face the drain semiconductor region (n-type semiconductor region EPN) through the gate insulating film GF.

The gate electrode GE buried in the trench TR functions as the gate electrode for a trench-gate MISFET and the control electrode CG buried in the trench TR functions as the control electrode for the trench-gate MISFET. The gate electrode GE buried in the trench TR controls the formation of a channel region in the p-type semiconductor region PR1 and controls turning ON/OFF the trench-gate MISFET. The control electrode CG buried in the trench TR controls the drain semiconductor region (n-type semiconductor region EPN) and controls the conduction resistance of the drain semiconductor region (n-type semiconductor region EPN) and the parasitic capacitance of the trench-gate MISFET. Although the control electrode CG may be considered a gate electrode, it is the gate electrode GE that controls turning ON/OFF the channel (turning ON/OFF the trench-gate MISFET).

The wirings M1 may include not only a source wiring M1S and a gate wiring M1G but also a wiring electrically coupled to the control electrode CG (control electrode wiring). For example, like the gate electrode GE, the control electrode CG may have an extension leading to the semiconductor substrate SB so that it is electrically coupled to the control electrode wiring through a plug (equivalent to a plug PG) buried in a contact hole made in the insulating film IL.

The other elements of the semiconductor device according to the fourth embodiment are basically the same as those of the semiconductor device according to the first embodiment and descriptions thereof are omitted here.

Due to the presence of the sidewall insulating film SW, the fourth embodiment also brings about almost the same advantageous effects as the first embodiment.

FIGS. 51 to 56 are sectional views of an essential part of the semiconductor device under manufacture according to the fourth embodiment. FIGS. 51 to 56 show cross sections of the transistor cell formation region which corresponds to the left half of FIG. 1.

In the fourth embodiment as well, the structure shown in FIG. 8 is created in the same way as in the first embodiment. However, in the fourth embodiment, since not only a gate electrode GE but also a control gate CG are formed in a trench TR, the depth of a trench TR may be larger than in the first embodiment.

Figure 52:
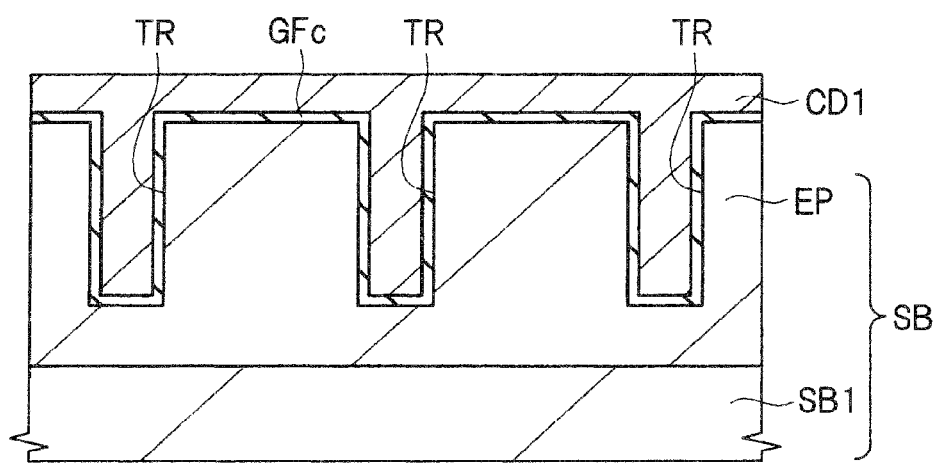
FIG. 52 is a sectional view of the essential part of the semiconductor device in a manufacturing step next to the step shown in FIG. 51.

Next, as shown in FIG. 52, an insulating film GFc, for example, a silicon oxide film, is formed over the main surface (upper surface) of the semiconductor substrate SB including the inner faces (sidewalls and bottoms) of trenches TR, for example, by thermal oxidation.

Next, a conductive film CD1 is formed over the main surface (upper surface) of the semiconductor substrate SB, specifically over the insulating film GFc, so as to fill the trenches TR. The conductive film CD1 is a conductive film for forming a control electrode CG1 and it is, for example, a polycrystalline silicon film doped with impurities (for example, n-type impurities) (doped polysilicon film) which may be formed by the CVD method or the like.

Figure 53:
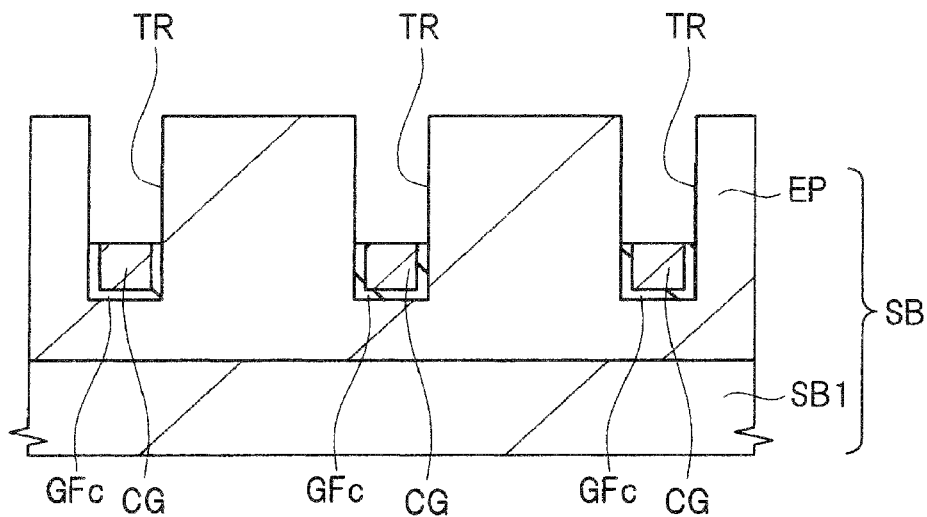
FIG. 53 is a sectional view of the essential part of the semiconductor device in a manufacturing step next to the step shown in FIG. 52.

Next, by etching back the conductive film CD1, the conductive film CD1 outside each trench TR is removed and the conductive film CD1 inside the trench TR is made to remain intact as shown in FIG. 53 so that the control electrode CG is formed. The upper surface of the control electrode CG is in a lower position than the upper surface of the semiconductor layer EP and is located midway in the depth of the trench TR. Then, the exposed insulating film GFc not covered by the control gate CG is removed by etching. In this process, the insulating film GFc interposed between the control electrode CG and the inner faces (sidewall and bottom) of the trench TR remains unremoved in the trench TR. The control electrode CG buried in the trench TR through the insulating film GFc is thus obtained.

Figure 54:
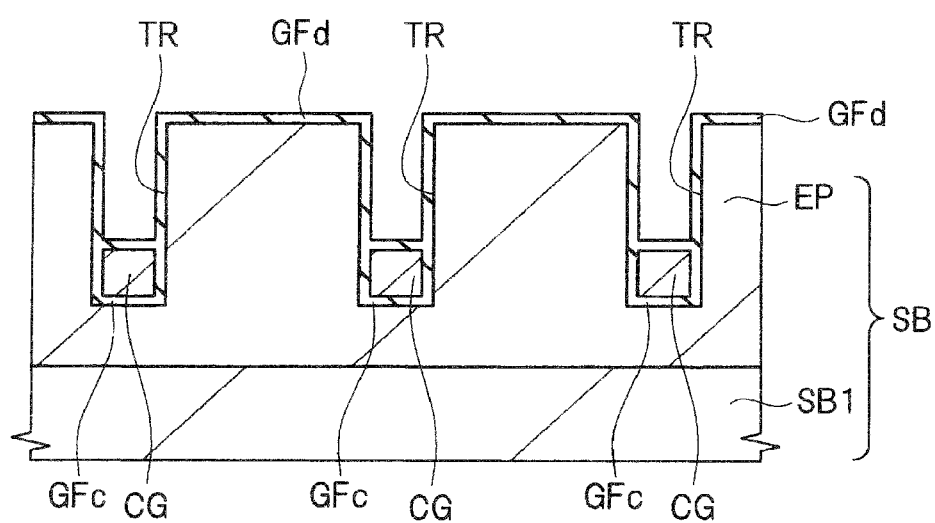
FIG. 54 is a sectional view of the essential part of the semiconductor device in a manufacturing step next to the step shown in FIG. 53.

Next, as shown in FIG. 54, an insulating film GFd, for example, a silicon oxide film, is formed over the main surface of the semiconductor substrate SB including the sidewalls of the trenches TR and the surfaces (exposed surfaces) of the control electrodes CG, for example, by thermal oxidation.

Figure 55:
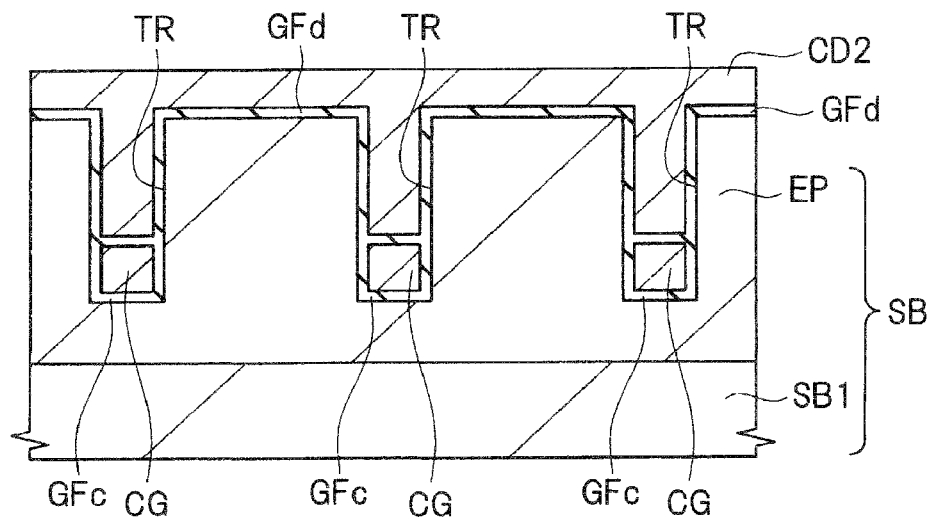
FIG. 55 is a sectional view of the essential part of the semiconductor device in a manufacturing step next to the step shown in FIG. 54.

Next, as shown in FIG. 55, a conductive film CD2 is formed over the main surface (upper surface) of the semiconductor substrate SB, specifically over the insulating film GFd, so as to fill the trenches TR. The conductive film CD2 is a conductive film for forming a gate electrode GE and it is, for example, a polycrystalline silicon film doped with impurities (for example, n-type impurities) (doped polysilicon film) which may be formed by the CVD method or the like.

Figure 56:
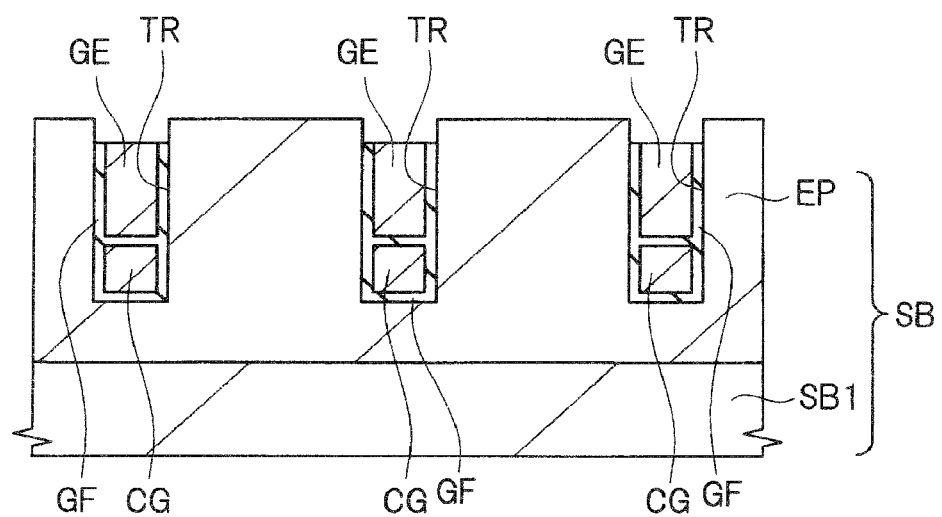
FIG. 56 is a sectional view of the essential part of the semiconductor device in a manufacturing step next to the step shown in FIG. 55.

Next, by etching back the conductive film CD2, the conductive film CD2 outside each trench TR is removed and the conductive film CD2 inside the trench TR is made to remain intact as shown in FIG. 56 so that the gate electrode GE is formed. In the trench TR, the insulating film GFd between the gate electrode GE and the control electrode CG and between the gate electrode GE and the sidewall of the trench TR, and the insulating film GFc between the control electrode CG and the sidewall and bottom of the trench TR make up the gate insulating film GF. The upper surface of the gate electrode GE is in a lower position than the upper surface of the semiconductor layer EP.

The subsequent steps are the same as in the first embodiment. Specifically the steps shown in FIGS. 12 to 21 should be carried out.

The invention made by the present inventors has been so far explained concretely in reference to the preferred embodiments thereof. However, the invention is not limited thereto and it is obvious that these details may be modified in various ways without departing from the gist thereof.

What is claimed is:

1. A semiconductor device having a trench-gate field effect transistor formed in a semiconductor substrate, comprising:
   a trench made in the semiconductor substrate; a gate electrode for the trench-gate field effect transistor, formed in the trench through a gate insulating film;
   an interlayer insulating film formed over a main surface of the semiconductor substrate;
   a semiconductor region for a source formed in an area adjacent to the trench;
   a semiconductor region for channel formation located under the semiconductor region for the source; and
   a semiconductor region for a drain located under the semiconductor region for the channel formation,
   wherein a sidewall insulating film is formed over an upper surface of the gate electrode and over a sidewall of the trench, the sidewall insulating film exposing a portion of the upper surface of the gate electrode and directly contacting the source,
   wherein the gate electrode and the sidewall insulating film are covered by the interlayer insulating film, the interlayer insulating film, contacting the exposed portion of the upper surface of the gate electrode, and
   wherein the upper surface of the gate electrode is in a lower position than an upper surface of the semiconductor region for the source and in a higher position than a boundary between the semiconductor region for the source and the semiconductor region for channel formation.

2. The semiconductor device according to claim 1, wherein:
   the semiconductor region for the source is of a first conductivity type,
   the semiconductor region for the channel formation is of a second conductivity type opposite to the first conductivity type, and
   the semiconductor region for the drain is of the first conductivity type.

3. The semiconductor device according to claim 2, wherein the sidewall insulating film has a shape of sidewall spacer.

4. The semiconductor device according to claim 1, further comprising a diode device formed through a first insulating film over the semiconductor substrate,
   wherein the sidewall insulating film is formed from an insulating film in the same layer as the first insulating film.

5. The semiconductor device according to claim 4, wherein the diode device is formed from a silicon film formed over the first insulating film.

6. The semiconductor device according to claim 1, wherein thickness of the gate insulating film in an upper portion of the trench is smaller than thickness of the gate insulating film in a lower portion of the trench.

7. The semiconductor device according to claim 1, further comprising a first electrode formed in a lower portion of the trench,
   wherein the gate electrode is formed in an upper portion of the trench, and
   wherein the gate insulating film is formed between the sidewall and a bottom of the trench and the first electrode, between the sidewall of the trench and the gate electrode, and between the first electrode and the gate electrode.

8. The semiconductor device according to claim 2, further comprising:
   a contact hole penetrating the interlayer insulating film;
   a conductor filling the contact hole; and
   a wiring formed over the interlayer insulating film,
   wherein the wiring includes a source wiring, and
   wherein the source wiring is electrically coupled to the semiconductor region for the source and the semiconductor region for channel formation through the conductor.

* * * * *